US012009306B2

United States Patent
Otsu

(10) Patent No.: US 12,009,306 B2
(45) Date of Patent: Jun. 11, 2024

(54) THREE-DIMENSIONAL MEMORY DEVICE CONTAINING A CAPPED ISOLATION TRENCH FILL STRUCTURE AND METHODS OF MAKING THE SAME

(71) Applicant: SANDISK TECHNOLOGIES LLC, Addison, TX (US)

(72) Inventor: Yoshitaka Otsu, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 347 days.

(21) Appl. No.: 17/376,490

(22) Filed: Jul. 15, 2021

(65) Prior Publication Data
US 2023/0013984 A1    Jan. 19, 2023

(51) Int. Cl.
| | |
|---|---|
| H01L 23/535 | (2006.01) |
| H01L 21/768 | (2006.01) |
| H10B 41/27 | (2023.01) |
| H10B 43/27 | (2023.01) |

(52) U.S. Cl.
CPC ...... *H01L 23/535* (2013.01); *H01L 21/76805* (2013.01); *H01L 21/76895* (2013.01); *H10B 41/27* (2023.02); *H10B 43/27* (2023.02)

(58) Field of Classification Search
CPC ............. H01L 23/535; H01L 21/76805; H01L 21/76895; H10B 41/27; H10B 43/27; H10B 43/10; H10B 43/40; H10B 43/50
See application file for complete search history.

(56) References Cited

U.S. PATENT DOCUMENTS

| | | |
|---|---|---|
| 9,679,906 B2 | 6/2017 | Lu et al. |
| 9,806,093 B2 | 10/2017 | Toyama et al. |
| 9,818,693 B2 | 11/2017 | Toyama et al. |
| | (Continued) | |

OTHER PUBLICATIONS

International Search Report and Written Opinion of the International Searching Authority for International Patent Application No. PCT/US2022/027244, mailed Aug. 17, 2022, 8 pages.
(Continued)

*Primary Examiner* — Shahed Ahmed
*Assistant Examiner* — Vicki B. Booker
(74) *Attorney, Agent, or Firm* — THE MARBURY LAW GROUP PLLC

(57) ABSTRACT

A semiconductor structure includes semiconductor devices located on a top surface of a substrate semiconductor layer, lower-level metal interconnect structures embedded in lower-level dielectric material layers, source-level material layers, an alternating stack of insulating layers and electrically conductive layers overlying the source-level material layer, memory stack structures, a vertically alternating sequence of insulating plates and dielectric material plates laterally surrounded by the alternating stack, an isolation trench fill structure interposed between the alternating stack and the vertically alternating sequence and including a trench fill material portion and a capping dielectric structure overlying the trench fill material portion, and a first through-memory-level interconnection via structure vertically extending through each plate within the vertically alternating sequence and contacting a top surface of one of the lower-level metal interconnect structures.

12 Claims, 73 Drawing Sheets

(56) References Cited

U.S. PATENT DOCUMENTS

| | | | |
|---|---|---|---|
| 9,818,759 B2 | 11/2017 | Kai et al. | |
| 9,972,641 B1* | 5/2018 | Zhang | H01L 29/0847 |
| 10,038,006 B2 | 7/2018 | Furihata et al. | |
| 10,249,640 B2 | 4/2019 | Yu et al. | |
| 10,381,371 B2 | 8/2019 | Ogawa et al. | |
| 10,403,640 B2* | 9/2019 | Hwang | H10B 43/50 |
| 10,840,260 B2 | 11/2020 | Kai et al. | |
| 10,872,857 B1 | 12/2020 | Otsu et al. | |
| 10,879,624 B2 | 12/2020 | Otsu et al. | |
| 10,903,237 B1 | 1/2021 | Hosoda et al. | |
| 2015/0236038 A1* | 8/2015 | Pachamuthu | H01L 27/0688 257/326 |
| 2017/0047334 A1 | 2/2017 | Lu et al. | |
| 2017/0178153 A1 | 6/2017 | Ogawa et al. | |
| 2017/0179026 A1 | 6/2017 | Toyama et al. | |
| 2017/0179151 A1 | 6/2017 | Kai et al. | |
| 2017/0179152 A1 | 6/2017 | Toyama et al. | |
| 2017/0179154 A1 | 6/2017 | Furihata et al. | |
| 2017/0358593 A1 | 12/2017 | Yu et al. | |
| 2020/0006358 A1* | 1/2020 | Nishikawa | H01L 29/0649 |
| 2020/0235050 A1 | 7/2020 | Lee et al. | |
| 2020/0235120 A1 | 7/2020 | Kai et al. | |
| 2021/0210428 A1 | 7/2021 | Oshawa et al. | |
| 2021/0210503 A1 | 7/2021 | Matsuno et al. | |
| 2021/0210504 A1 | 7/2021 | Otsu et al. | |
| 2021/0265389 A1 | 8/2021 | Kim et al. | |
| 2021/0391345 A1 | 12/2021 | Otsu et al. | |

OTHER PUBLICATIONS

U.S. Appl. No. 16/881,346, filed May 22, 2020, SanDisk Technologies LLC.
U.S. Appl. No. 16/881,401, filed May 22, 2020, SanDisk Technologies LLC.
U.S. Appl. No. 16/893,933, filed Jun. 5, 2020, SanDisk Technologies LLC.
U.S. Appl. No. 16/893,995, filed Jun. 5, 2020, SanDisk Technologies LLC.
U.S. Appl. No. 16/900,060, filed Jun. 12, 2020, SanDisk Technologies LLC.
U.S. Appl. No. 16/952,526, filed Nov. 19, 2020, SanDisk Technologies LLC.
U.S. Appl. No. 17/039,160, filed Sep. 30, 2020, SanDisk Technologies LLC.
U.S. Appl. No. 17/116,093, filed Dec. 9, 2020, SanDisk Technologies LLC.
U.S. Appl. No. 17/146,866, filed Jan. 12, 2021, SanDisk Technologies LLC.
U.S. Appl. No. 17/174,064, filed Jan. 12, 2021, SanDisk Technologies LLC.
U.S. Appl. No. 17/174,094, filed Feb. 11, 2021, SanDisk Technologies LLC.

\* cited by examiner

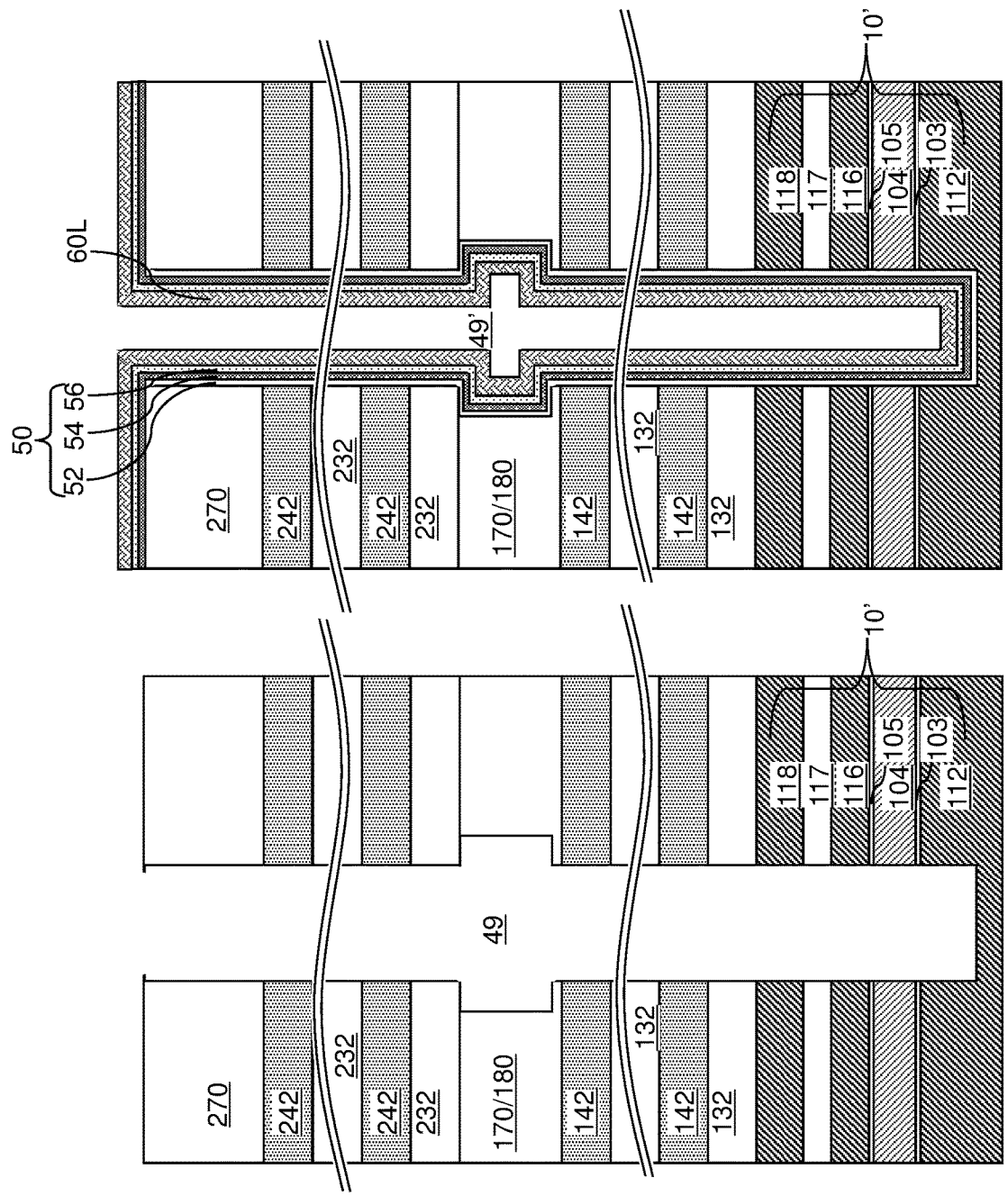

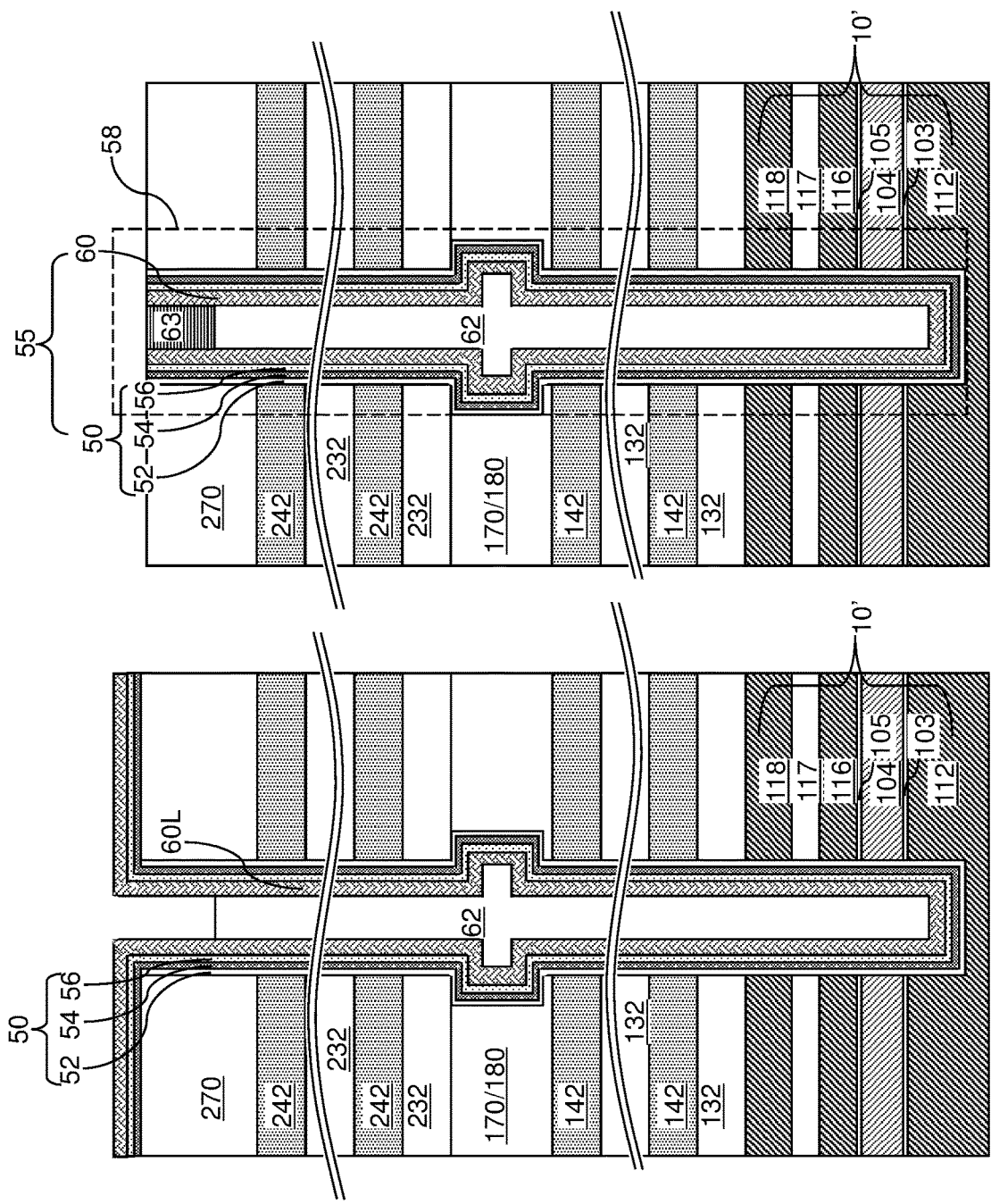

THREE-DIMENSIONAL MEMORY DEVICE CONTAINING A CAPPED ISOLATION TRENCH FILL STRUCTURE AND METHODS OF MAKING THE SAME

FIELD

The present disclosure relates generally to the field of semiconductor devices and specifically to a three-dimensional memory device including a capped isolation trench fill structure and methods of making the same.

BACKGROUND

Three-dimensional memory devices may include memory stack structures. The memory stack structures overlie a substrate and extend through an alternating stack of insulating layers and electrically conductive layers. The memory stack structures include vertical stacks of memory elements provided at levels of the electrically conductive layers. Peripheral devices may be provided on the substrate underneath the alternating stack and the memory stack structures.

SUMMARY

According to an aspect of the present disclosure, a semiconductor structure is provided, which comprises: semiconductor devices located on a top surface of a substrate semiconductor layer; lower-level metal interconnect structures embedded in lower-level dielectric material layers and electrically connected to the semiconductor devices and overlying the substrate semiconductor layer; source-level material layers overlying the lower-level dielectric material layers and comprising an opening therethrough; an alternating stack of insulating layers and electrically conductive layers overlying the source-level material layer; memory stack structures vertically extending through the alternating stack and comprising a respective vertical semiconductor channel and a respective memory film; a vertically alternating sequence of insulating plates and dielectric material plates laterally surrounded by the alternating stack; an isolation trench fill structure interposed between the alternating stack and the vertically alternating sequence and comprising a trench fill material portion and a capping dielectric structure overlying the trench fill material portion; and a first through-memory-level interconnection via structure vertically extending through each plate within the vertically alternating sequence and contacting a top surface of one of the lower-level metal interconnect structures.

According to another aspect of the present disclosure, a method of forming a semiconductor structure is provided, which comprises: forming semiconductor devices on a top surface of a substrate semiconductor layer; forming lower-level metal interconnect structures embedded in lower-level dielectric material layers and electrically connected to the semiconductor devices over the substrate semiconductor layer; forming an alternating stack of insulating layers and sacrificial material layers over the lower-level dielectric material layers; forming memory openings through the alternating stack; forming memory opening fill structures within the memory openings, wherein each of the memory opening fill structures comprises a respective vertical semiconductor channel and a respective vertical stack of memory elements; forming backside trenches, an isolation trench, and a first through-memory-level via cavity through the alternating stack; forming an isolation trench fill structure in the isolation trench, wherein the isolation trench fill structure comprises a trench fill material portion and a capping dielectric structure overlying the trench fill material portion; replacing portions of the sacrificial material layers with electrically conductive layers, wherein a region including the electrically conductive layers comprises an alternating stack of the insulating layers and the electrically conductive layers, and a region including remaining portions of the sacrificial material layers comprises a vertically alternating sequence of insulating plates and dielectric material plates; forming backside contact via structures in the backside trenches; and forming a first through-memory-level interconnection via structure in the first through-memory-level via cavity on a top surface of one of the lower-level metal interconnect structures.

BRIEF DESCRIPTION OF THE DRAWINGS

FIGS. 7A-7D illustrate sequential vertical cross-sectional views of a memory opening during formation of a memory opening fill structure according to an embodiment of the present disclosure.

DETAILED DESCRIPTION

Figure 1A:
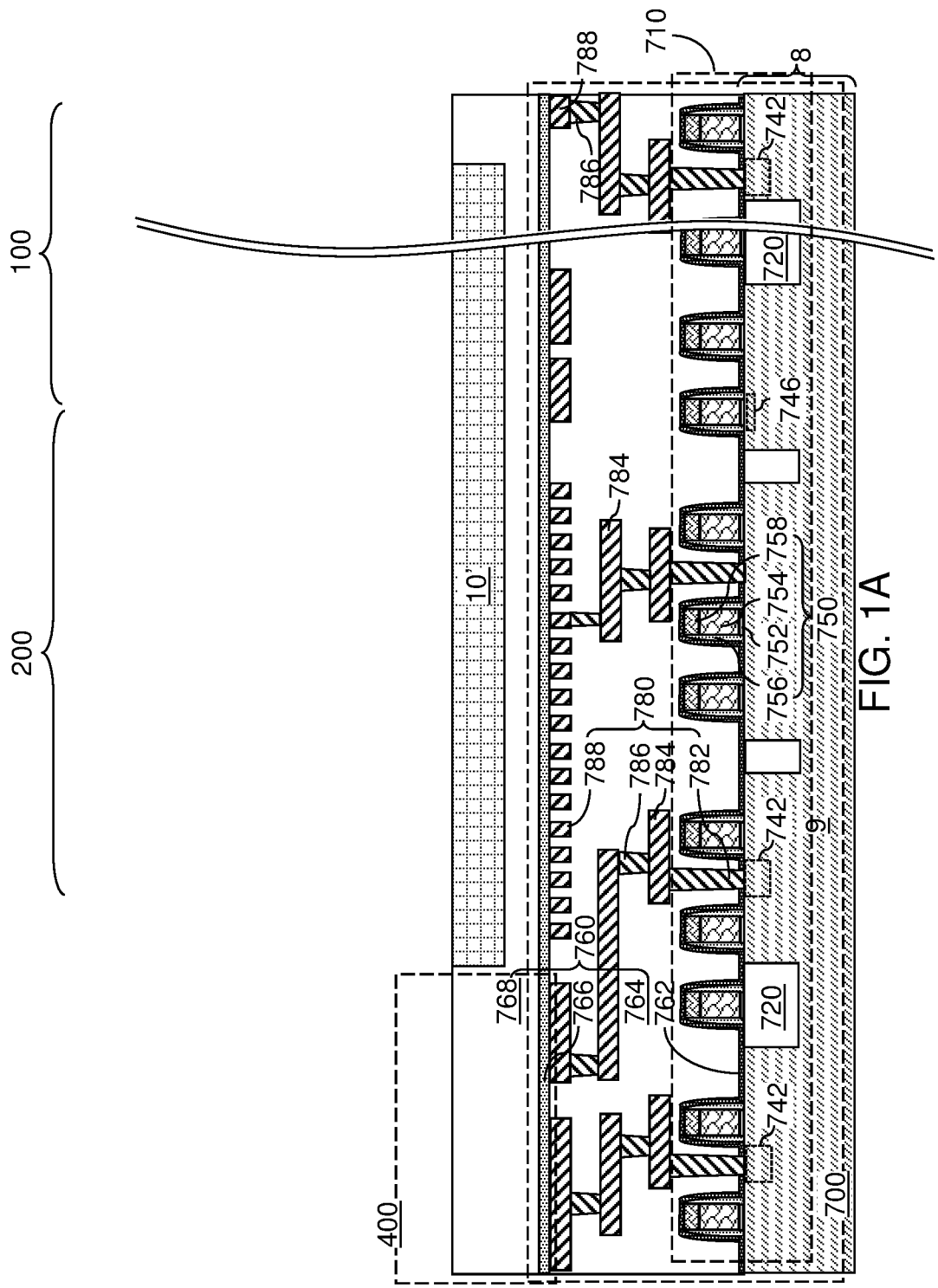
FIG. 1A is a vertical cross-sectional view of an exemplary structure after formation of semiconductor devices, lower level dielectric layers, lower metal interconnect structures, and in-process source-level material layers on a semiconductor substrate according to a first embodiment of the present disclosure.

The embodiments of the present disclosure provide a three-dimensional memory device including a capped isolation trench fill structure and methods of making the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
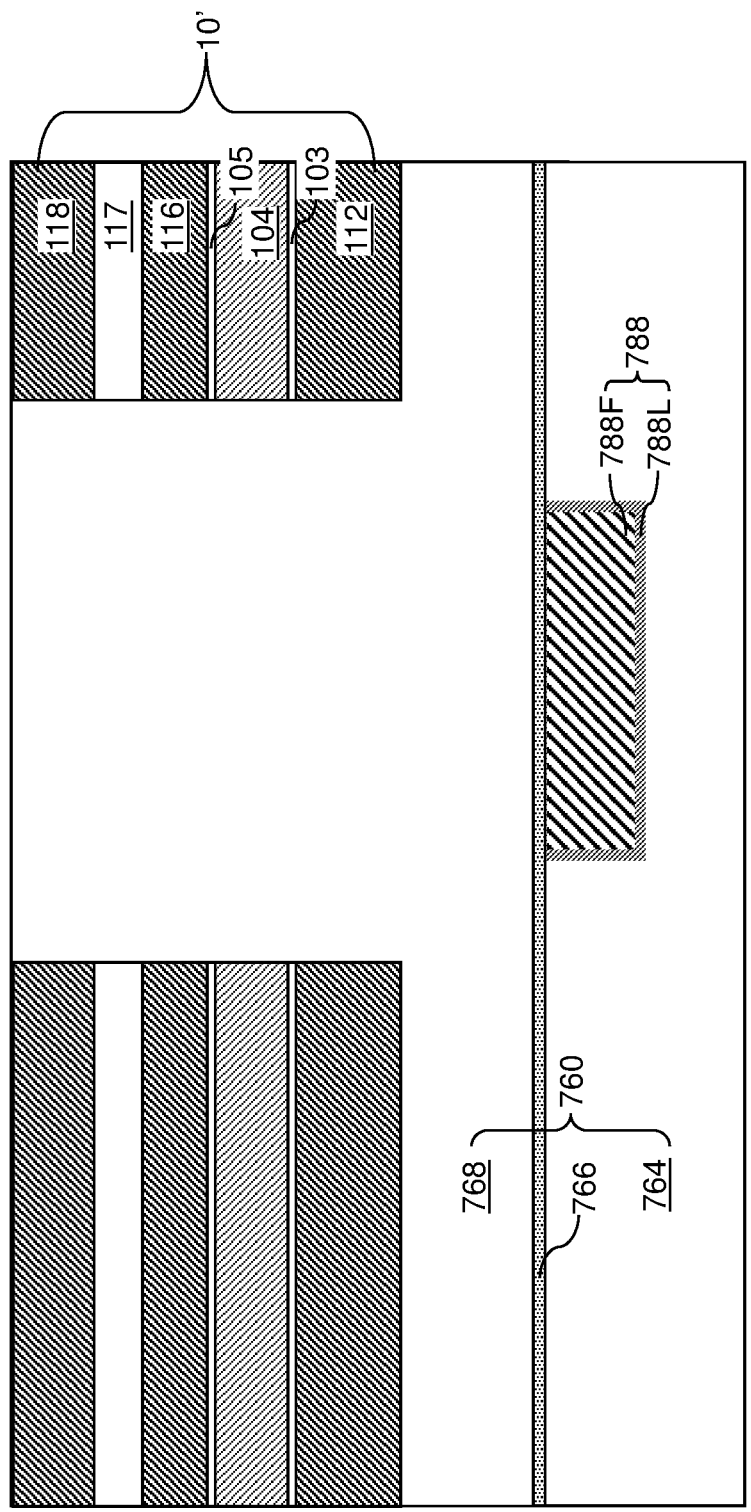
FIG. 1B is a magnified view of the in-process source-level material layers of FIG. 1A.

Referring to FIGS. 1A and 1B, an exemplary structure according to an embodiment of the present disclosure is illustrated. The exemplary structure includes a semiconductor substrate 8 and semiconductor devices 710 formed thereupon. The semiconductor substrate 8 may include a substrate semiconductor layer 9 at least at an upper portion thereof. Shallow trench isolation structures 720 may be formed in an upper portion of the substrate semiconductor layer 9 to provide electrical isolation between the semiconductor devices 710. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, an optional planar silicon nitride liner 766 that overlies the first dielectric material layers 764, and at least one second dielectric layer 768. The planar silicon nitride liner 766 preferably has a thickness greater than 2 nm, such as a thickness in a range from 4 nm to 40 nm, such as from 6 nm to 20 nm. The dielectric layer stack including the lower-level dielectric material layers 760 may function as a matrix for lower-level metal interconnect structures 780 that provide electrical wiring to and from the various nodes of the semiconductor devices and landing pads for through-memory-level interconnection via structures to be subsequently formed. The lower-level metal interconnect structures 780 may be formed within the dielectric layer stack of the lower-level dielectric material layers 760 and overlies the field effect transistors. The lower-level metal interconnect structures 780 may comprise a lower-level metal line structure located under and optionally contacting a bottom surface of the planar silicon nitride liner 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and metal pad structures 788 that are configured to function as landing pads for through-memory-level interconnection via structures to be subsequently formed.

The metal pad structures 788 may be formed within a topmost dielectric material layer of the first dielectric material layers 764 (which may be a plurality of dielectric material layers). Each of the lower-level metal interconnect structures 780 may include a metallic nitride liner 788L and a metal fill structure 788F. Top surfaces of the metal pad structures 788 and the topmost surface of the first dielectric material layers 764 may be planarized by a planarization process, such as chemical mechanical planarization. The planar silicon nitride liner 766 (if present) may be formed directly on the top surfaces of the metal pad structures 788 and the topmost surface of the first dielectric material layers 764.

The planar silicon nitride liner 766 can be a silicon nitride liner and can have a uniform thickness throughout between a planar bottom surface and a planar top surface. According to an aspect of the present disclosure, the thickness of the planar silicon nitride liner 766 can be selected such that the planar silicon nitride liner 766 effectively functions as a diffusion barrier layer during a subsequently oxidation process that is performed after formation of a three-dimensional array of memory elements and prior to formation of a through-memory-level contact via structure thereupon. In one embodiment, the planar silicon nitride liner 766 can have a thickness in a range from 4 nm to 100 nm, such as from 8 nm to 50 nm, although lesser and greater thicknesses may also be employed. The planar silicon nitride liner 766 may be deposited by a chemical vapor deposition process.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

Generally, semiconductor devices 710 can be formed on a top surface of the substrate semiconductor layer 9, and lower-level metal interconnect structures 780 embedded in lower-level dielectric material layers 760 and electrically connected to the semiconductor devices 710 can be formed over the substrate semiconductor layer 9. The planar silicon nitride liner 766 may be formed directly on top surfaces of a subset of the lower-level metal interconnect structures 780. An entire top surface of each lower-level metal interconnect structure 780 within the subset of the lower-level metal interconnect structures 780 may be contacted by the planar silicon nitride liner 766.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8. In one embodiment, the in-process source-level material layer 10' may have an opening in each area in which through-memory-level interconnection via structures are to be subsequently formed. For example, the in-process source-level material layer 10' may have openings in the memory array region 100.

The in-process source-level material layers 10' may be patterned to provide openings in areas in which through-memory-level interconnection via structures and through-dielectric contact via structures are to be subsequently formed. Patterned portions of the in-process source-level material layers 10' are present in each memory array region 100 in which three-dimensional memory stack structures are to be subsequently formed.

In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the in-process source-level material layers 10' may be formed within the area of a memory array region 100, in which a three-dimensional memory array including memory stack structures is to be subsequently formed. A peripheral device region 400 that may be subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 may be formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and may be located at the level of the lower-level dielectric material layers 760. Through-memory-level interconnection via structures may be subsequently formed directly on the lower-level metal interconnect structures 780 to provide electrical connection to memory devices that are also to be subsequently formed. In one embodiment, the pattern of the lower-level metal interconnect structures 780 may be selected such that the metal pad structures 788 (which are a subset of the lower-level metal interconnect structures 780 located at the topmost portion of the lower-level metal interconnect structures 780) may provide landing pad structures for the through-memory-level interconnection via structures to be subsequently formed.

Figure 2:
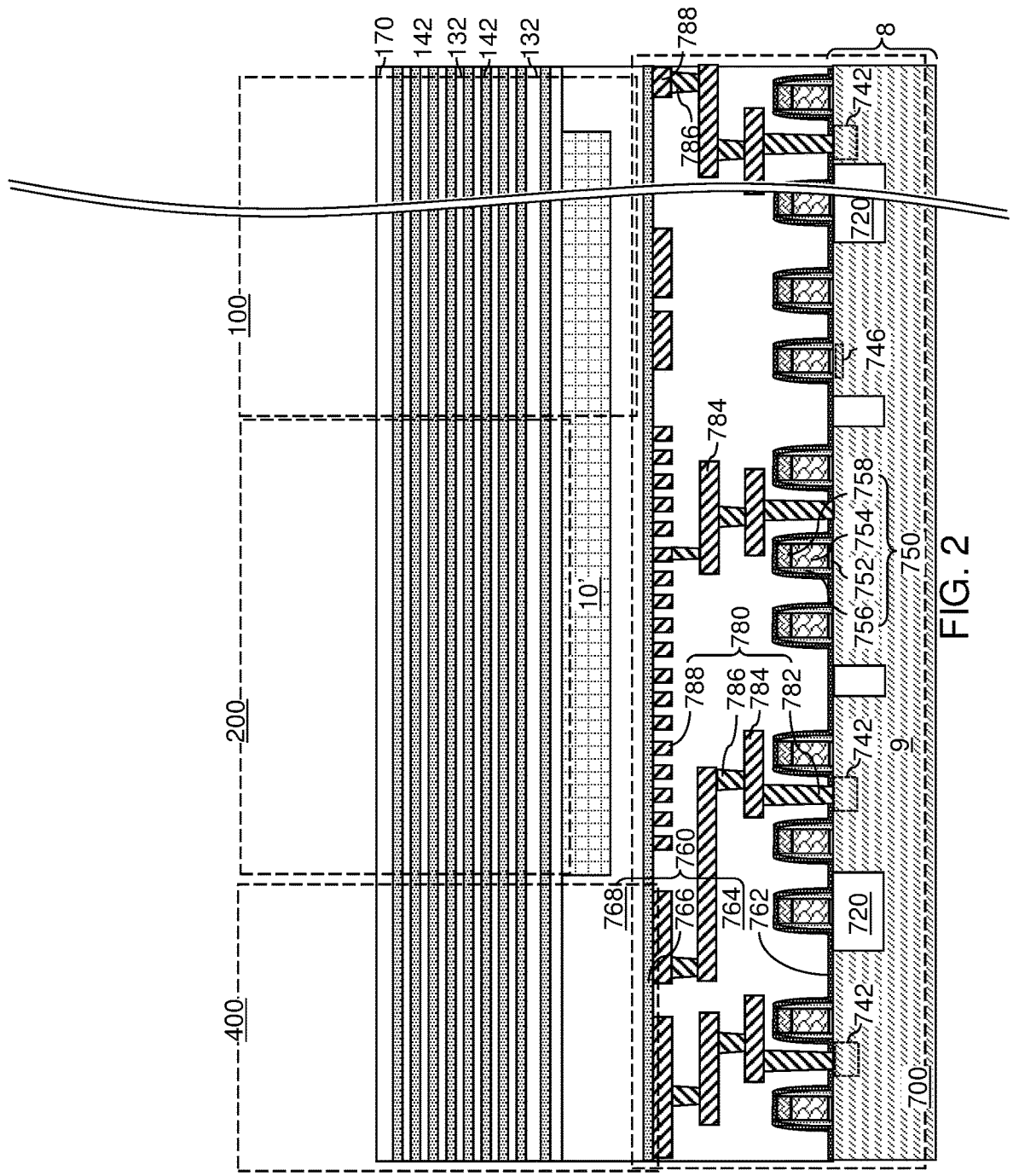
FIG. 2 is a vertical cross-sectional view of the exemplary structure after formation of a first-tier alternating stack of first insulating layers and first spacer material layers according to an embodiment of the present disclosure.

Referring to FIG. 2, an alternating stack of first material layers and second material layers may be formed. Each first material layer may include a first material, and each second material layer may include a second material that is different from the first material. In embodiments where at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses.

The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material.

Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first sacrificial material layers 142 may be subsequently replaced with electrically conductive electrodes which may function, for example, as control gate electrodes of a vertical NAND device. According to an aspect of the present disclosure, the first sacrificial material layers 142 include a dielectric material. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
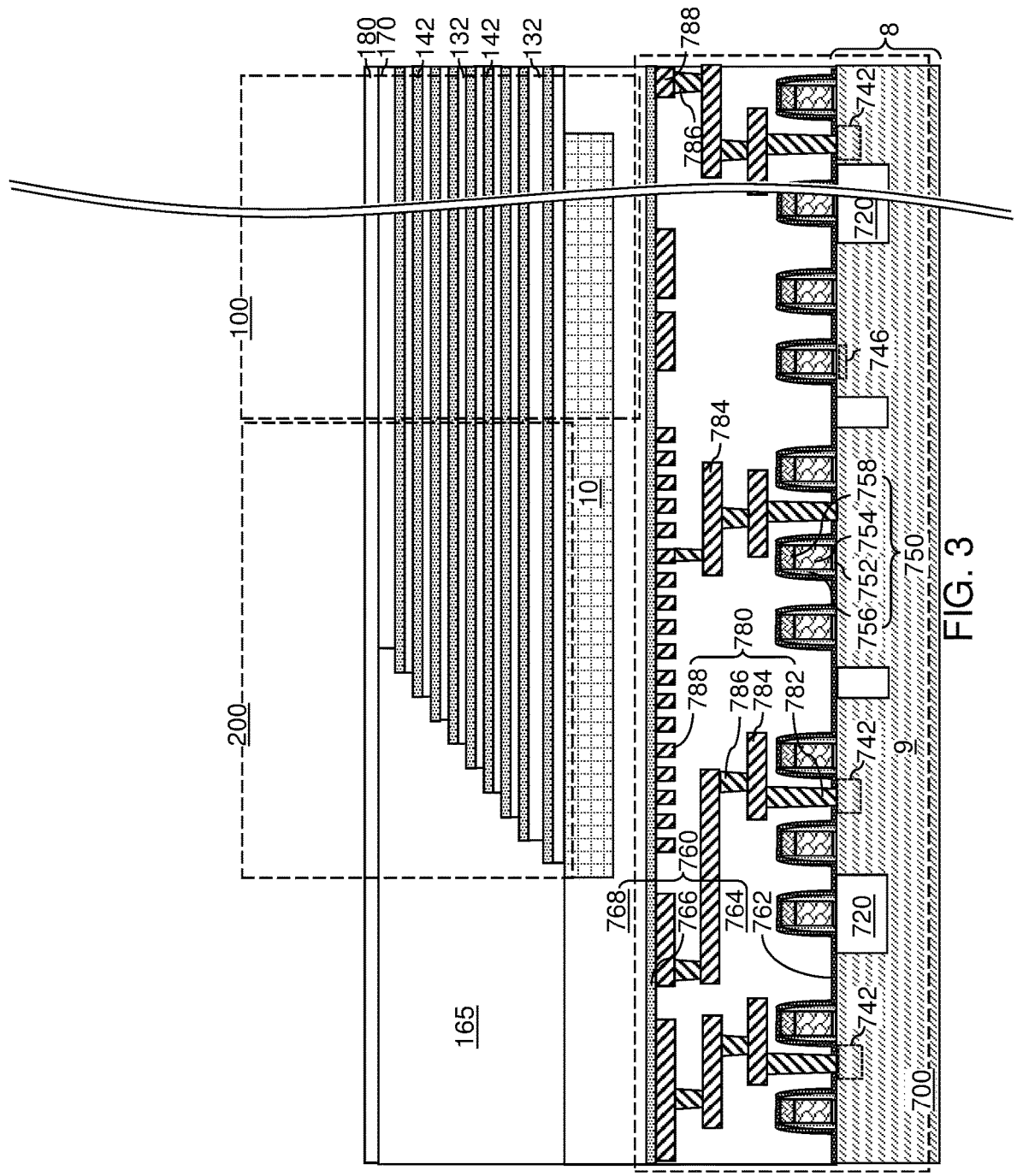
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures.

The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4:
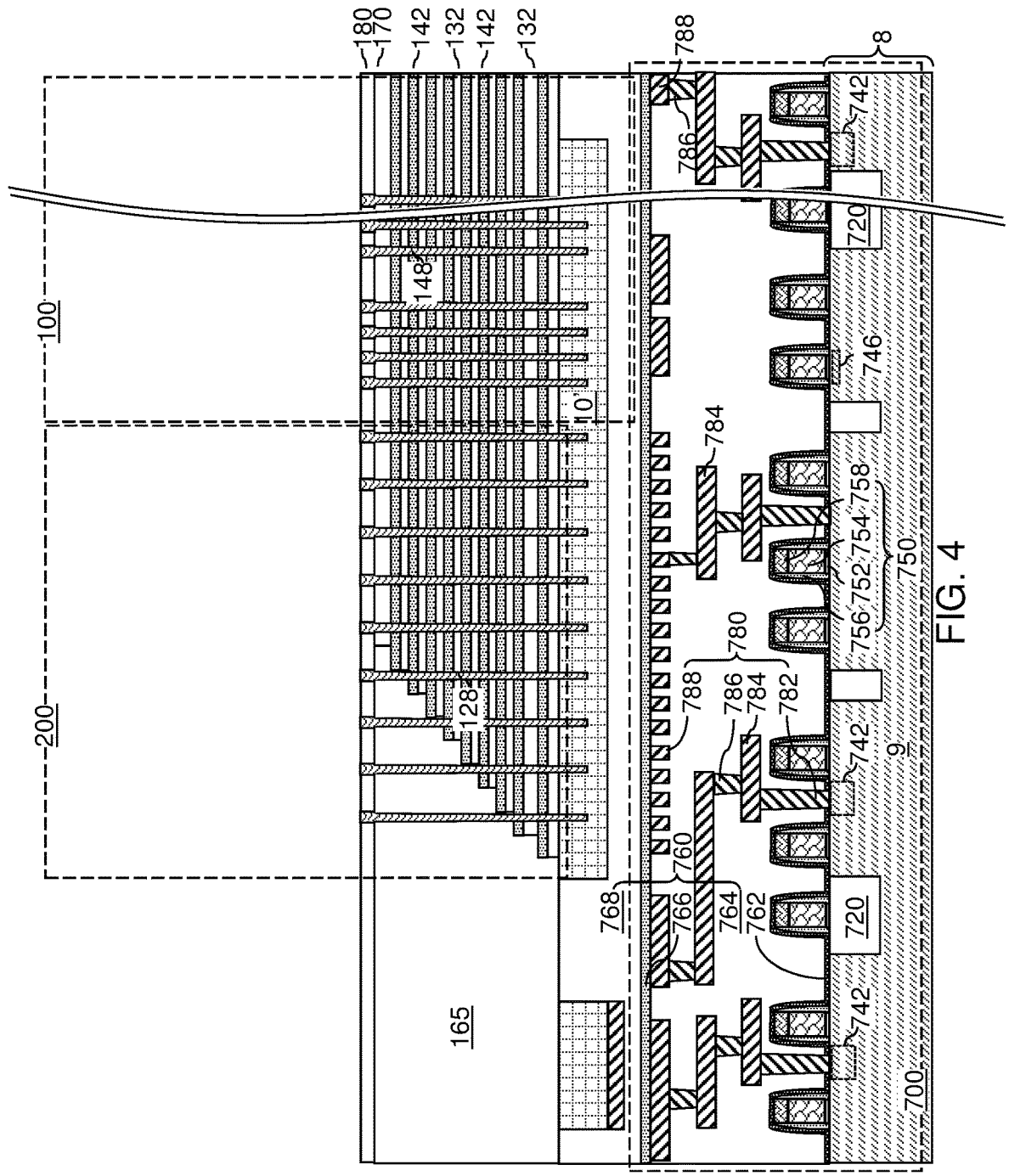
FIG. 4 is a vertical cross-sectional view of the exemplary structure after formation of first-tier memory openings, first-tier support openings, and various sacrificial fill structures according to an embodiment of the present disclosure.

Referring to FIG. 4, various first-tier openings may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings concurrently, i.e., during the first isotropic etch process. The various first-tier openings may include first-tier memory openings and first-tier support openings.

The first-tier memory openings are openings that are formed in the memory array region 100 through each layer within the first alternating stack (132, 142) and are subsequently used to form memory stack structures therein. The first-tier memory openings may be formed in clusters of first-tier memory openings. Each cluster of first-tier memory openings may be formed as a two-dimensional array of first-tier memory openings.

The first-tier support openings are openings that are formed in the staircase region 200, and are subsequently employed to form support pillar structures. A subset of the first-tier support openings that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings and the first-tier support openings at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings at the level of the inter-tier dielectric layer 180. The portions of the first-tier memory openings located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 5:
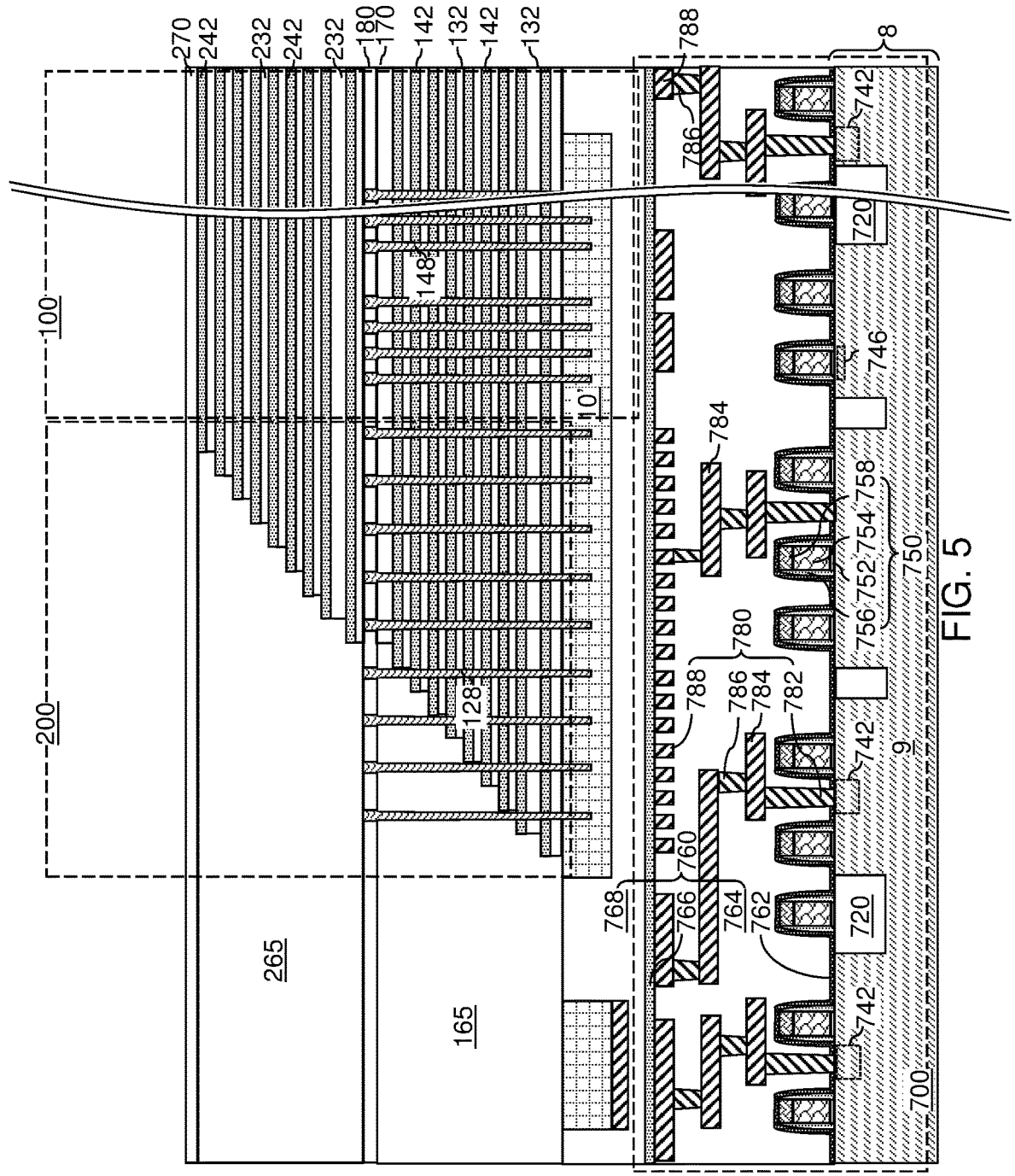
FIG. 5 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 5, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Figure 6:
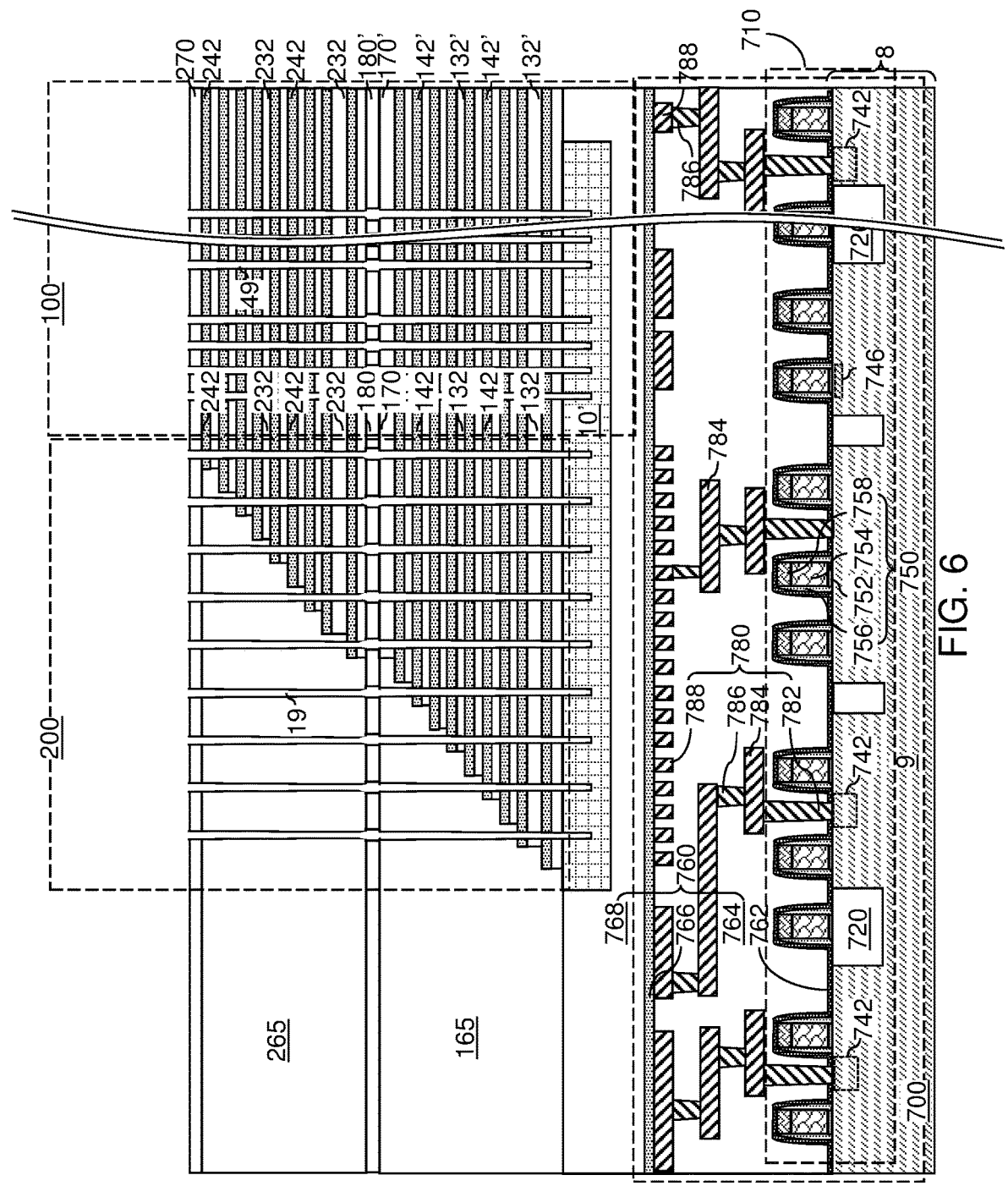
FIG. 6 is a vertical cross-sectional view of the exemplary structure after formation of inter-tier memory openings and inter-tier support openings according to an embodiment of the present disclosure.
Figure 8A:
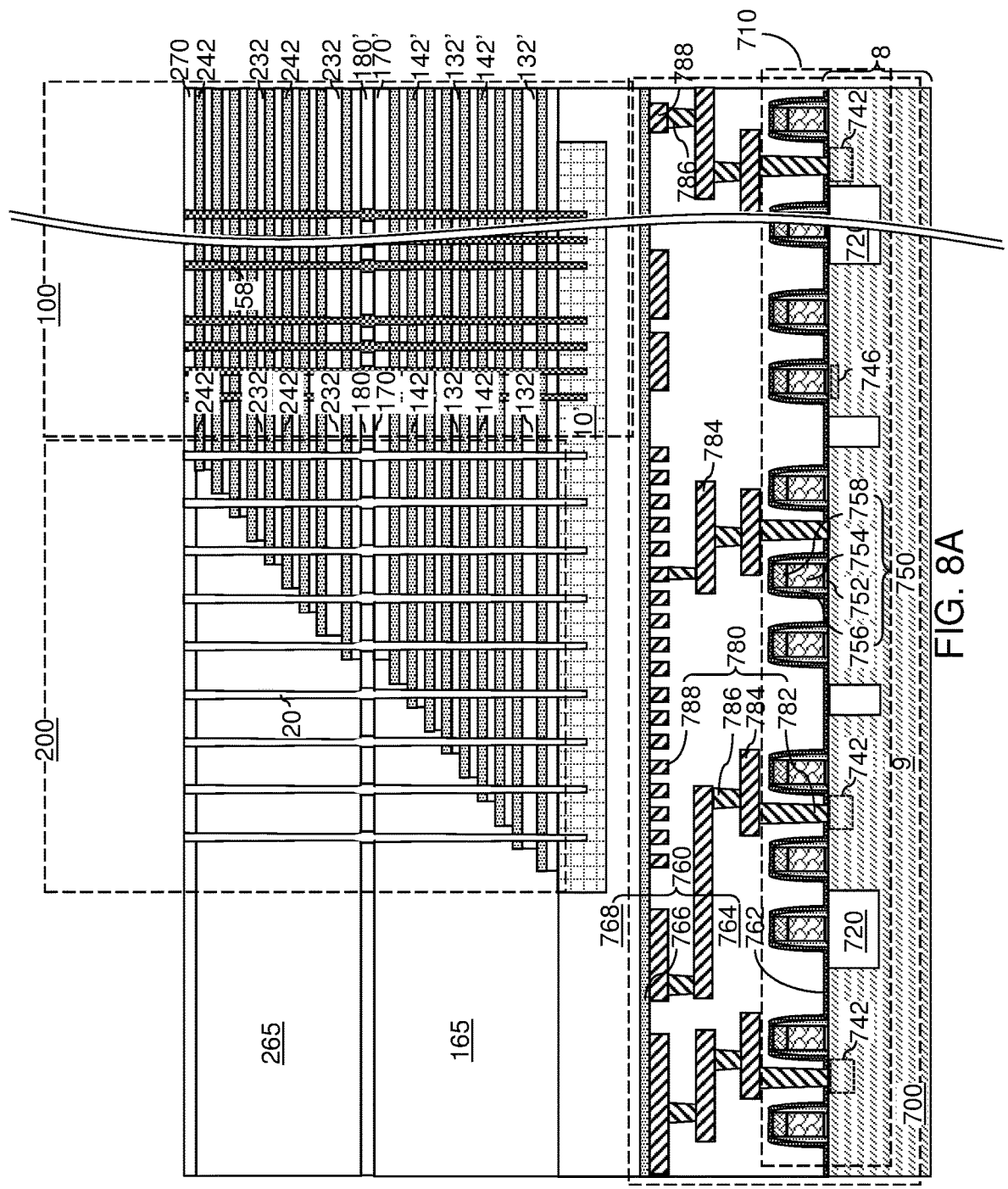
FIG. 8A is a vertical cross-sectional view of the exemplary structure after formation of memory opening fill structures and support pillar structures according to an embodiment of the present disclosure.
Figure 8B:
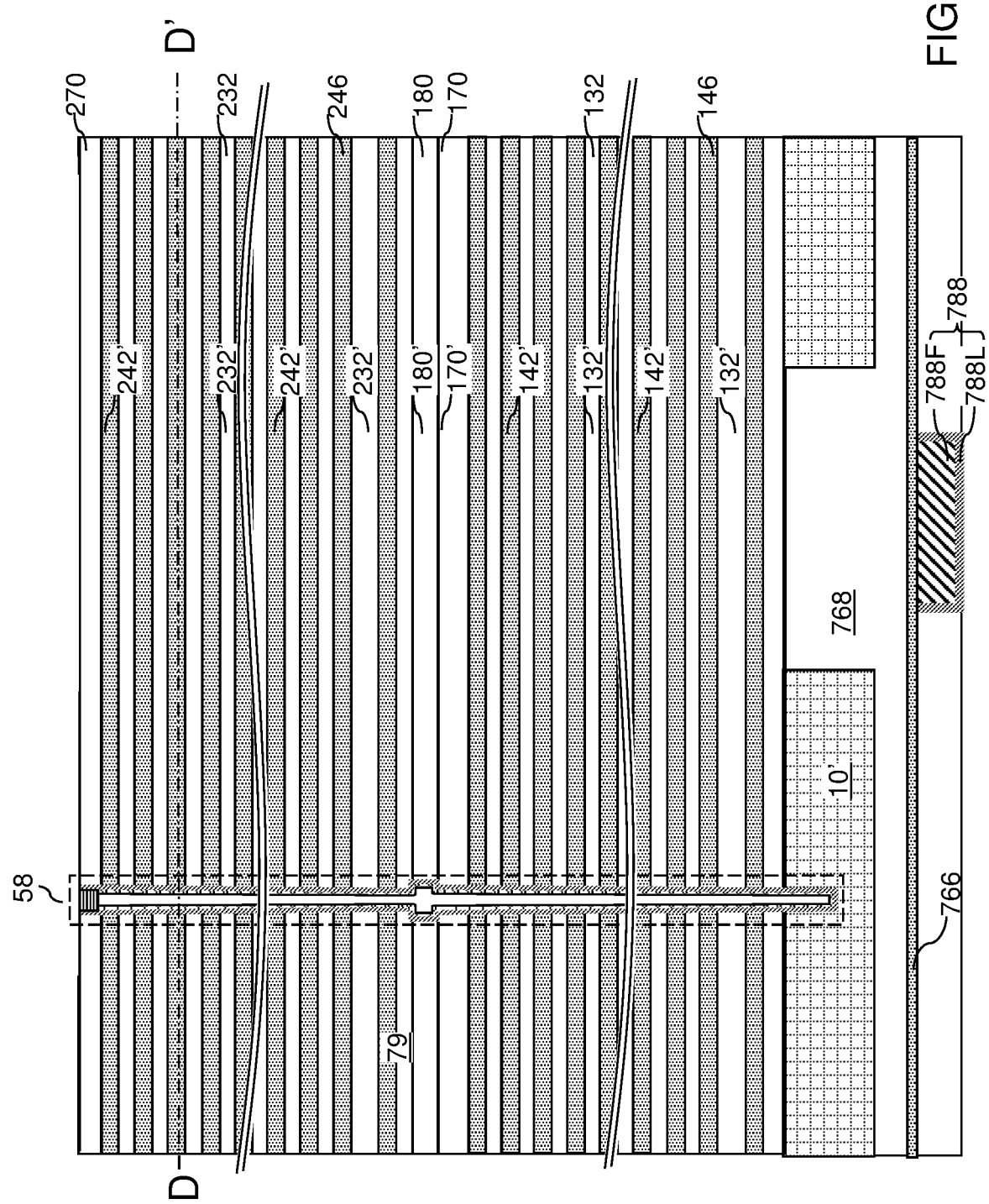
FIG. 8B is another vertical cross-sectional view of the exemplary structure of FIG. 8A.
Figure 8C:
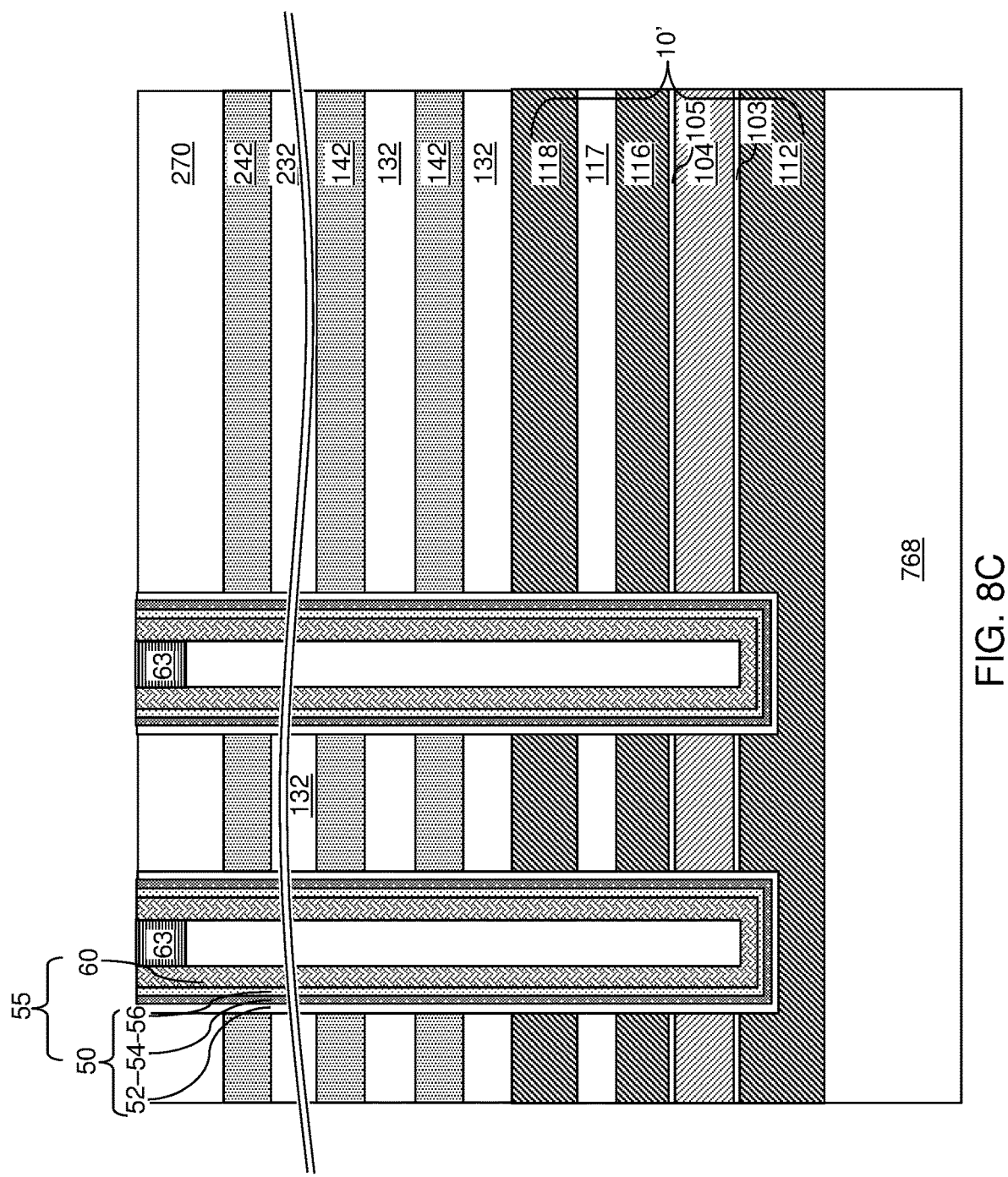
FIG. 8C is yet another vertical cross-sectional view of the exemplary structure of FIGS. 8A and 8B.
Figure 8D:
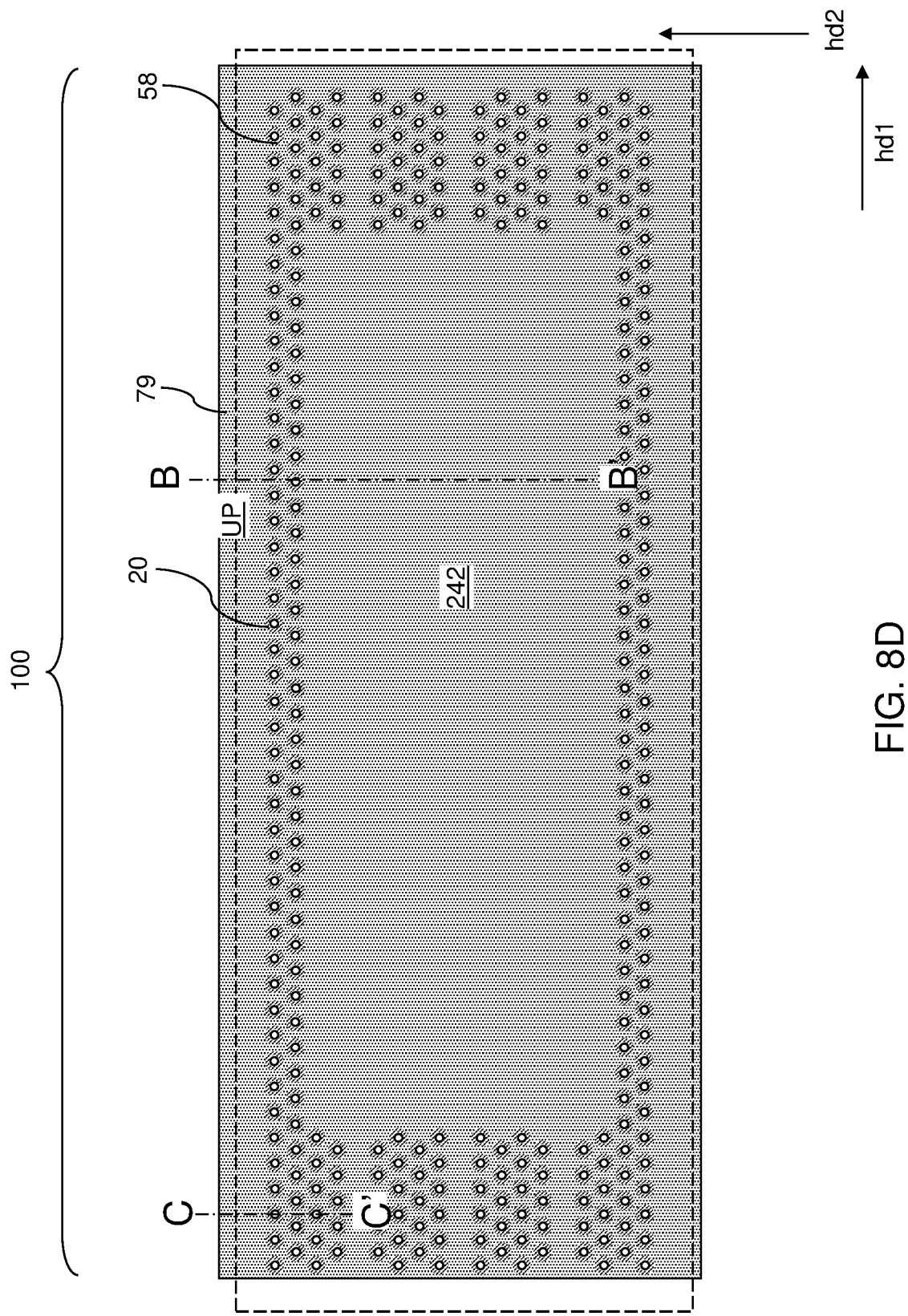
FIG. 8D is a horizontal cross-sectional view along the horizontal plane D-D' of FIG. 8B. The vertical cross-sectional plane B-B' is the plane of the vertical cross-section of FIG. 8B. The vertical cross-sectional plane C-C' is the plane of the vertical cross-section of FIG. 8C.

Referring to FIG. 6, various second-tier openings) may be formed through the second-tier structure (232, 242, 265, 270). A photoresist layer (not shown) may be applied over the second insulating cap layer 270, and may be lithographically patterned to form various openings therethrough. The pattern of the openings may be the same as the pattern of the various first-tier openings, which is the same as the sacrificial first-tier opening fill portions (148, 128). Thus, the lithographic mask used to pattern the first-tier openings may be used to pattern the photoresist layer.

The pattern of openings in the photoresist layer may be transferred through the second-tier structure (232, 242, 265, 270) by a second anisotropic etch process to form various second-tier openings) concurrently, i.e., during the second anisotropic etch process. The various second-tier openings) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings) may be substantially vertical, or may be tapered. A bottom periphery of each second-tier opening) may be laterally offset, and/or may be located entirely within, a periphery of a top surface of an underlying sacrificial first-tier opening fill portion (148, 128). The photoresist layer may be subsequently removed, for example, by ashing.

The sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 7A-7D provide sequential cross-sectional views of a memory opening 49 during formation of a memory opening fill structure. The same structural change occurs in each of the memory openings 49 and the support openings 19.

Referring to FIG. 7A, a memory opening 49 in the first exemplary device structure of FIG. 6 is illustrated. The memory opening 49 extends through the first-tier structure and the second-tier structure.

Referring to FIG. 7B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 7C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 7D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. In one embodiment, each memory stack structure 55 vertically extends through the alternating stack of the insulating layers (132, 232) and the sacrificial material layers (142, 242), and comprises a respective vertical semiconductor channel 60 and a respective memory film 50. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

Referring to FIGS. 8A-8D, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58. In one embodiment, clusters of memory opening fill structures 58 can laterally extend along a first horizontal direction (e.g., word line direction) hd1, and can be laterally spaced apart along a second horizontal direction (e.g., bit line direction) hd2 that is perpendicular to the first horizontal direction hd1. Groups of clusters of memory opening fill structures 58 may be laterally spaced apart along the second horizontal direction hd2. A region that is free of memory opening fill structures 58 and support pillar structures 20 may be provided between a pair of groups of memory opening fill structures 58 that are laterally spaced apart. In one embodiment, a unit pattern UP may be repeated with a periodicity along the second horizontal direction hd2.

Referring to FIGS. 9A-9D, a contact-level dielectric layer 280 may be formed over the second-tier structure (232, 242, 270, 265). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to various openings therein. The openings in the photoresist layer include backside trench openings, which are line-shaped openings having a respective uniform width and laterally extending along a first horizontal direction hd1 and located at boundaries between neighboring pairs of unit patterns UP, shown in FIG. 9D. Further, the openings in the photoresist layer include isolation trench openings located between a respective neighboring pair of backside trench openings. The isolation trench openings may comprise moat-shaped openings having an inner periphery that is located entirety within an outer periphery. In one embodiment, the lateral distance between the inner periphery and the outer periphery may be uniform. Alternatively, the isolation trench openings may be formed as a pair of line trench openings that are parallel to each other and located between a neighboring pair of backside trench openings. Each moat-shaped opening or each pair of line trench openings for the isolation trench openings may be formed within the area of the memory array region 100 in which memory opening fill structures 58 are not present. The openings in the photoresist layer may include additional discrete openings, which are herein referred to as via cavity openings. The via cavity openings may be formed within an inner periphery of a respective most-shaped opening or between a respective pair of line trench openings.

An anisotropic etch may be performed to transfer the pattern of the various openings in the photoresist layer through the contact-level dielectric layer 280, the second-tier structure (232, 242, 270, 265), and the first-tier structure (132, 142, 170, 165), and into the in-process source-level material layers 10' and into the at least one second dielectric layer 768. The anisotropic etch process etches unmasked portions of the contact-level dielectric layer 280, the alternating stacks {(132, 142), (232, 242)} and intervening material layers (170, 180) therebetween, and upper regions of the in-process source-level material layers 10'. A terminal step of the anisotropic etch process may be selective to the metallic material of the metal pad structures 788 and/or selective to the semiconductor material of the source-level sacrificial layer 104.

Backside trenches 79 may be formed underneath the line-shaped openings in the photoresist layer through the contact-level dielectric layer 280, the second-tier structure (232, 242, 270, 265), and the first-tier structure (132, 142, 170, 165), and into the in-process source-level material layers 10'. Portions of the contact-level dielectric layer 280, the second-tier structure (232, 242, 270, 265), the first-tier structure (132, 142, 170, 165), and the in-process source-level material layers 10' that underlie the line-shaped openings in the photoresist layer may be removed to form the backside trenches 79. In one embodiment, the backside trenches 79 may be formed between groups (e.g., memory blocks) of memory opening fill structures 58 that are laterally spaced apart along the second horizontal direction hd2. A top surface of a source-level sacrificial layer 104 may be physically exposed at the bottom of each backside trench 79.

Figure 9A:
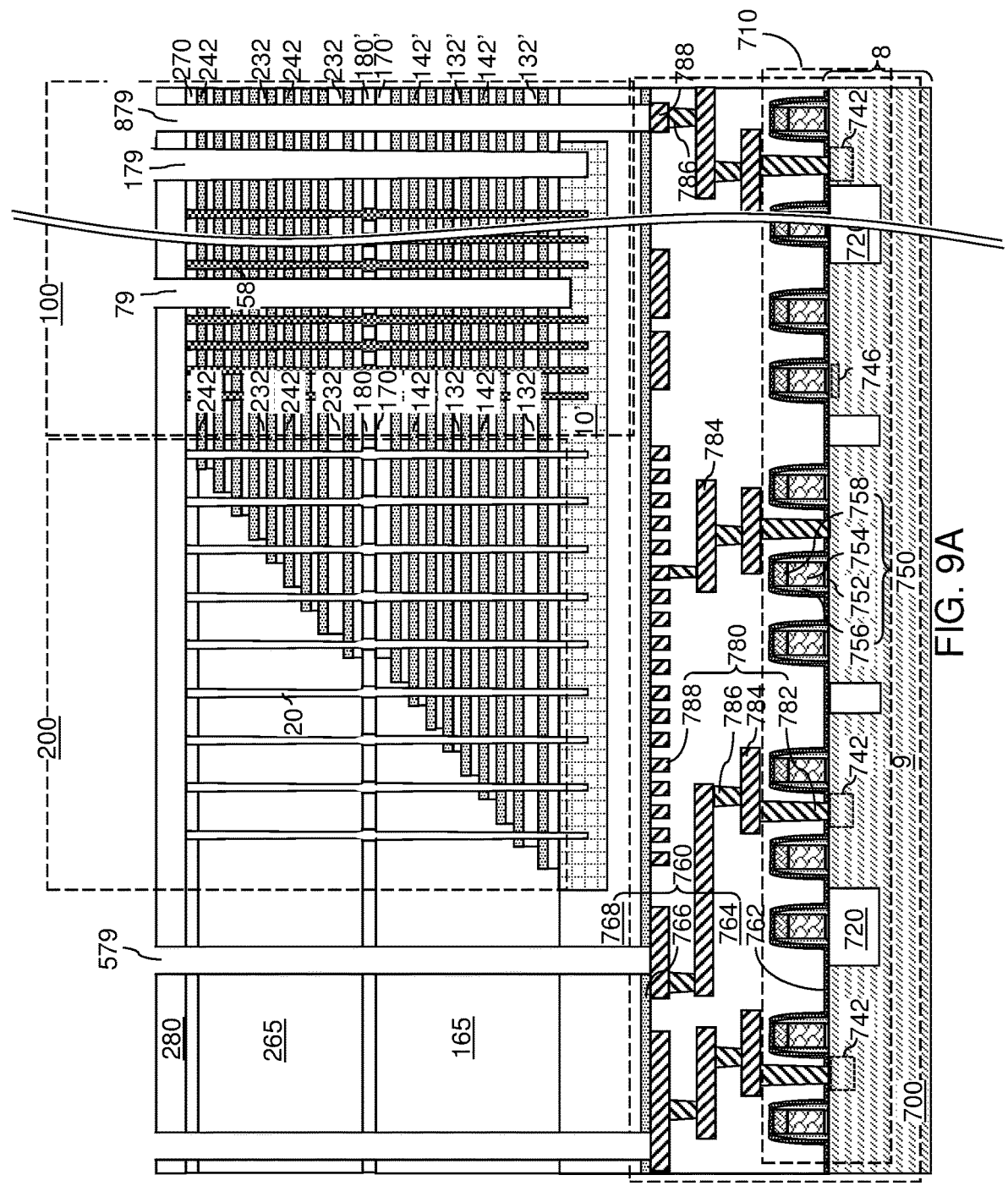
FIG. 9A is a vertical cross-sectional view of the exemplary structure after formation of backside trenches, an isolation trench, and through-memory-level via cavities according to an embodiment of the present disclosure.
Figure 9B:
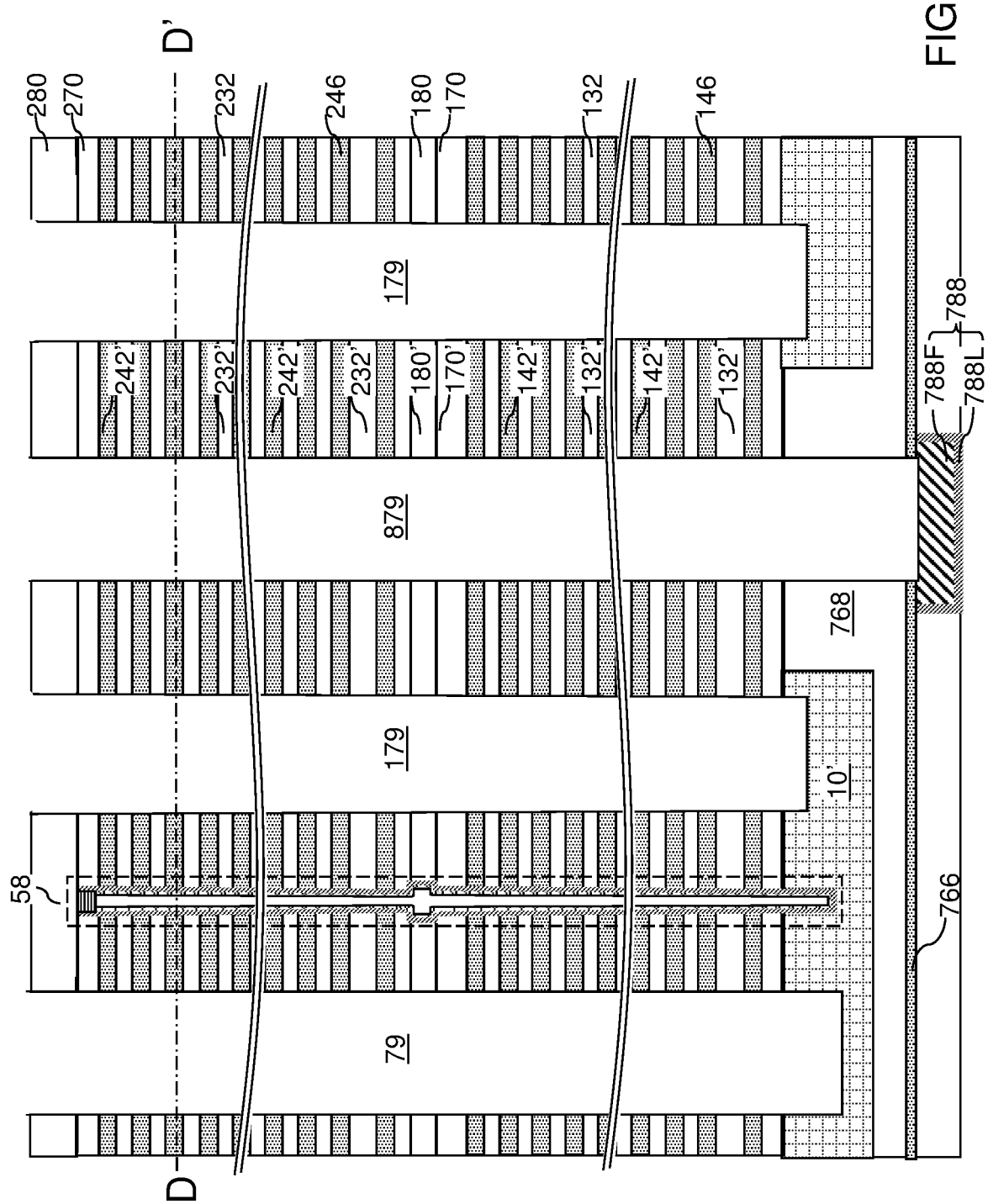
FIG. 9B is another vertical cross-sectional view of the exemplary structure of FIG. 9A.
Figure 9C:
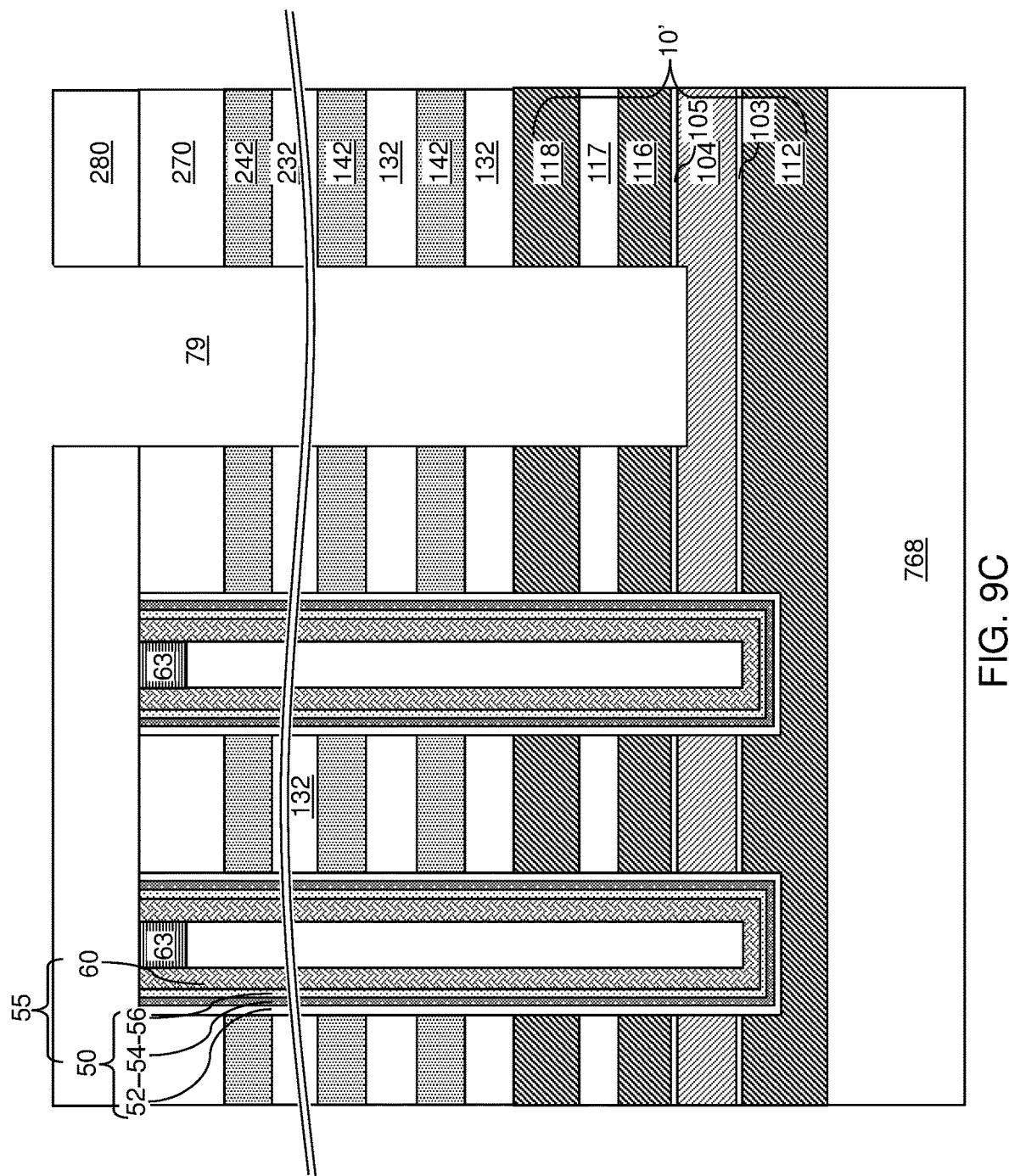
FIG. 9C is yet another vertical cross-sectional view of the exemplary structure of FIGS. 9A and 9B.
Figure 9D:
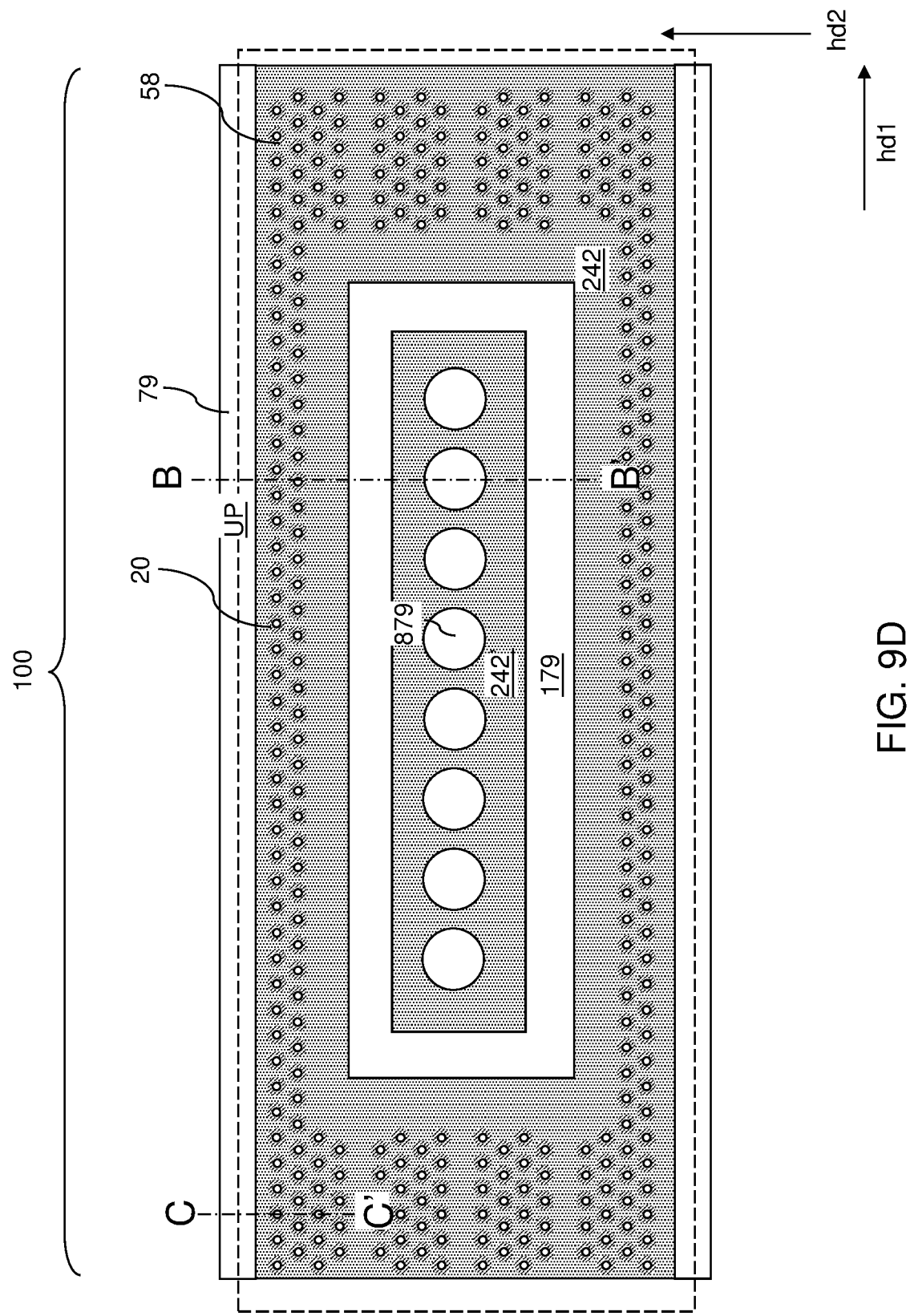
FIG. 9D is a horizontal cross-sectional view along the horizontal plane D-D' of FIG. 9B. The vertical cross-sectional plane B-B' is the plane of the vertical cross-section of FIG. 9B. The vertical cross-sectional plane C-C' is the plane of the vertical cross-section of FIG. 9C.
Figure 9E:
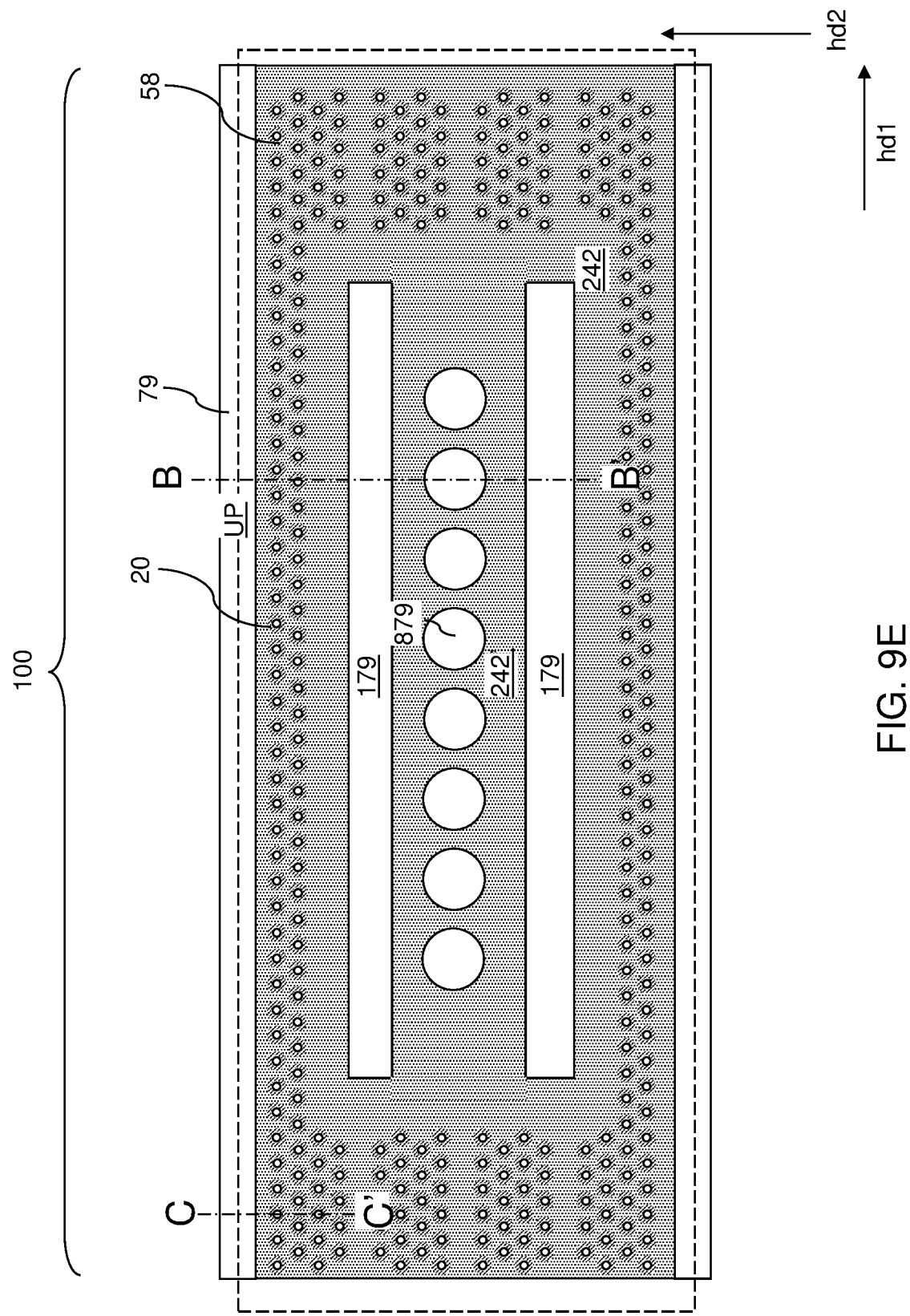
FIG. 9E is a horizontal cross-sectional view along the horizontal plane D-D' of FIG. 9B according to an alternative embodiment of the exemplary structure.

Isolation trenches 179 can be formed underneath the isolation trench openings in the photoresist layer. The isolation trenches 179 can have substantially vertical sidewalls that extend through the contact-level dielectric layer 280, the second-tier structure (232, 242, 270, 265), and the first-tier structure (132, 142, 170, 165) underneath the isolation trench openings in the photoresist layer. Each isolation trench 179 may vertically extend into the in-process source-level material layers 10', and laterally surround a periphery of a respective opening through the in-process source-level material layers 10'. The isolation trenches 179 may comprise moat-shaped trenches, as shown in FIG. 9D. Alternatively, the isolation trenches 179 may comprise pairs of line trenches that are parallel to each other, as shown in FIG. 9E. Each moat-shaped trench or each pair of line trenches located between a neighboring pair of backside trenches 79 and in the memory array region 100.

In case the isolation trenches 179 are formed as moat trenches having a respective inner periphery and a respective outer periphery shown in FIG. 9D, then each set of contiguous material portions of the first-tier alternating stack (132, 142) and the second-tier alternating stack (232, 242) that are surrounded by the isolation trench comprise a vertically alternating sequence of first insulating plates 132', first dielectric material plates 142', second insulating plates 232', and second dielectric material plates 242'. In case the isolation trenches 179 are formed as a pair of line trenches shown in FIG. 9E, then each set of contiguous material portions of the first-tier alternating stack (132, 142) and the second-tier alternating stack (232, 242) that are located between the pairs of line trenches comprise the vertically alternating sequence of first insulating plates 132', first dielectric material plates 142', second insulating plates 232', and second dielectric material plates 242'. Patterned portions of the first insulating layers 132 laterally surrounded by the isolation trench comprise first insulating plates 132'. Patterned portions of the first sacrificial material layers 142 laterally surrounded by a isolation trench—comprise first dielectric material plates 142'. A patterned portion of the first insulating cap layer 170 laterally surrounded by a first-tier isolation trench comprises a first insulating cap plate 170'. A patterned portion of the inter-tier dielectric layer 180 laterally surrounded by a isolation trench comprises an inter-tier dielectric plate 180'. Patterned portions of the first insulating layers 132 and the first sacrificial material layers 142 within each first-tier isolation trench comprise a first vertically alternating sequence of first insulating plates 132' and first dielectric material plates 142'. The first sacrificial material layers 142 first dielectric material plates 142' comprise a first dielectric material, such as silicon nitride.

Patterned portions of the second insulating layers 232 laterally surrounded by a isolation trench comprise second insulating plates 232'. Patterned portions of the second sacrificial material layers 242 laterally surrounded by an isolation trench 179 comprise second dielectric material plates 242'. A patterned portion of the second insulating cap layer 270 laterally surrounded by a second-tier isolation trench comprises a second insulating cap plate 270'. Patterned portions of the second insulating layers 232 and the second sacrificial material layers 242 within each second-tier isolation trench comprise a second vertically alternating sequence of second insulating plates 232' and second dielectric material plates 242'. The second sacrificial material layers 242 and the second dielectric material plates 242' comprise a second dielectric material, such as silicon nitride. Each vertically alternating sequence of insulating plates (132', 232') and dielectric material plates (142', 242') is laterally surrounded by alternating stack of insulating layers (132, 232) and sacrificial material layers (142, 242). The backside trenches 79 are laterally spaced from the isolation trenches 179.

Each of the first insulating plates 132' can be vertically spaced from the top surface of the in-process source-level material layers 10' by a same vertical distance as a respective first insulating layer 132 in the first-tier alternating stack is from the top surface of the in-process source-level material layers 10'. Each of the first dielectric material plates 142' can be vertically spaced from the top surface of the in-process source-level material layers 10' by a same vertical distance as a respective first sacrificial material layer 142 in the first-tier alternating stack is from the top surface of the in-process source-level material layers 10'. Each of the second insulating plates 232' can be vertically spaced from the top surface of the in-process source-level material layers 10' by a same vertical distance as a respective second insulating layer 232 in the second-tier alternating stack is from the top surface of the in-process source-level material layers 10'. Each of the second dielectric material plates 242' can be vertically spaced from the top surface of the in-process source-level material layers 10' by a same vertical distance as a respective second sacrificial material layer 242 in the second-tier alternating stack is from the top surface of the in-process source-level material layers 10'.

First through-memory-level via cavities 879 can be formed within an area defined by an isolation trench 179 (in case the isolation trench 179 is formed as a moat trench shown in FIG. 9D), and/or can be formed within an area by a pair of isolation trenches 179 (in case the isolation trenches 179 are formed as line trenches shown in FIG. 9E that define an area of a strip therebetween). In one embodiment, the first through-memory-level via cavities 879 can be formed through a respective one of the vertical alternating sequences of insulating plates (132', 232') and dielectric material plates (142', 242'). Each first through-memory-level via cavity 879 can vertically extend through each plate within a respective vertically alternating sequence of insulating plates (132', 232') and dielectric material plates (142', 242'). A top surface a metal pad structure 788 can be physically exposed at the bottom of each first through-memory-level via cavity 879.

Second through-memory-level via cavities 579 can be formed through the retro-stepped dielectric material portions (165, 265). Each second through-memory-level via cavity 579 can vertically extend through each of the retro-stepped dielectric material portions (165, 265). A top surface a metal pad structure 788 can be physically exposed at the bottom of each second through-memory-level via cavity 579.

According to an aspect of the present disclosure, the backside trenches 79, the isolation trenches 179, the first through-memory-level via cavities 879, and the second through-memory-level via cavities 579 can be simultaneously formed by performing the anisotropic etch process. Portions of the planar silicon nitride liner 766 that underlie the through-memory-level via cavities (879, 579) are removed by the anisotropic etch process. A center portion of a top surface of a respective one of the lower-level metal interconnect structures 760 can be physically exposed through an opening in the planar silicon nitride liner 766 upon formation of the through-memory-level via cavities (879, 579). The photoresist layer may be removed, for example, by ashing.

Figure 10A:
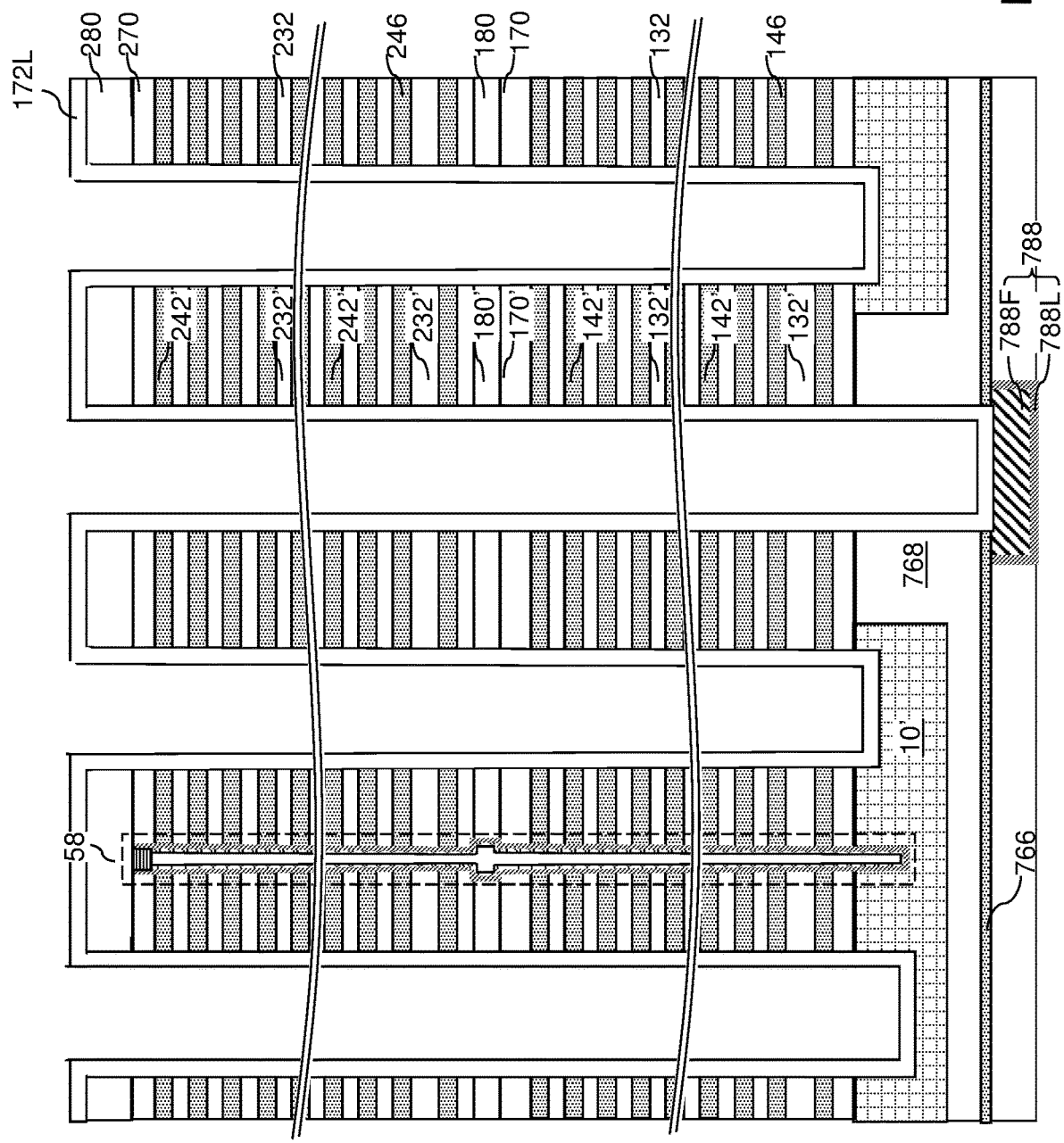
FIGS. 10A and 10B are sequential vertical cross-sectional views of the exemplary structure during deposition of a dielectric trench liner layer and a fill material according to an embodiment of the present disclosure.

Referring to FIG. 10A, a dielectric trench liner layer 172L can be deposited by a conformal deposition process, such as a chemical vapor deposition process. The dielectric trench liner layer 172L can be formed by conformal deposition of a dielectric material, such as silicon oxide, silicon nitride, or a dielectric metal oxide (such as aluminum oxide, titanium oxide, tantalum oxide, yttrium oxide, lanthanum oxide, etc.) directly on sidewalls of each backside trench 79, each isolation trench 179, and each through-memory-level via cavity (879, 579). In one embodiment, the dielectric trench liner layer 172L contacts each plate within each vertically alternating sequence of insulating plates (132', 232') and dielectric material plates (142', 242'). The dielectric trench liner layer 172L can have a thickness greater than 2 nm, such as a thickness in a range from 4 nm to 40 nm, such as from 6 nm to 20 nm, although lesser and greater thicknesses may also be employed. The dielectric trench liner layer 172L can be a conformal layer that continuously extends over the entire lateral extent of the exemplary structure.

Figure 10B:
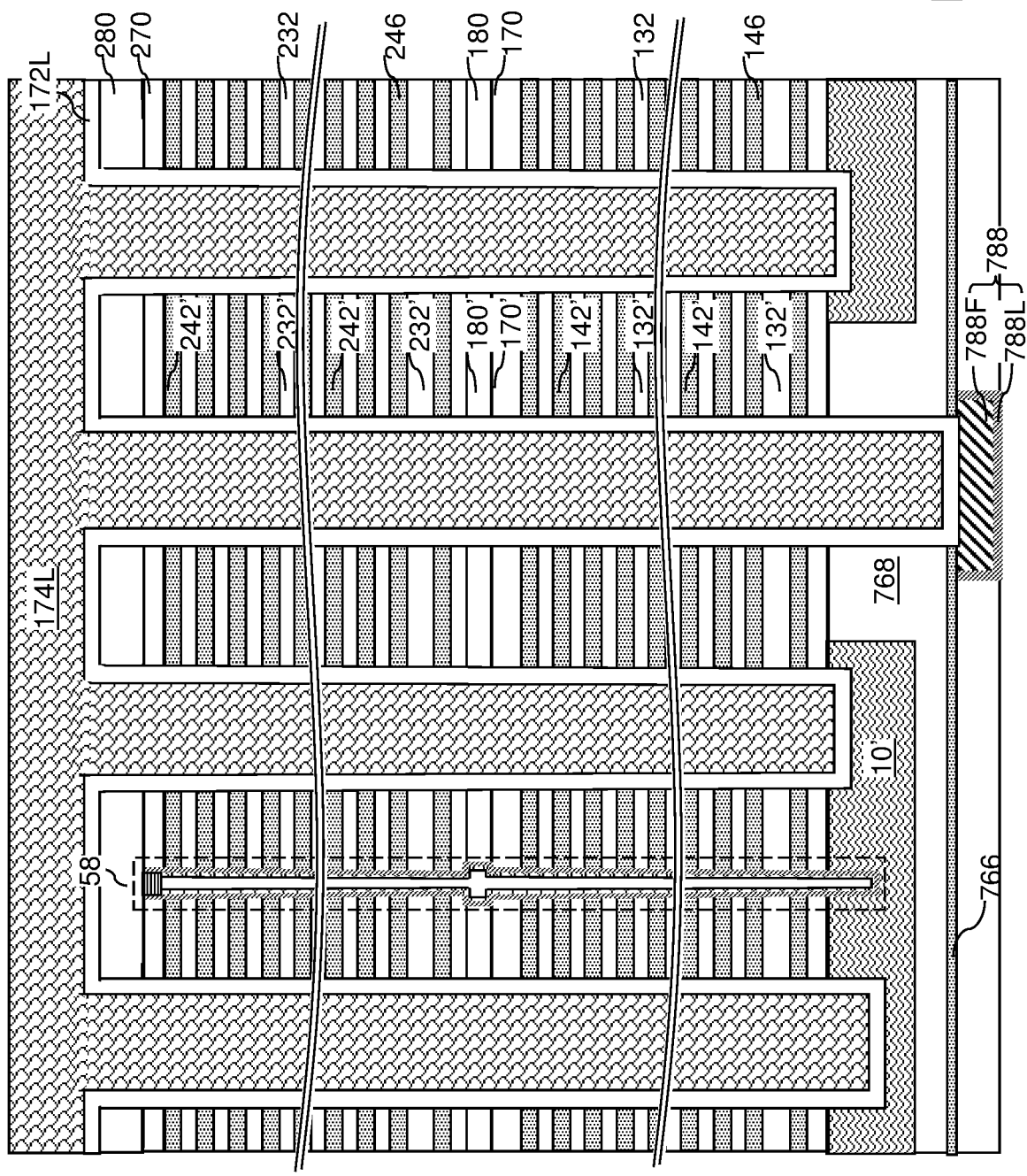
Figure 11A:
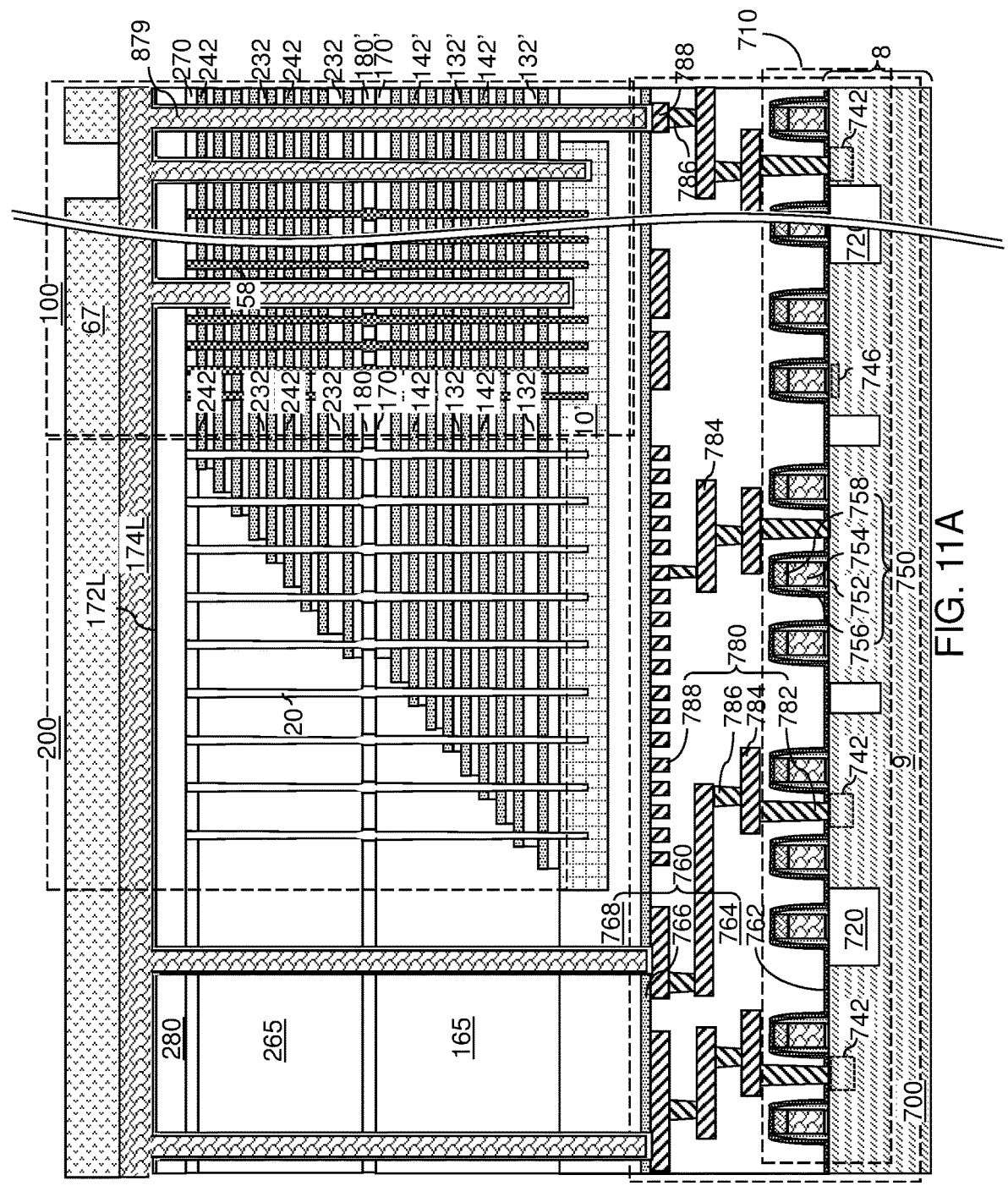
FIG. 11A is a vertical cross-sectional view of the exemplary structure after application and patterning of a photoresist layer according to an embodiment of the present disclosure.
Figure 11B:
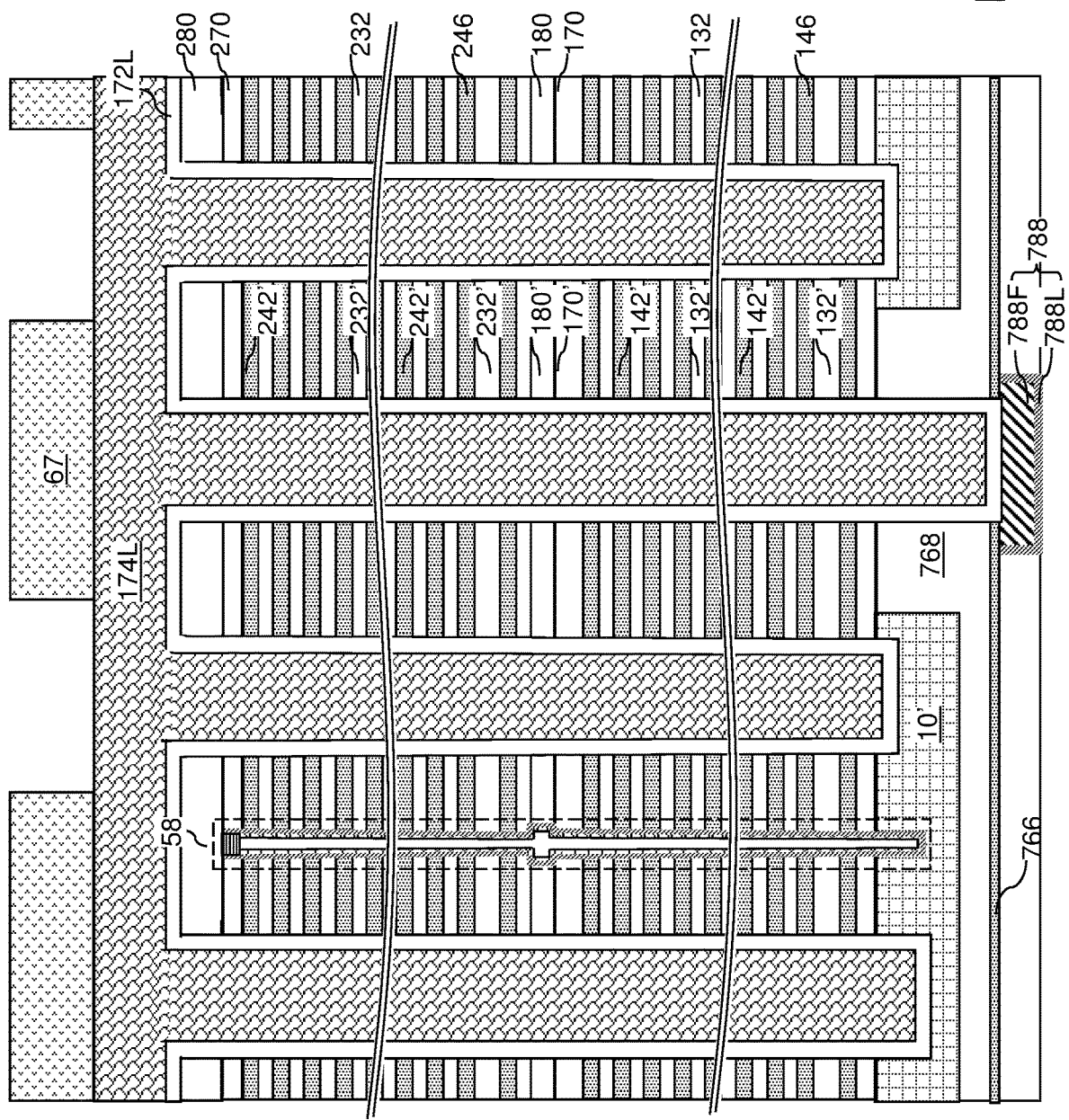
FIG. 11B is another vertical cross-sectional view of the exemplary structure of FIG. 11A.
Figure 11C:
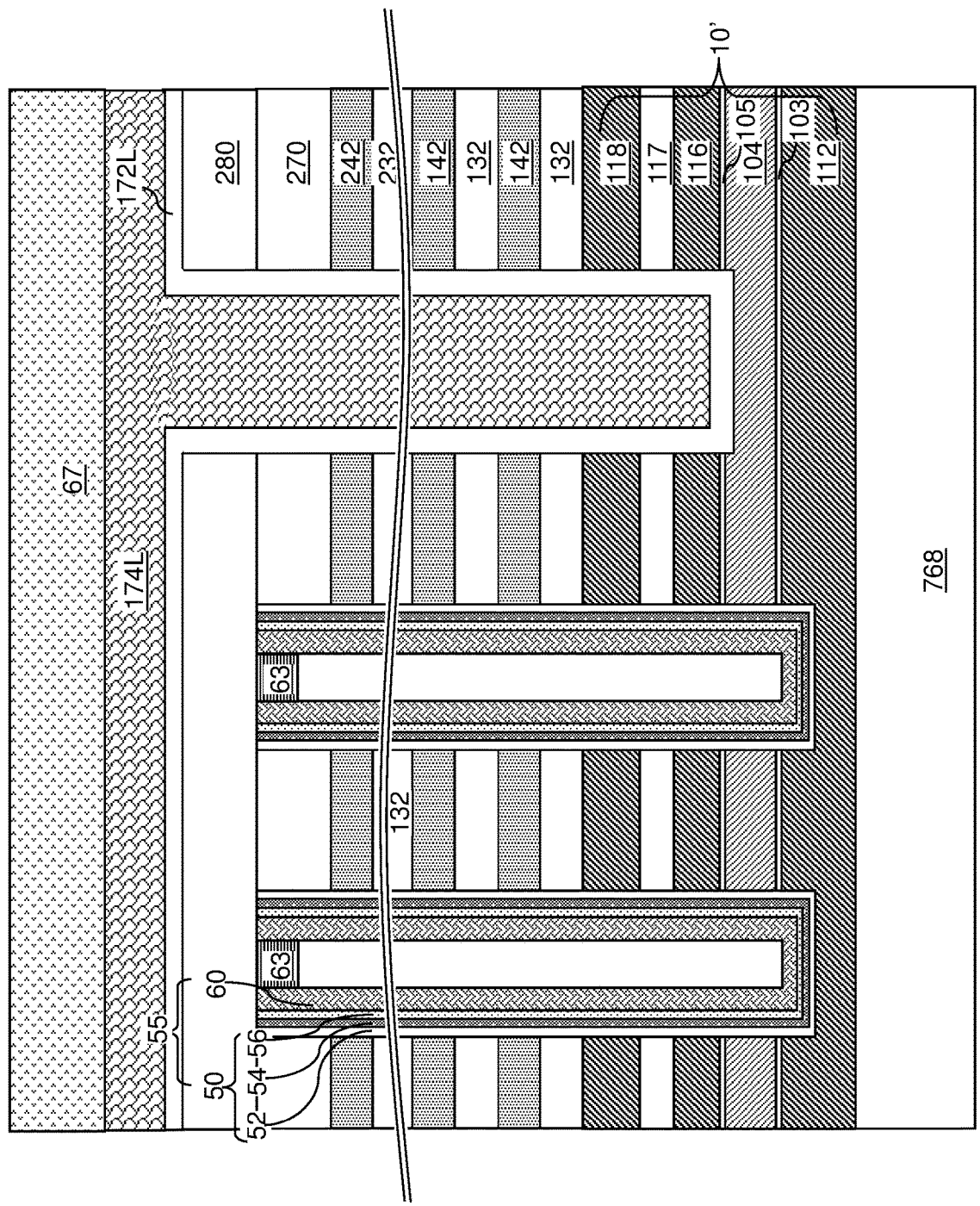
FIG. 11C is yet another vertical cross-sectional view of the exemplary structure of FIGS. 11A and 11B.
Figure 11D:
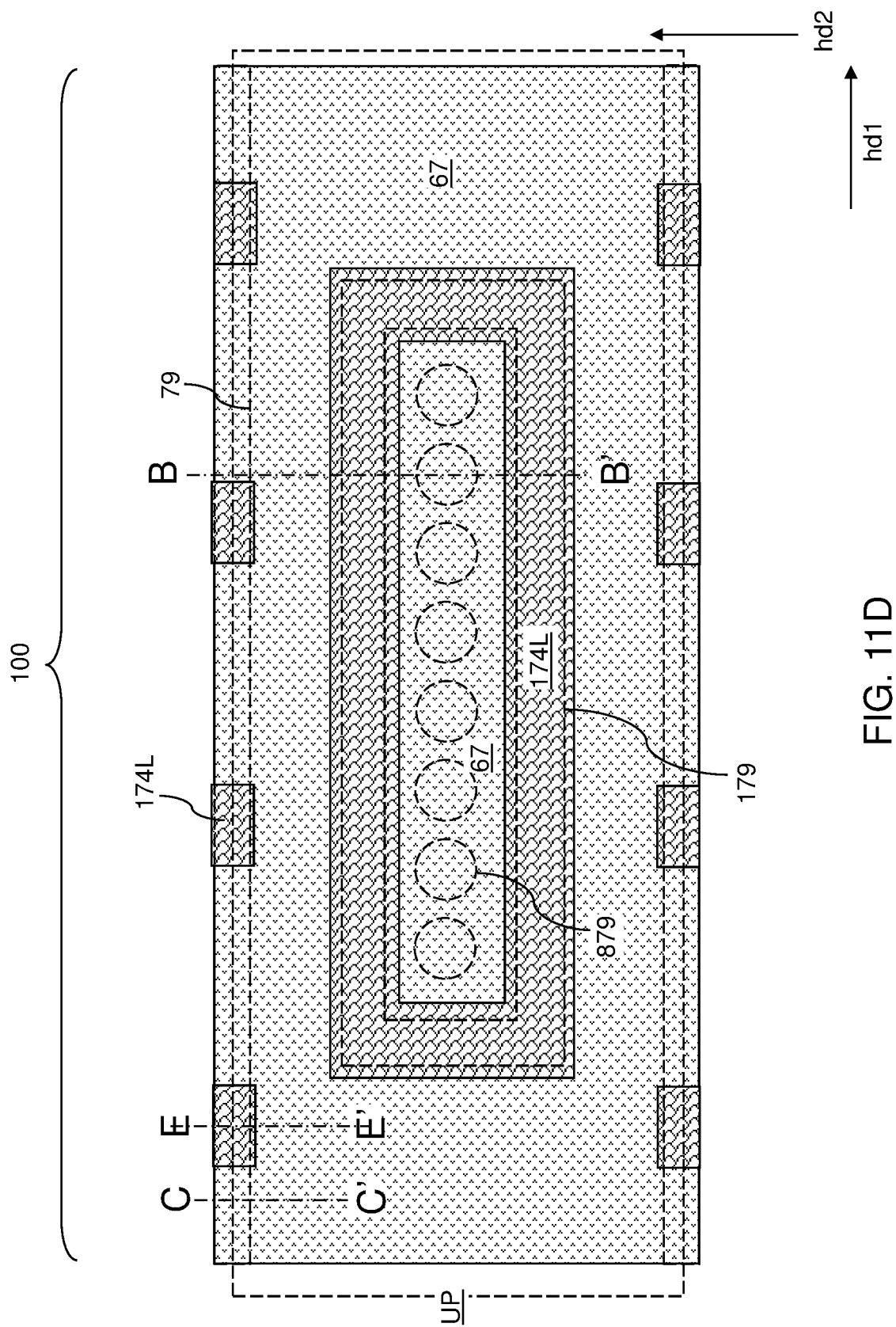
FIG. 11D is a horizontal cross-sectional view along the horizontal plane D-D' of FIG. 11B. The vertical cross-sectional plane B-B' is the plane of the vertical cross-section of FIG. 11B. The vertical cross-sectional plane C-C' is the plane of the vertical cross-section of FIG. 11C.
Figure 11E:
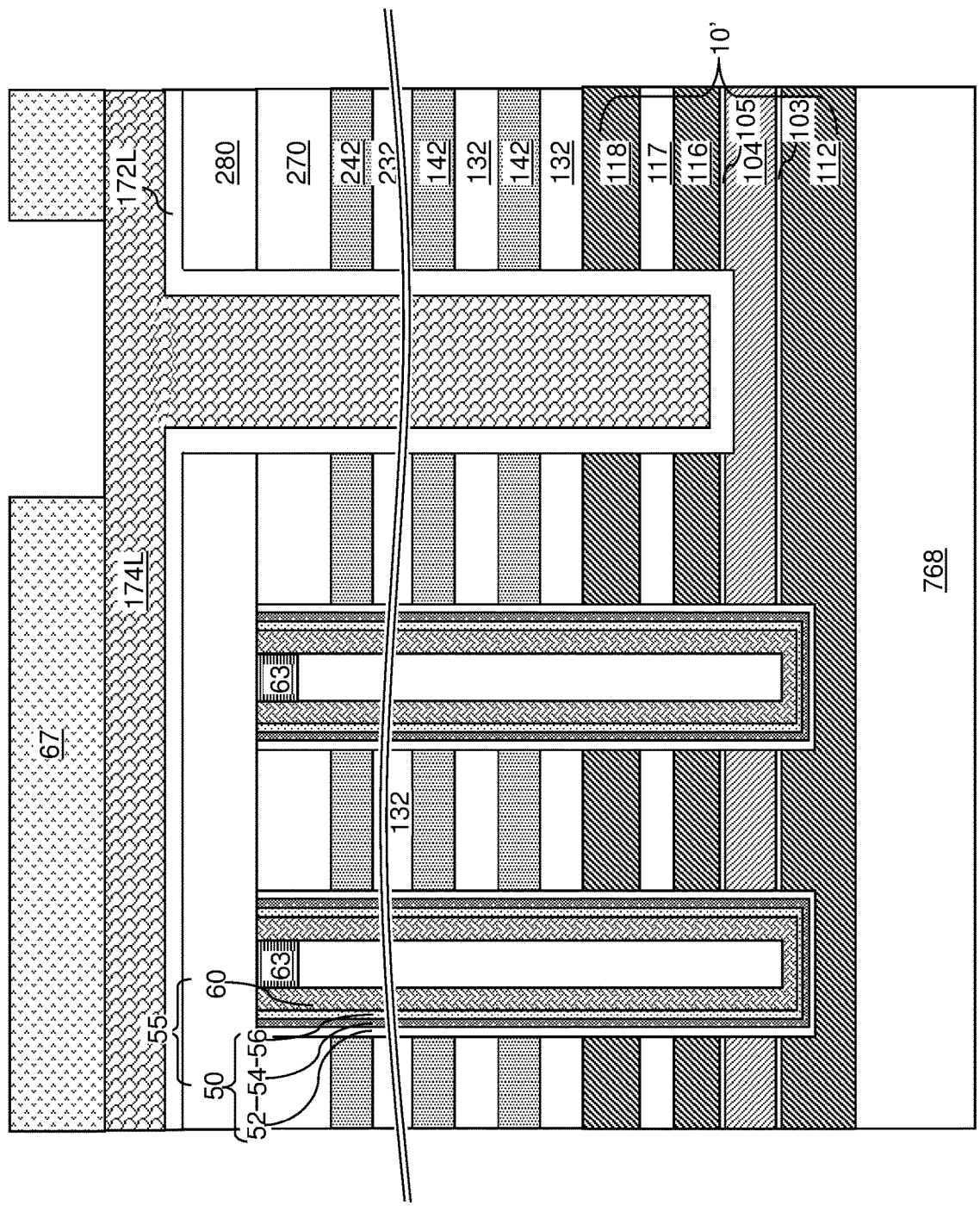
FIG. 11E is a vertical cross-sectional view of the exemplary structure along the vertical plane E-E' of FIG. 11D.
Figure 12A:
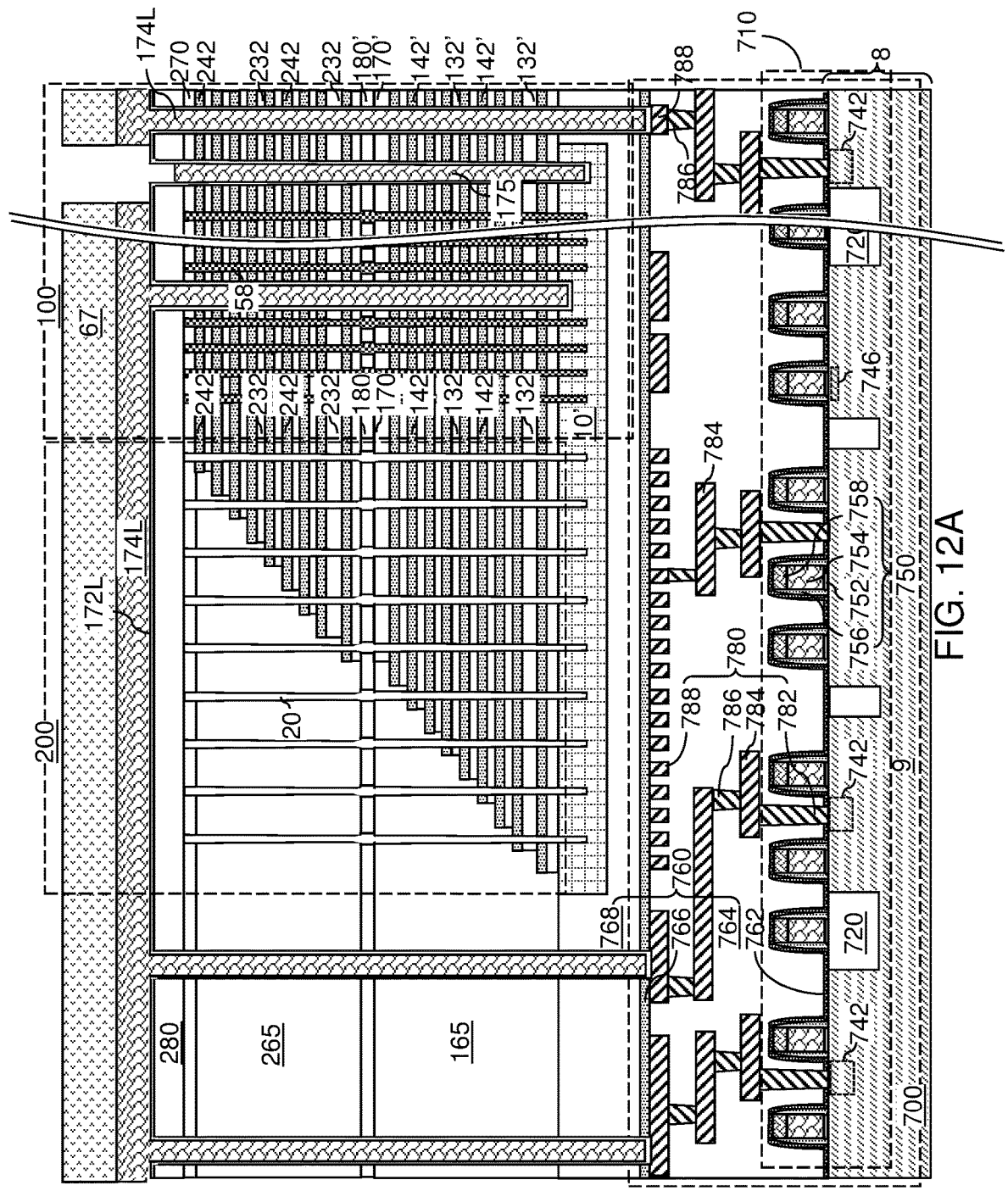
FIG. 12A is a vertical cross-sectional view of the exemplary structure after vertically recessing unmasked portions of a fill material layer according to an embodiment of the present disclosure.
Figure 12B:
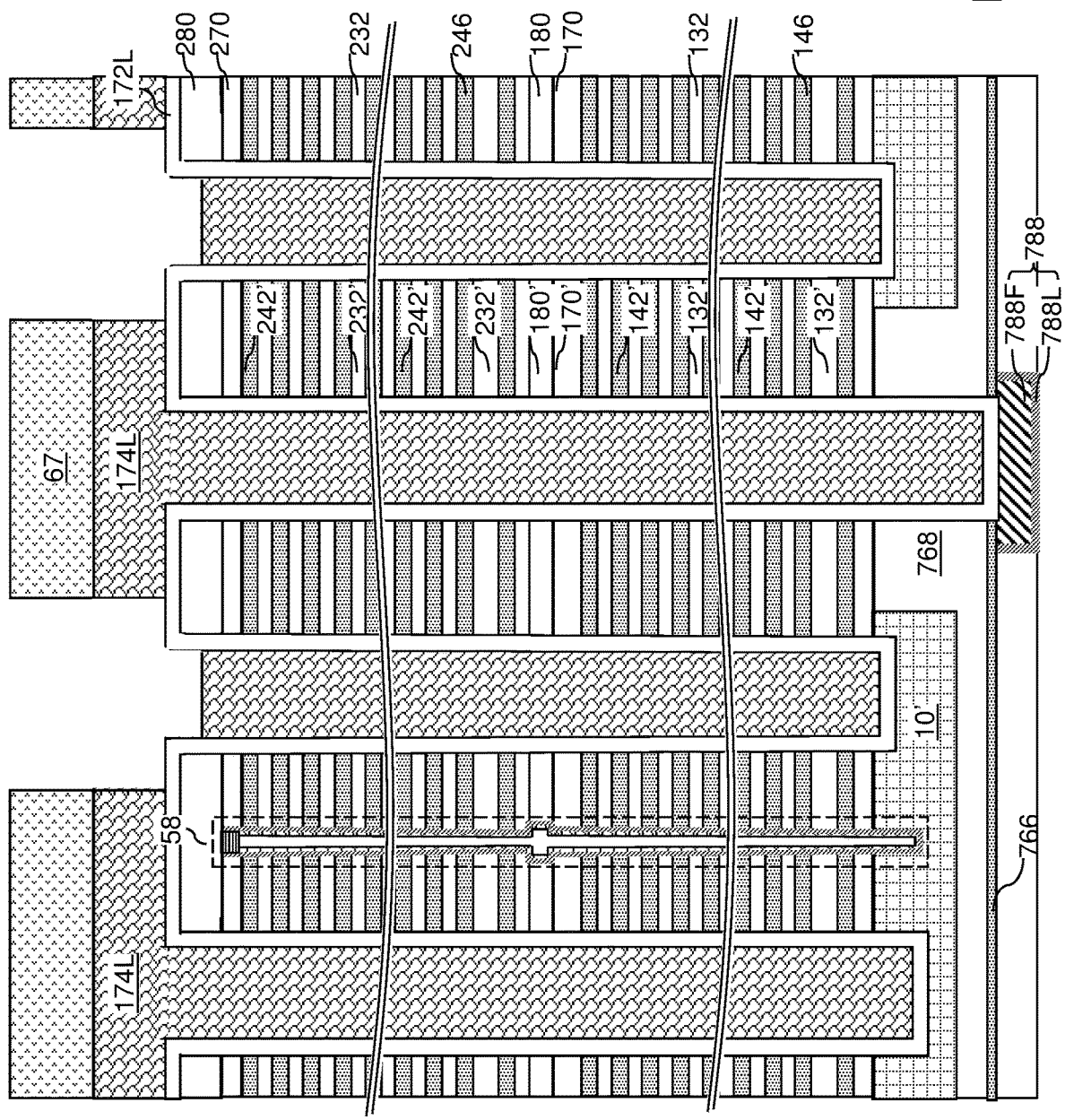
FIG. 12B is another vertical cross-sectional view of the exemplary structure of FIG. 12A.
Figure 12C:
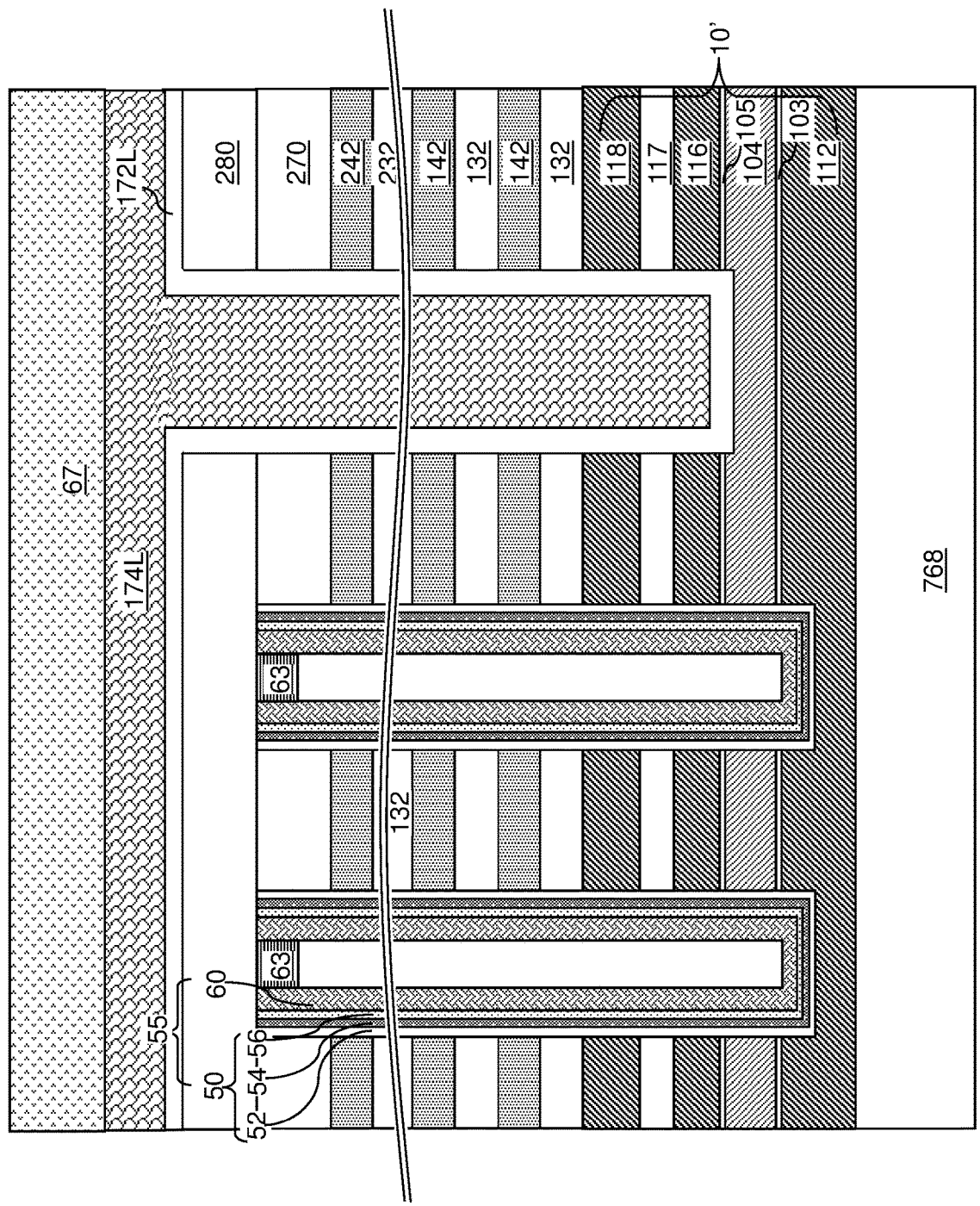
FIG. 12C is yet another vertical cross-sectional view of the exemplary structure of FIGS. 12A and 12B.
Figure 12D:
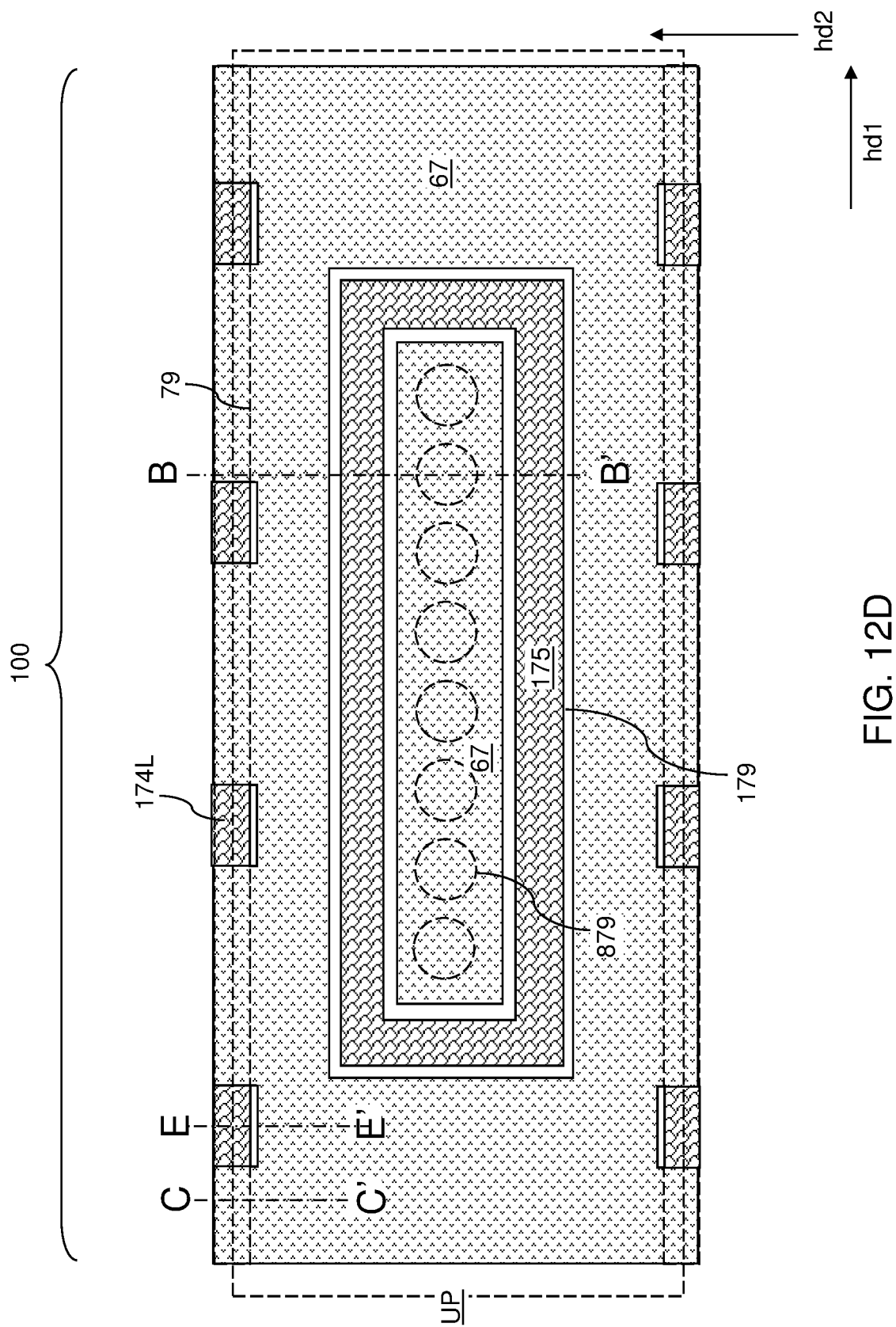
FIG. 12D is a horizontal cross-sectional view along the horizontal plane D-D' of FIG. 12B. The vertical cross-sectional plane B-B' is the plane of the vertical cross-section of FIG. 12B. The vertical cross-sectional plane C-C' is the plane of the vertical cross-section of FIG. 12C.
Figure 12E:
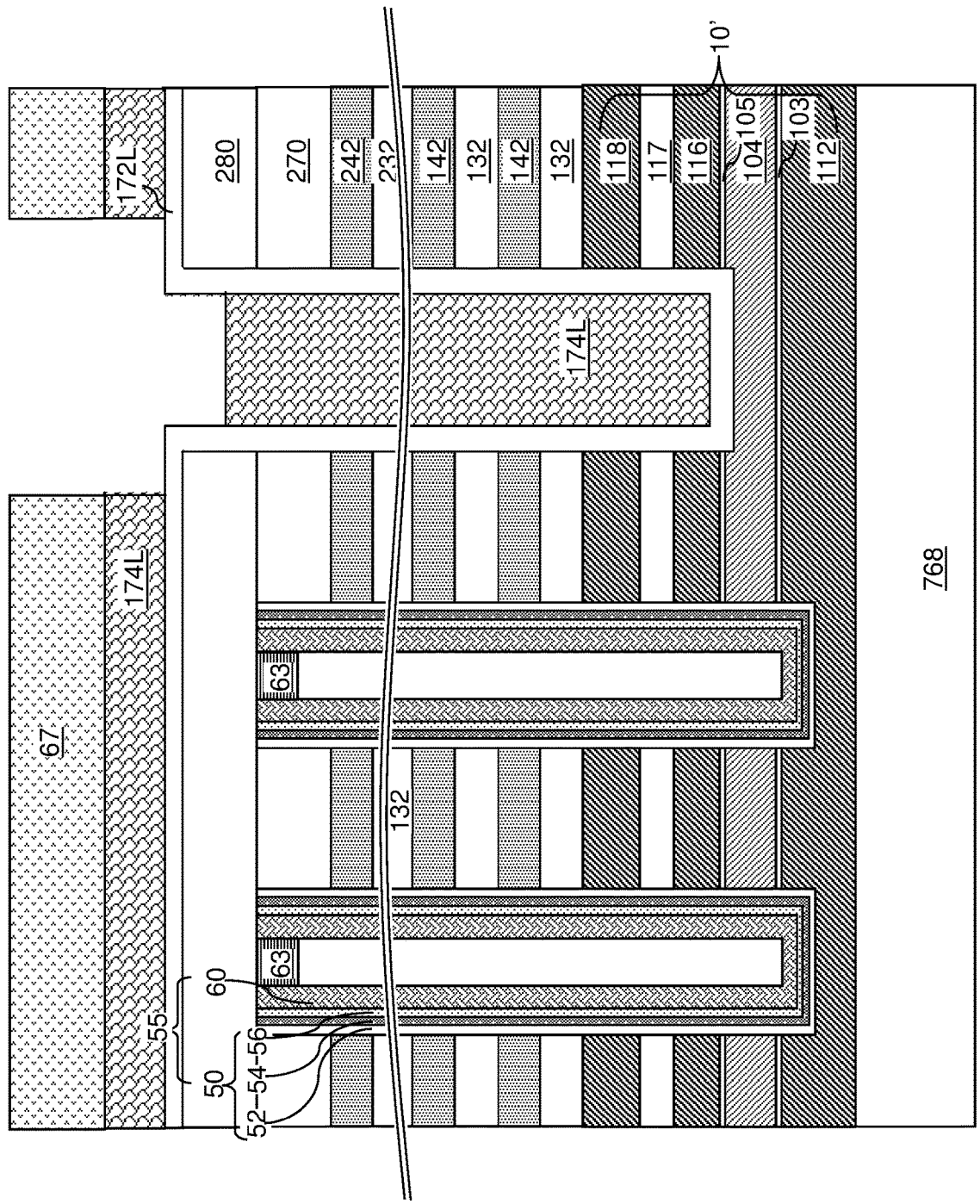
FIG. 12E is a vertical cross-sectional view of the exemplary structure along the vertical plane E-E' of FIG. 12D.
Figure 13A:
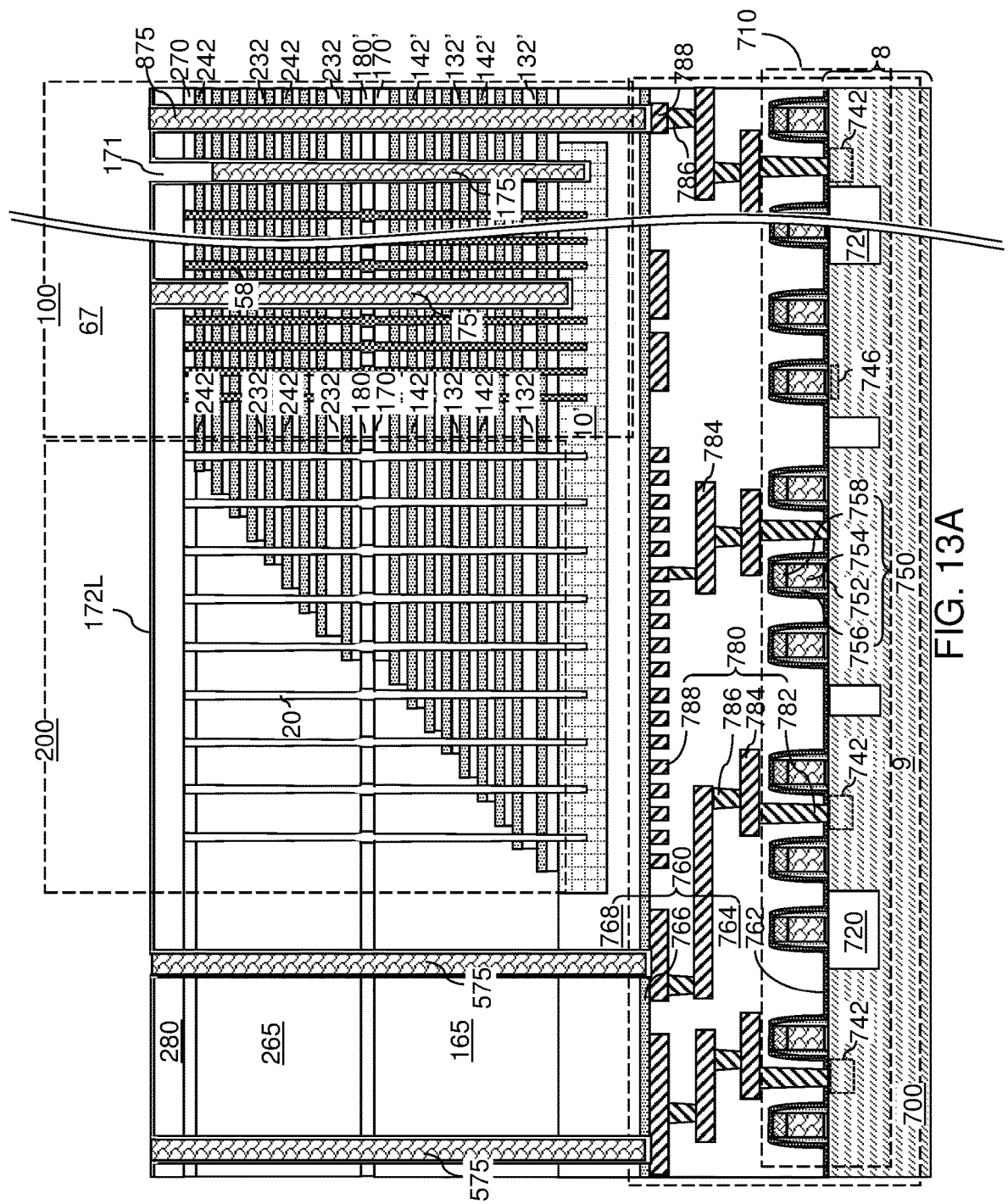
FIG. 13A is a vertical cross-sectional view of the exemplary structure after removing the photoresist layer and removing horizontally-extending portions of the fill material layer according to an embodiment of the present disclosure.
Figure 13B:
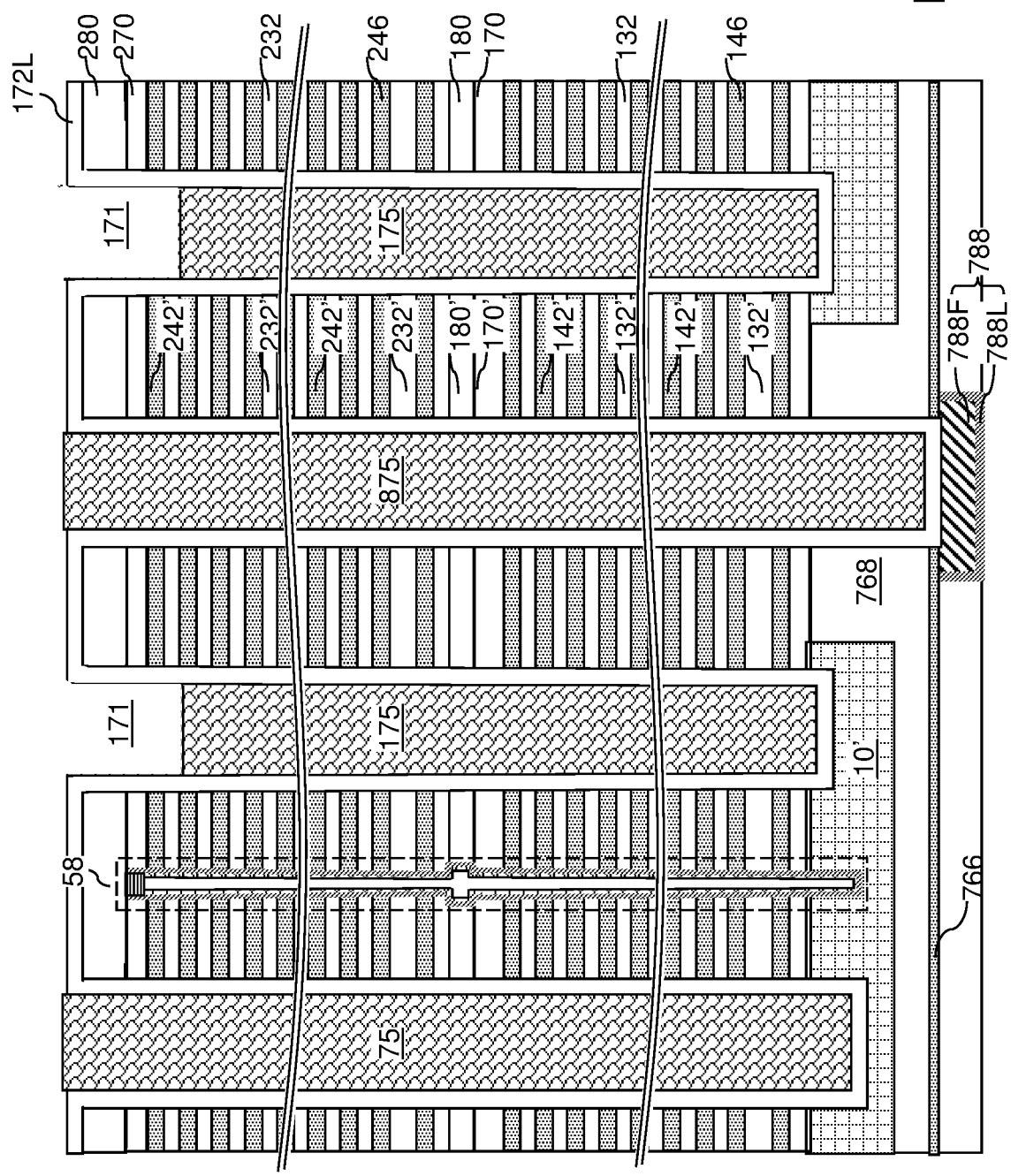
FIG. 13B is another vertical cross-sectional view of the exemplary structure of FIG. 13A.
Figure 13C:
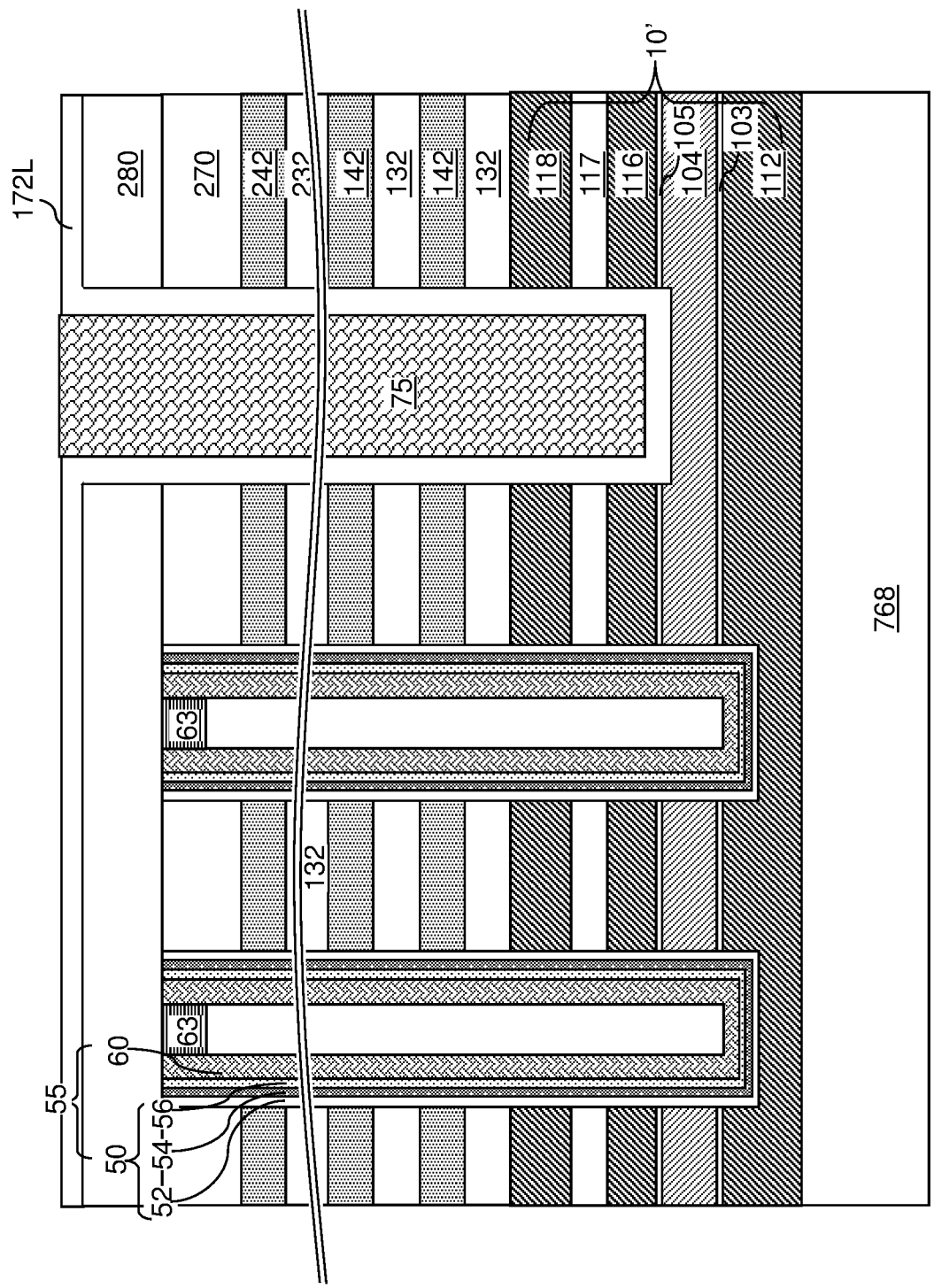
FIG. 13C is yet another vertical cross-sectional view of the exemplary structure of FIGS. 13A and 13B.
Figure 13D:
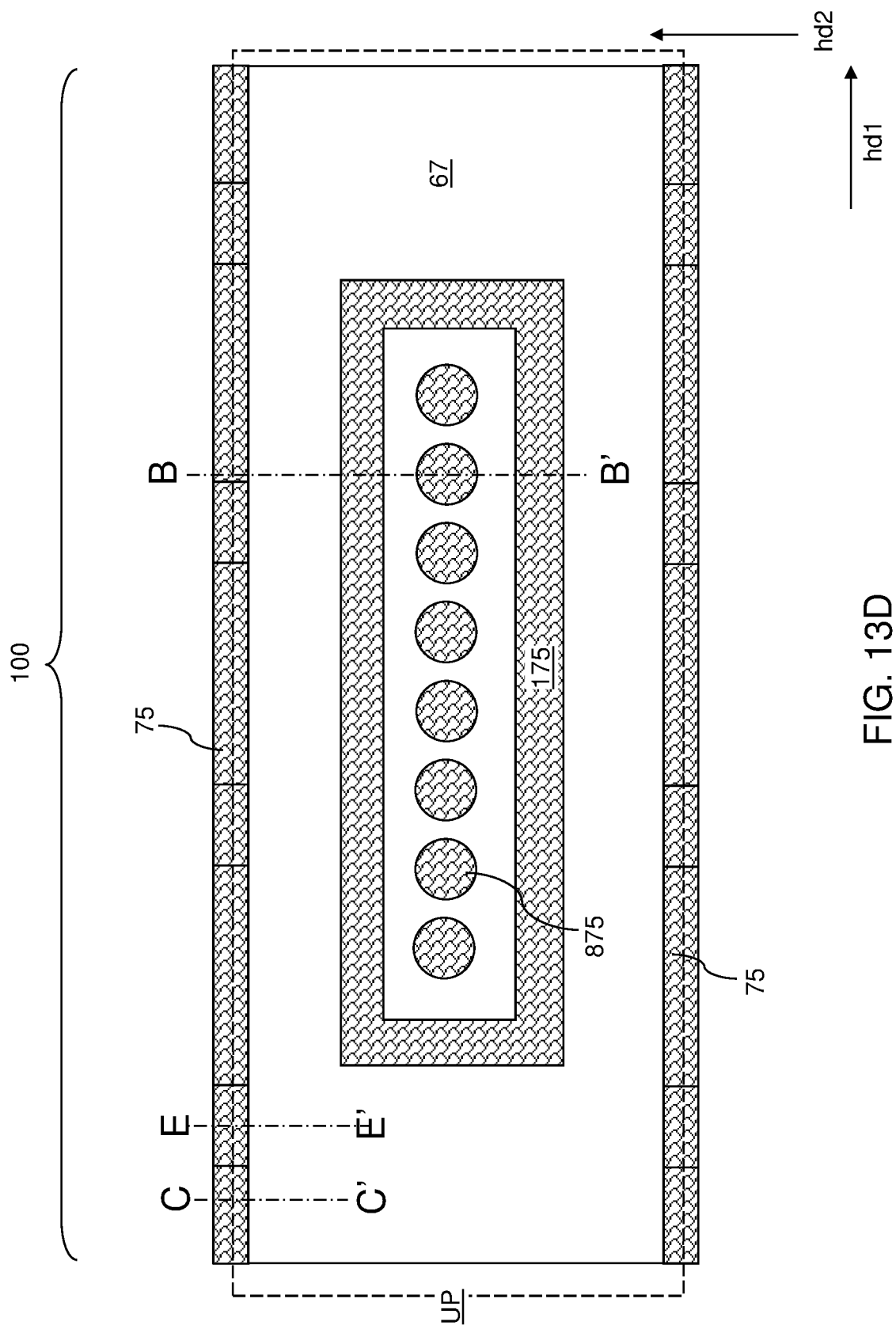
FIG. 13D is a horizontal cross-sectional view along the horizontal plane D-D' of FIG. 13B. The vertical cross-sectional plane B-B' is the plane of the vertical cross-section of FIG. 13B. The vertical cross-sectional plane C-C' is the plane of the vertical cross-section of FIG. 13C.
Figure 13E:
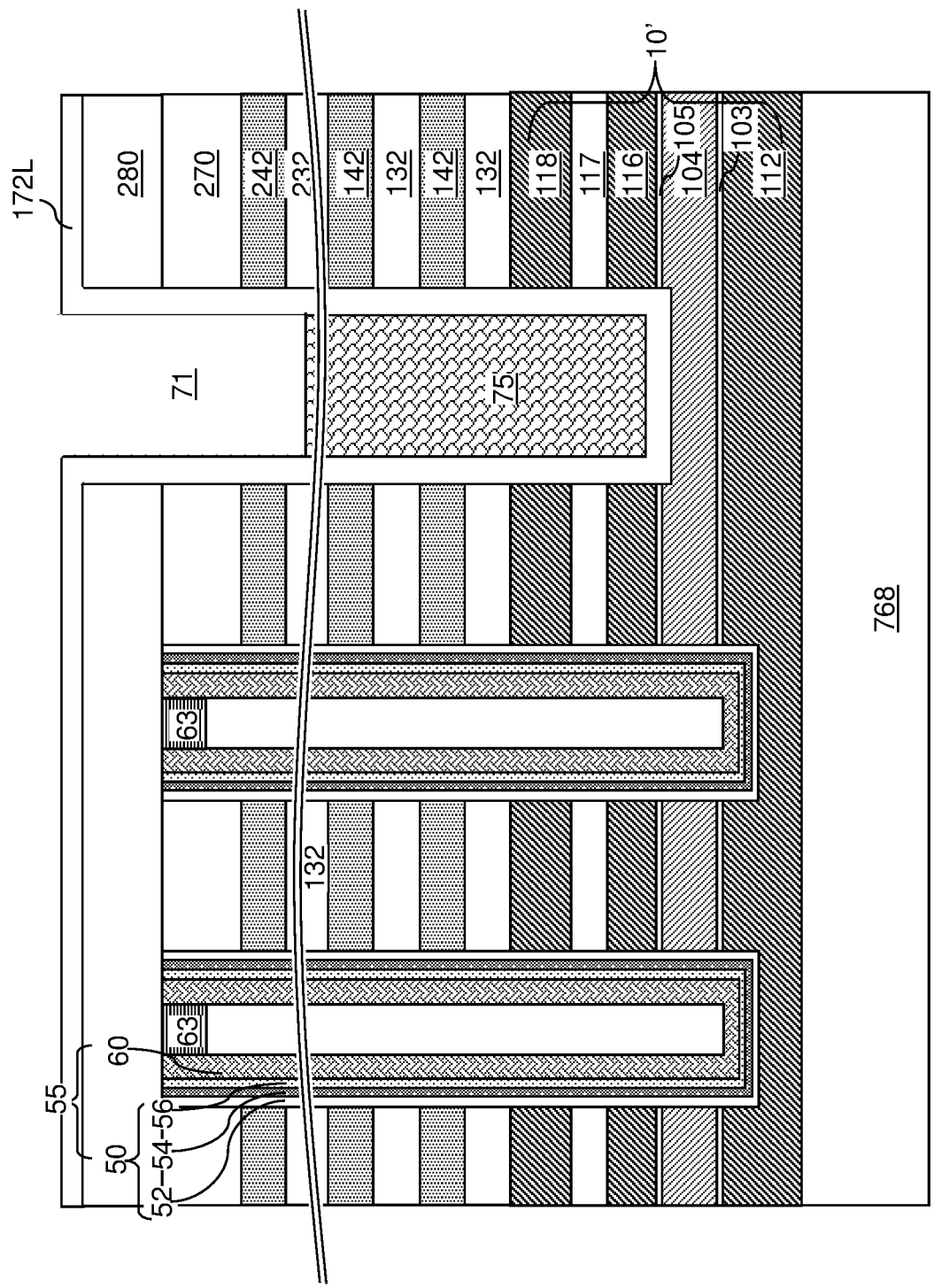
FIG. 13E is a vertical cross-sectional view of the exemplary structure along the vertical plane E-E' of FIG. 13D.
Figure 14A:
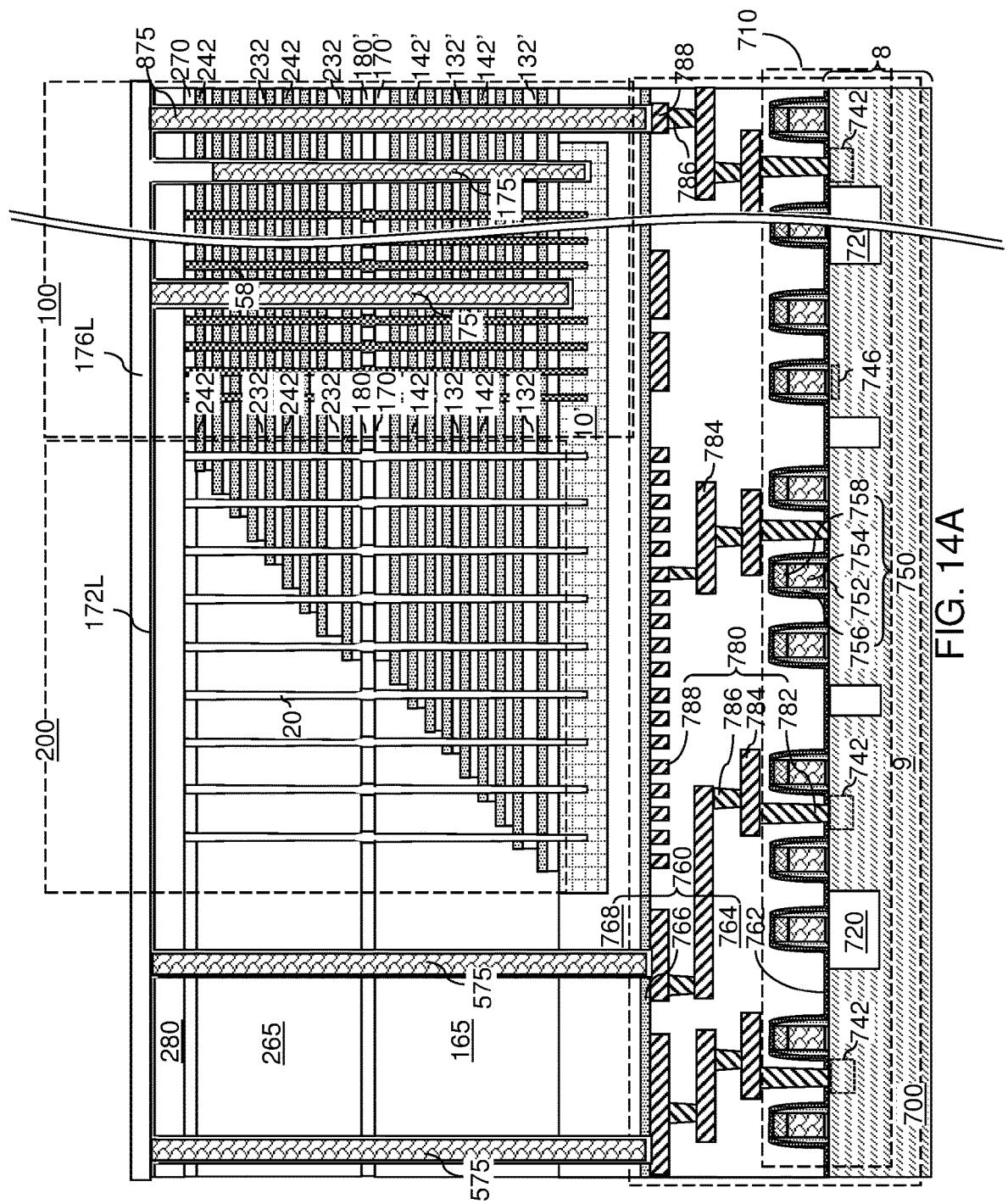
FIG. 14A is a vertical cross-sectional view of the exemplary structure after deposition of a dielectric fill material layer according to an embodiment of the present disclosure.
Figure 14B:
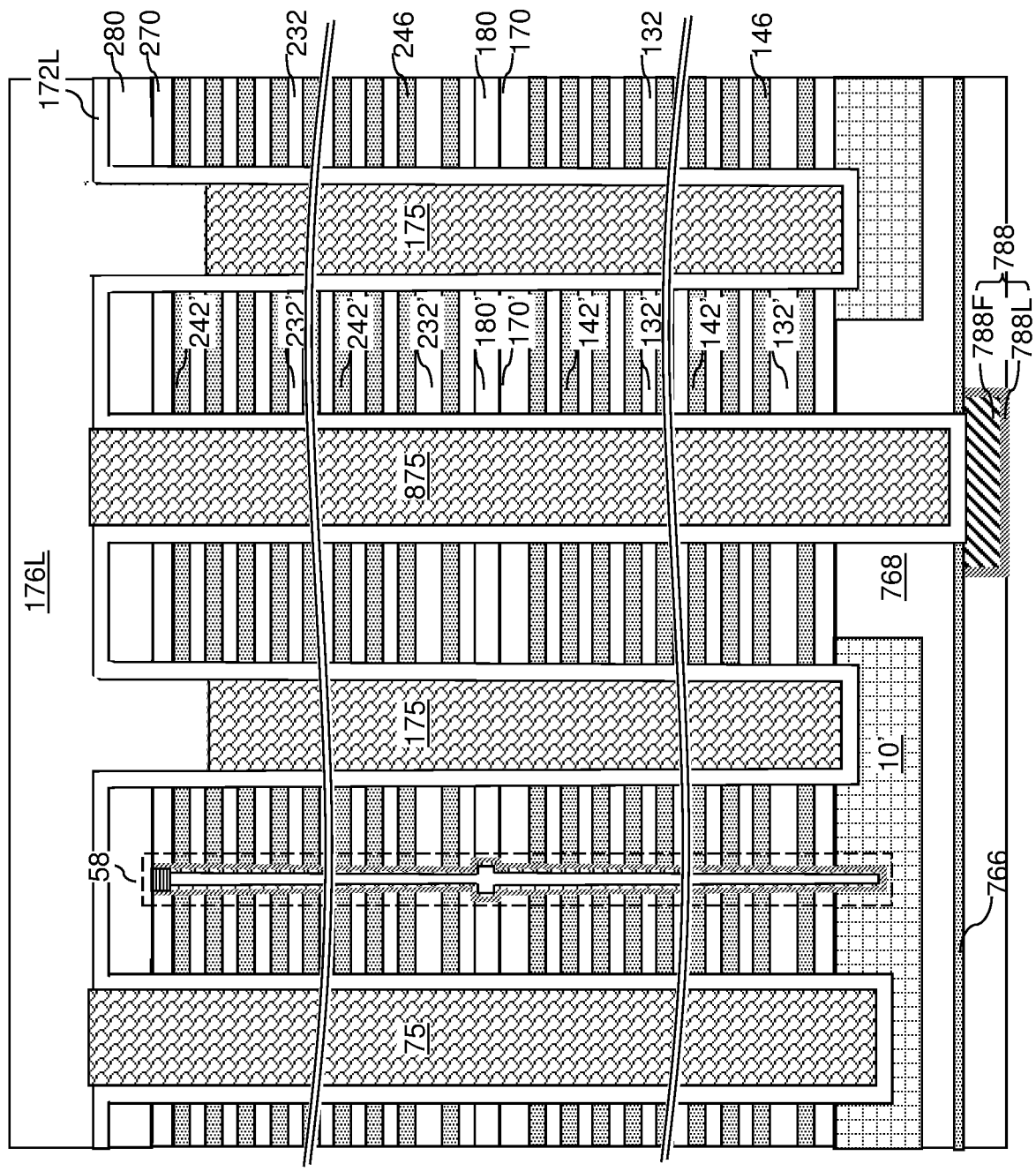
FIG. 14B is another vertical cross-sectional view of the exemplary structure of FIG. 14A.
Figure 14C:
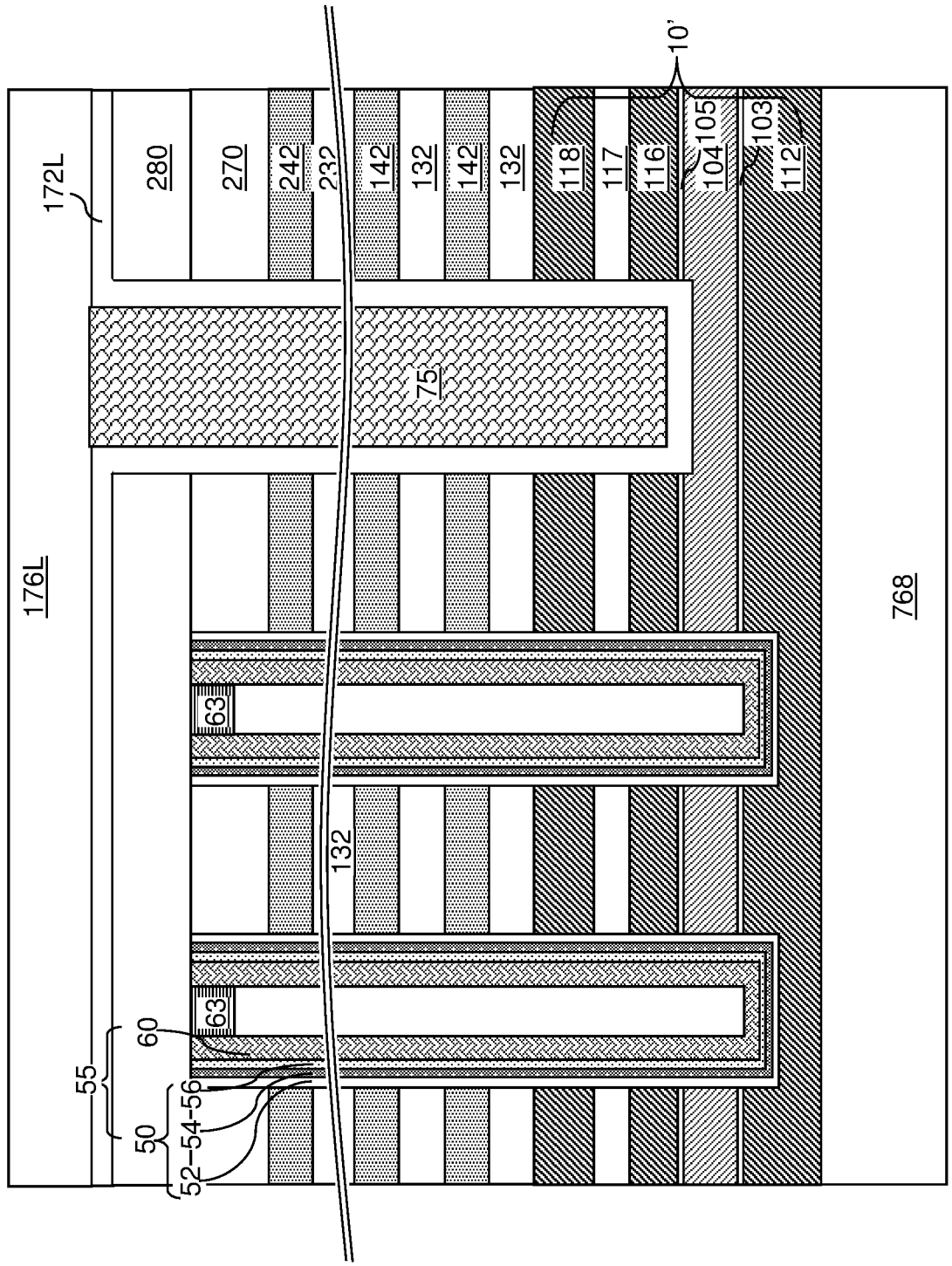
FIG. 14C is yet another vertical cross-sectional view of the exemplary structure of FIGS. 14A and 14B.
Figure 14D:
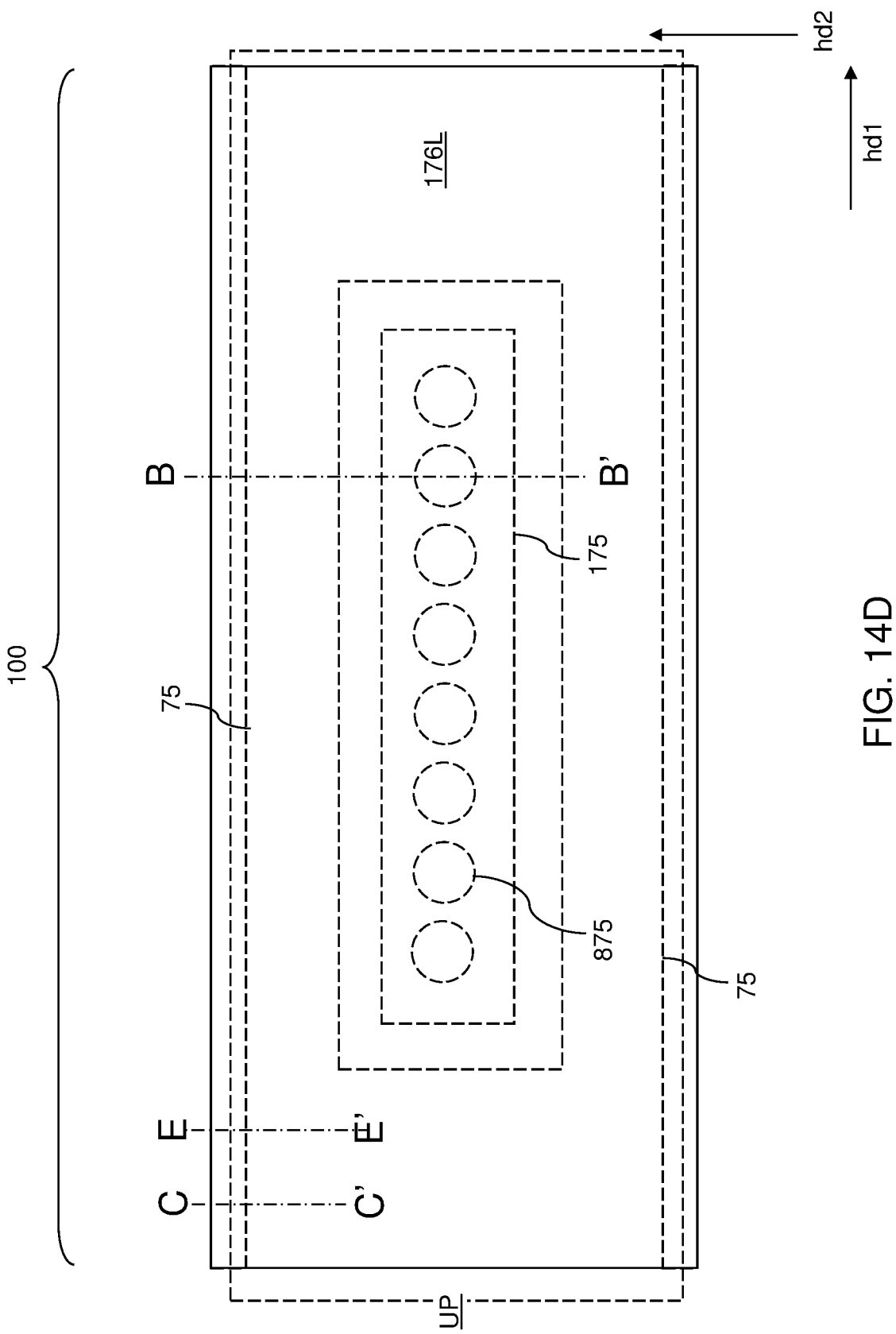
FIG. 14D is a horizontal cross-sectional view along the horizontal plane D-D' of FIG. 14B. The vertical cross-sectional plane B-B' is the plane of the vertical cross-section of FIG. 14B. The vertical cross-sectional plane C-C' is the plane of the vertical cross-section of FIG. 14C.
Figure 14E:
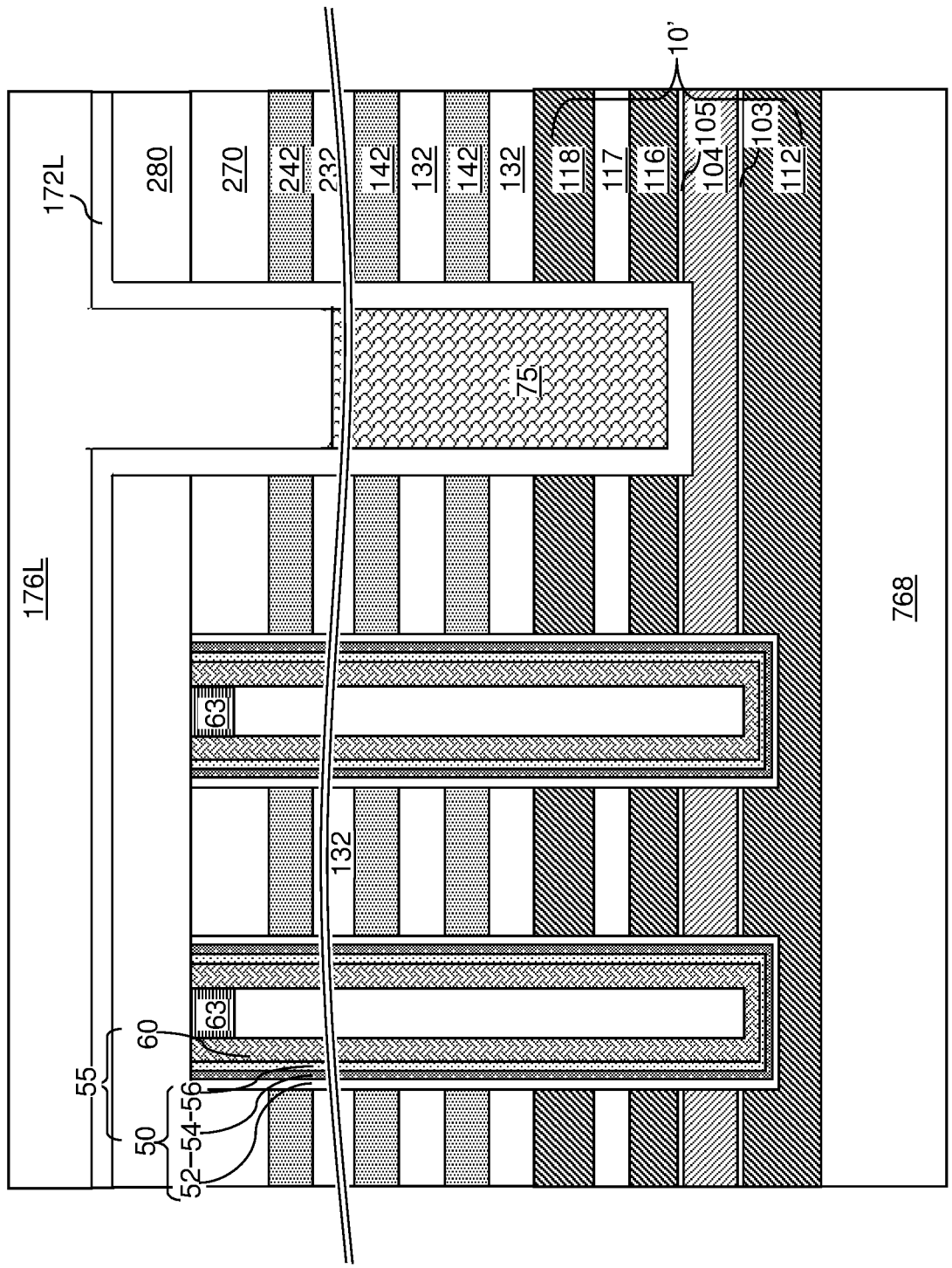
FIG. 14E is a vertical cross-sectional view of the exemplary structure along the vertical plane E-E' of FIG. 14D.
Figure 15A:
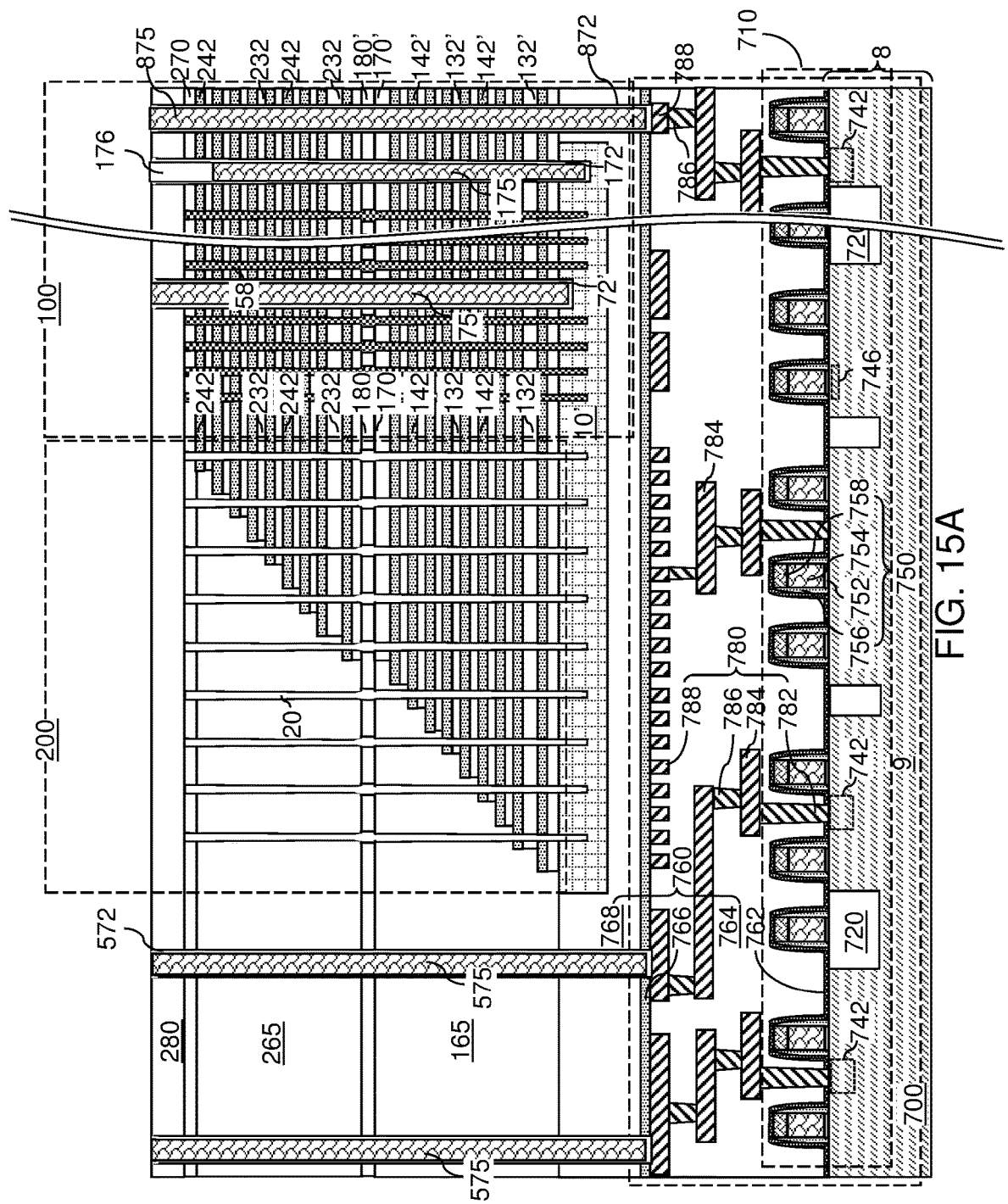
FIG. 15A is a vertical cross-sectional view of the exemplary structure after formation of a capping dielectric structure according to an embodiment of the present disclosure.
Figure 15B:
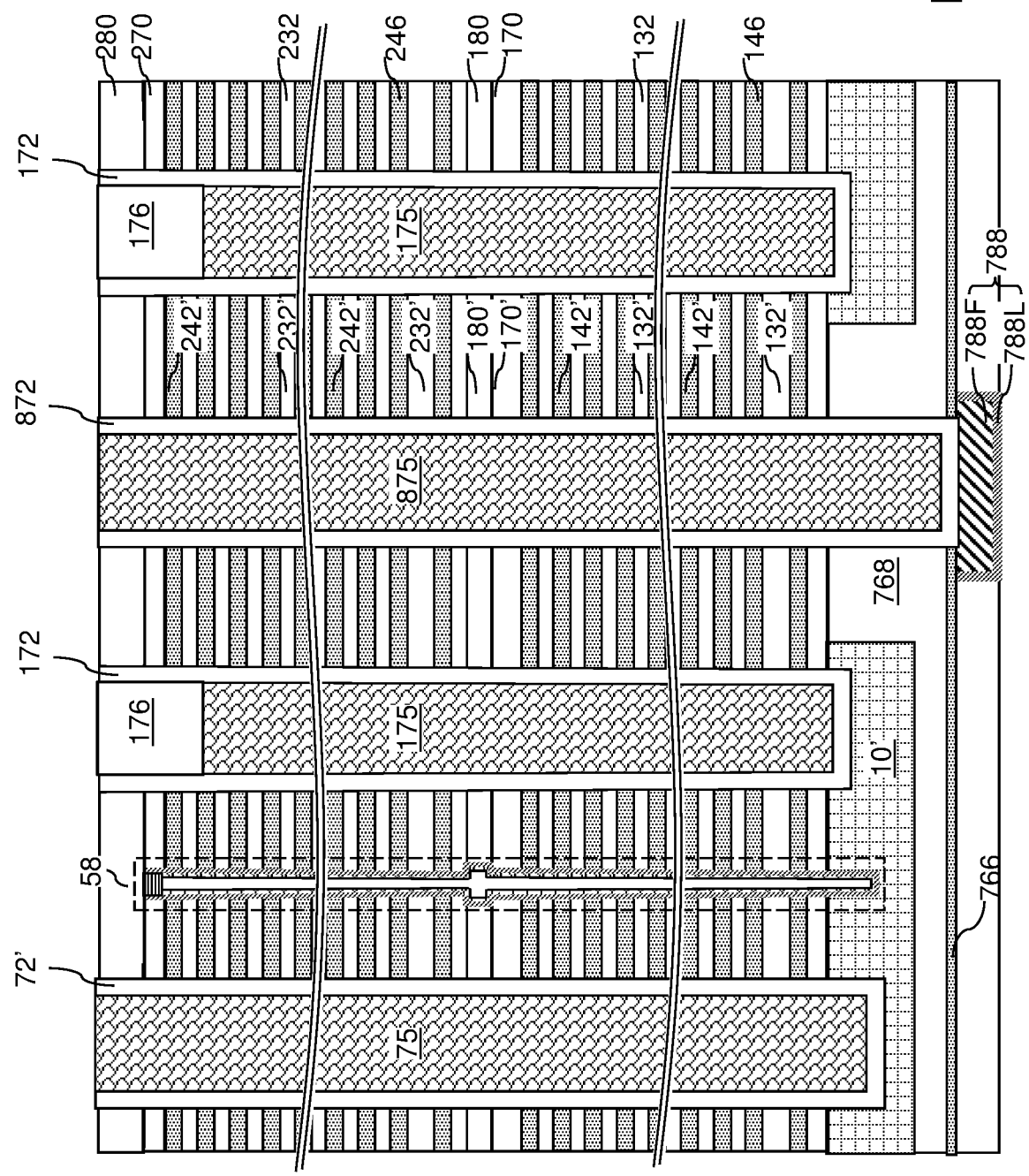
FIG. 15B is another vertical cross-sectional view of the exemplary structure of FIG. 15A.
Figure 15C:
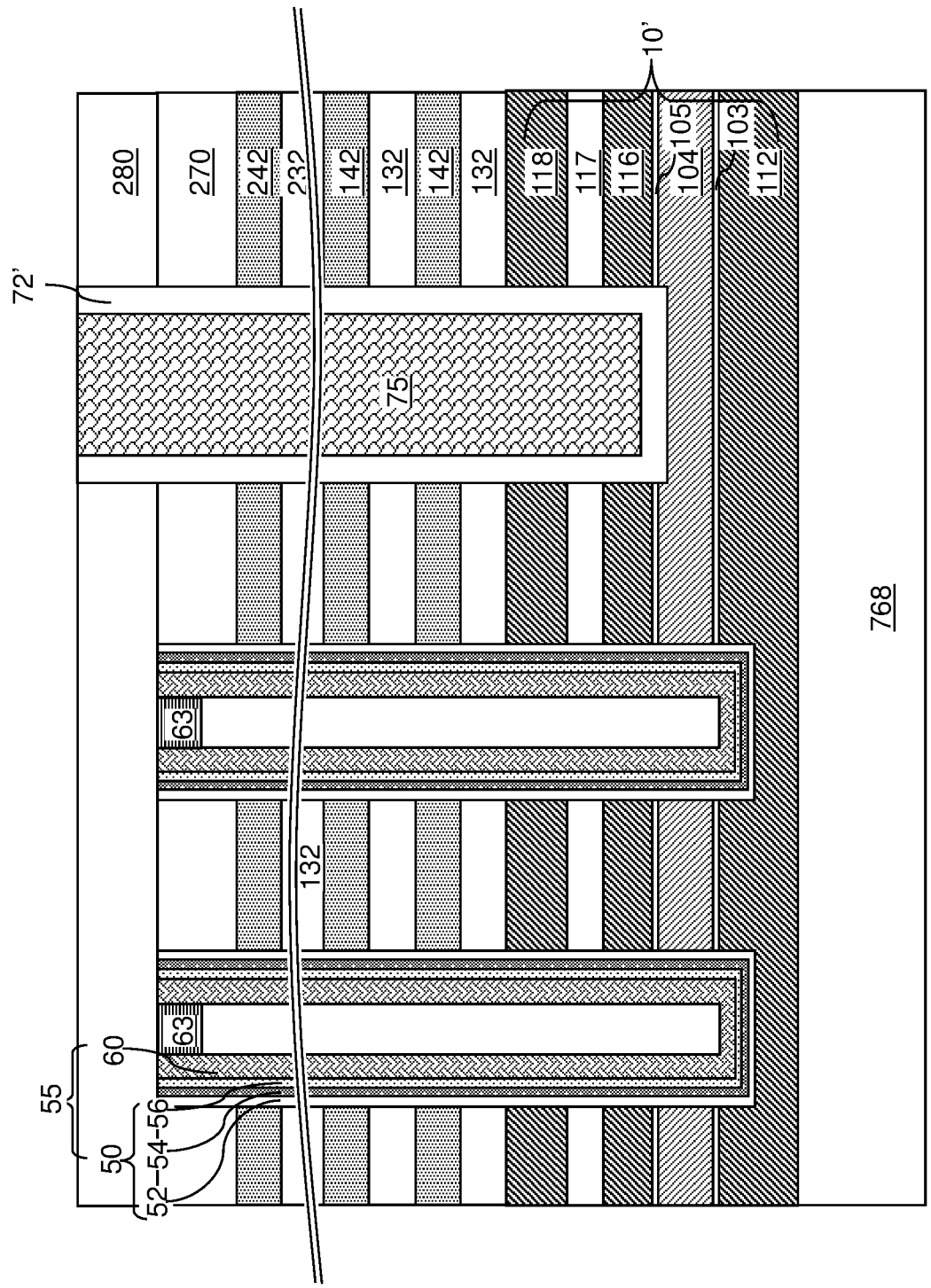
FIG. 15C is yet another vertical cross-sectional view of the exemplary structure of FIGS. 15A and 15B.
Figure 15D:
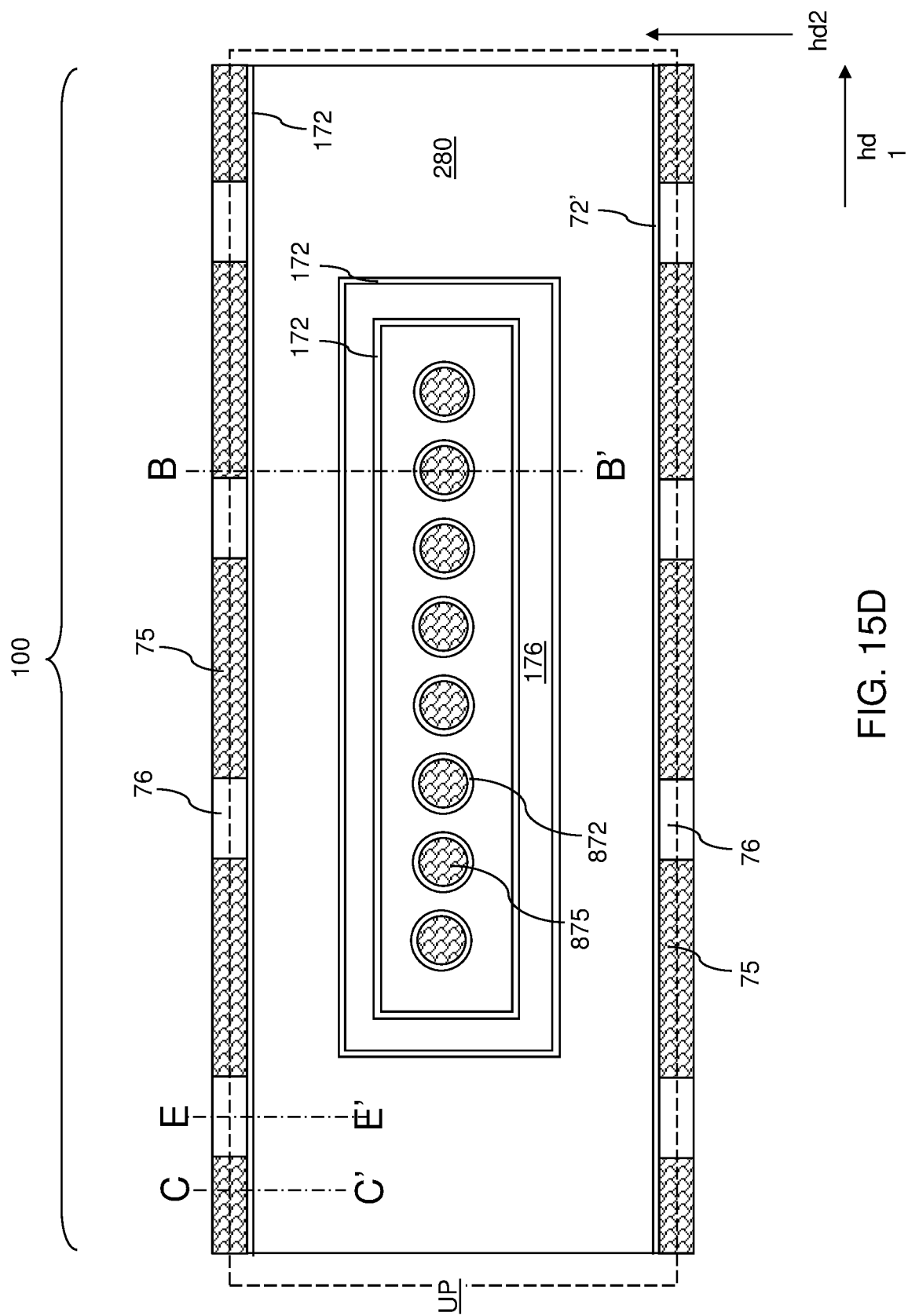
FIG. 15D is a horizontal cross-sectional view along the horizontal plane D-D' of FIG. 15B. The vertical cross-sectional plane B-B' is the plane of the vertical cross-section of FIG. 15B. The vertical cross-sectional plane C-C' is the plane of the vertical cross-section of FIG. 15C.
Figure 15E:
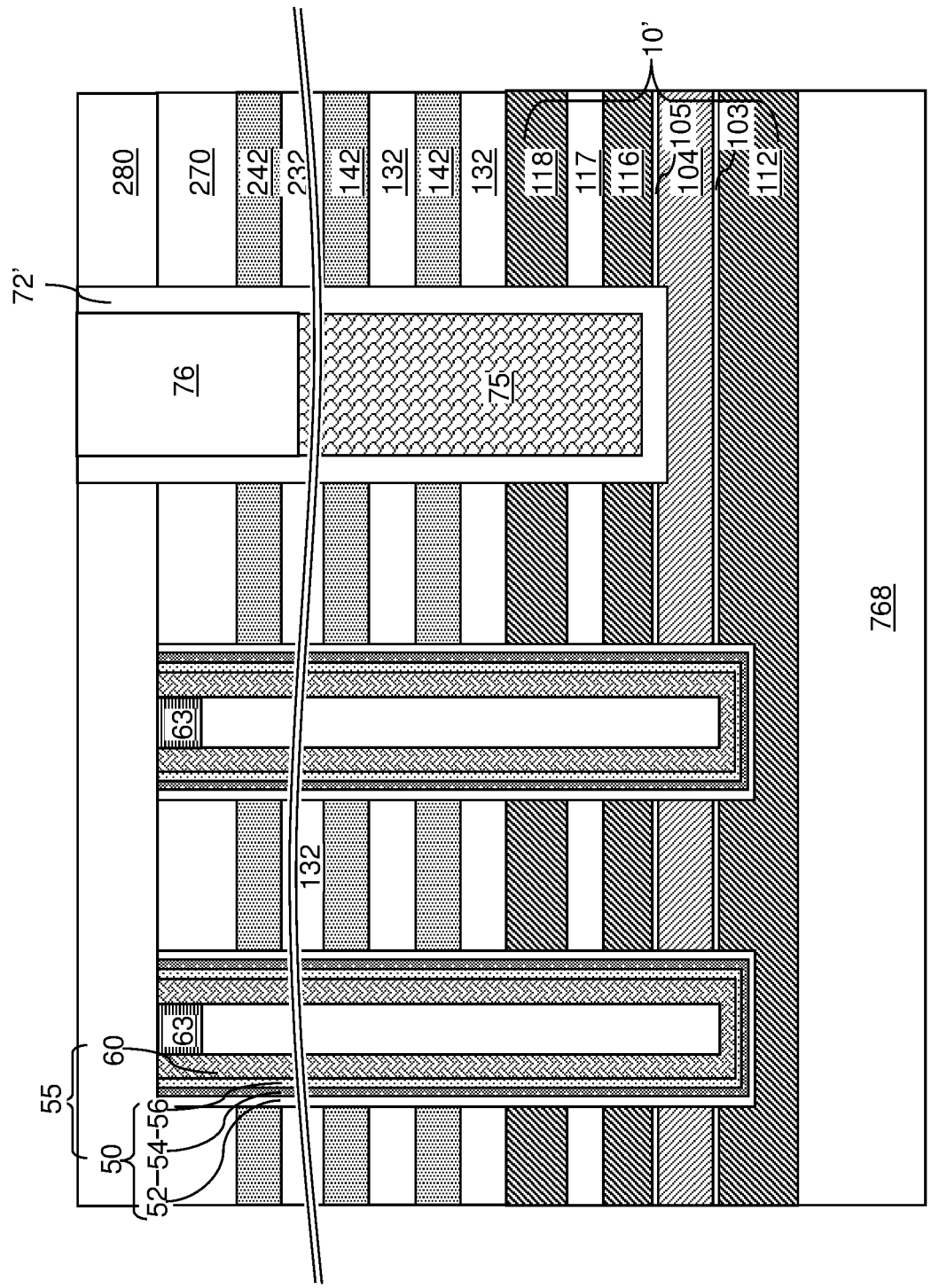
FIG. 15E is a vertical cross-sectional view of the exemplary structure along the vertical plane E-E' of FIG. 15D.
Figure 16A:
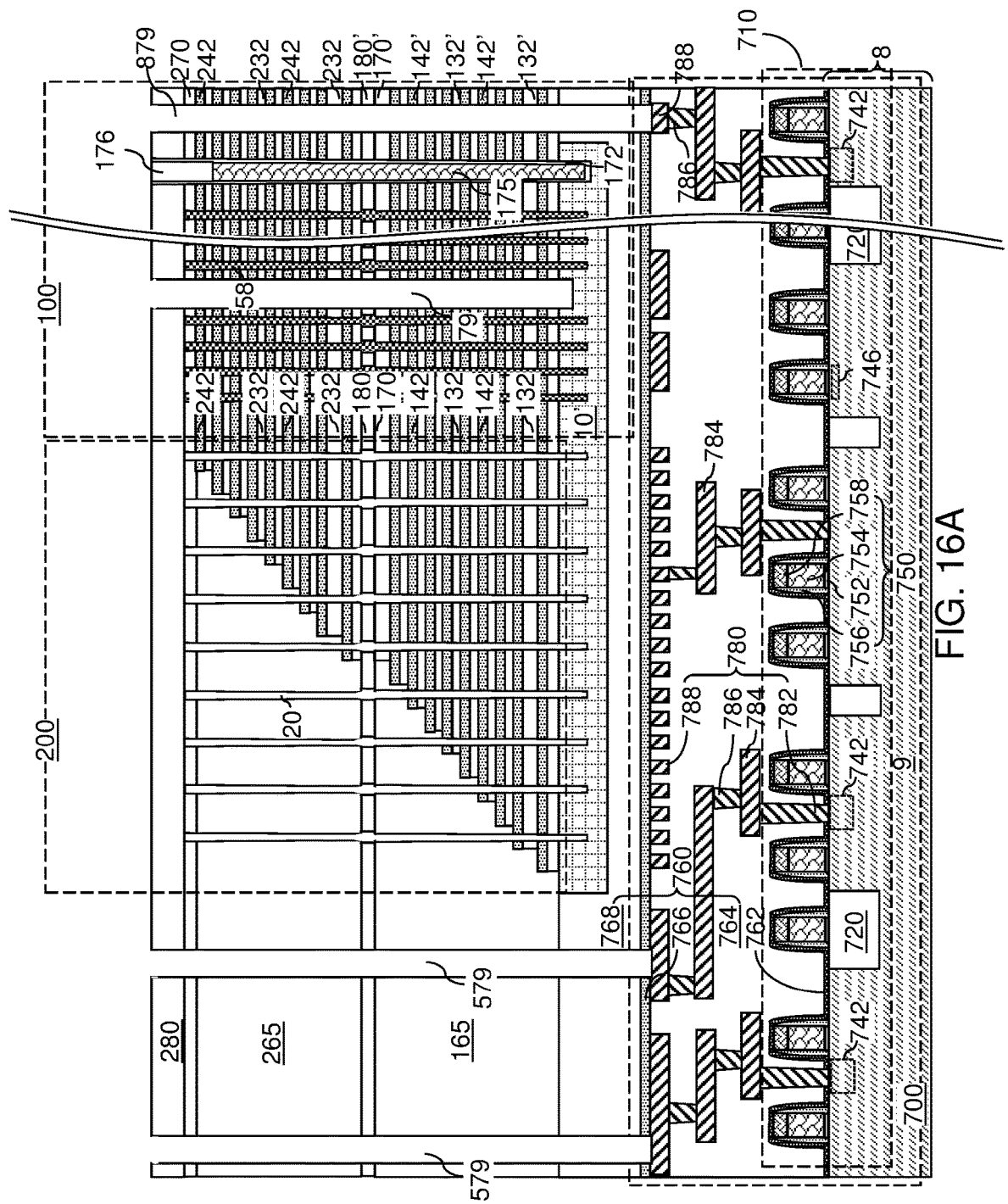
FIG. 16A is a vertical cross-sectional view of the exemplary structure after removal of the fill material from inside the backside trenches and from inside the through-memory-level via cavities according to an embodiment of the present disclosure.
Figure 16B:
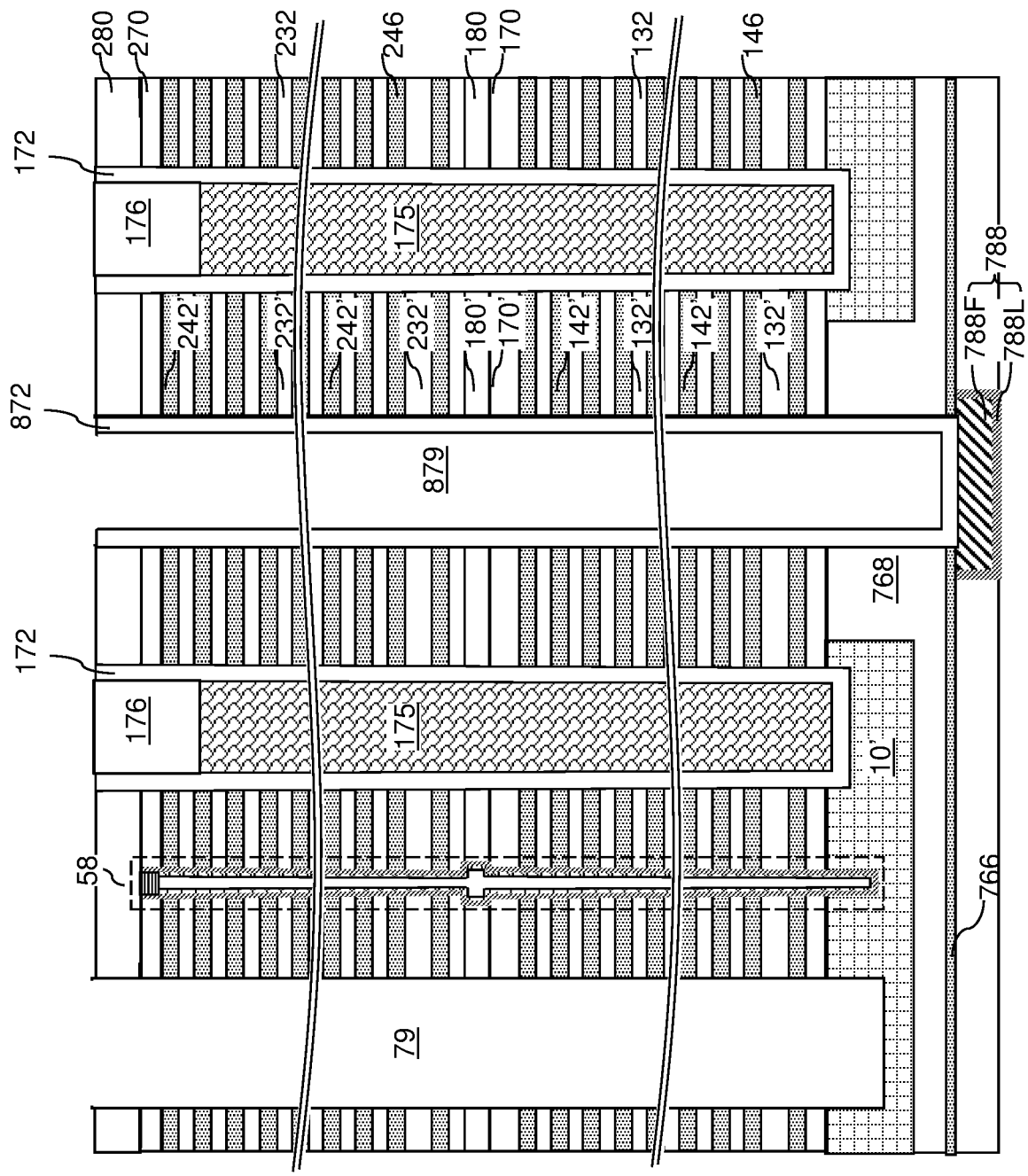
FIG. 16B is another vertical cross-sectional view of the exemplary structure of FIG. 16A.
Figure 16C:
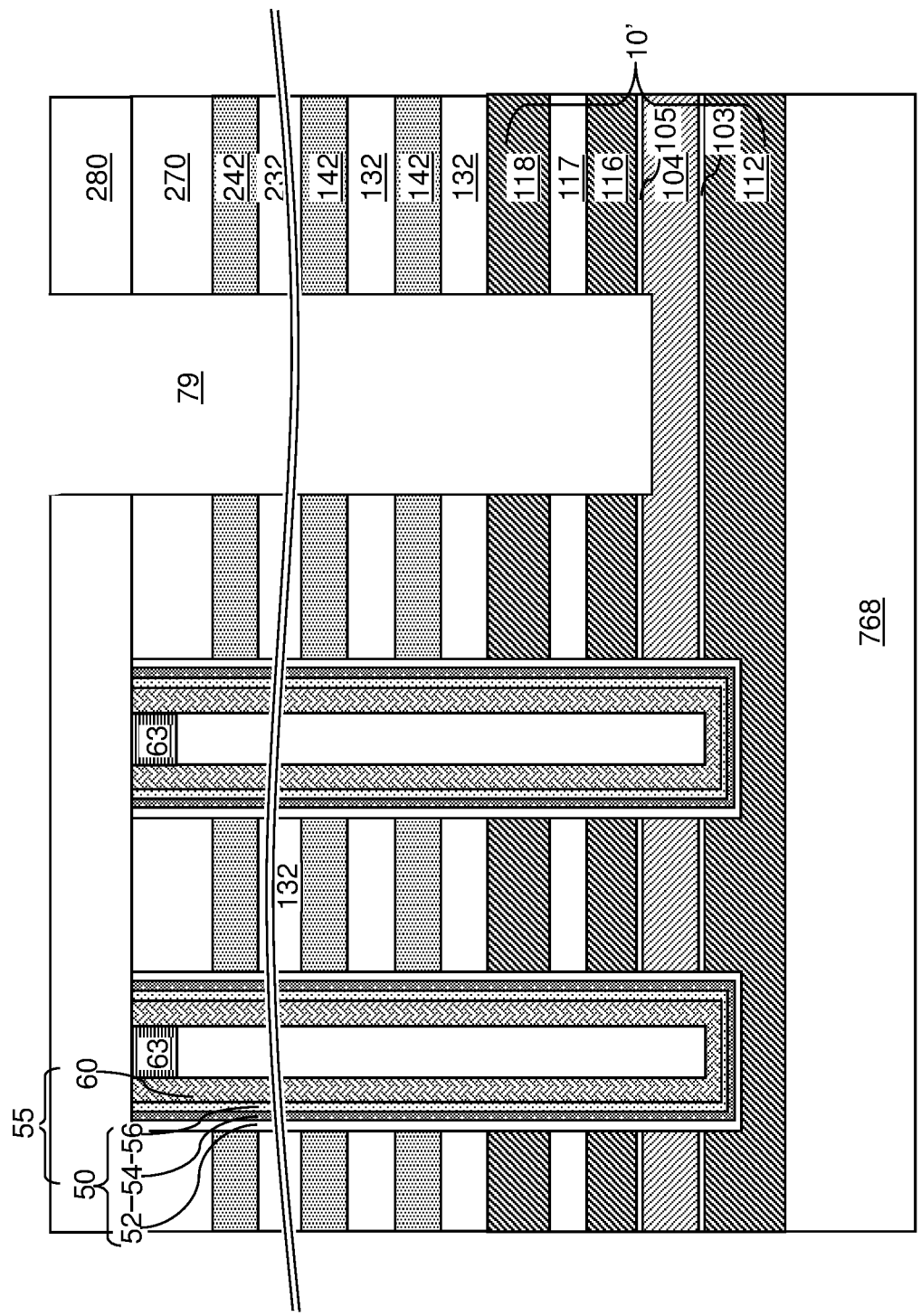
FIG. 16C is yet another vertical cross-sectional view of the exemplary structure of FIGS. 16A and 16B.
Figure 16D:
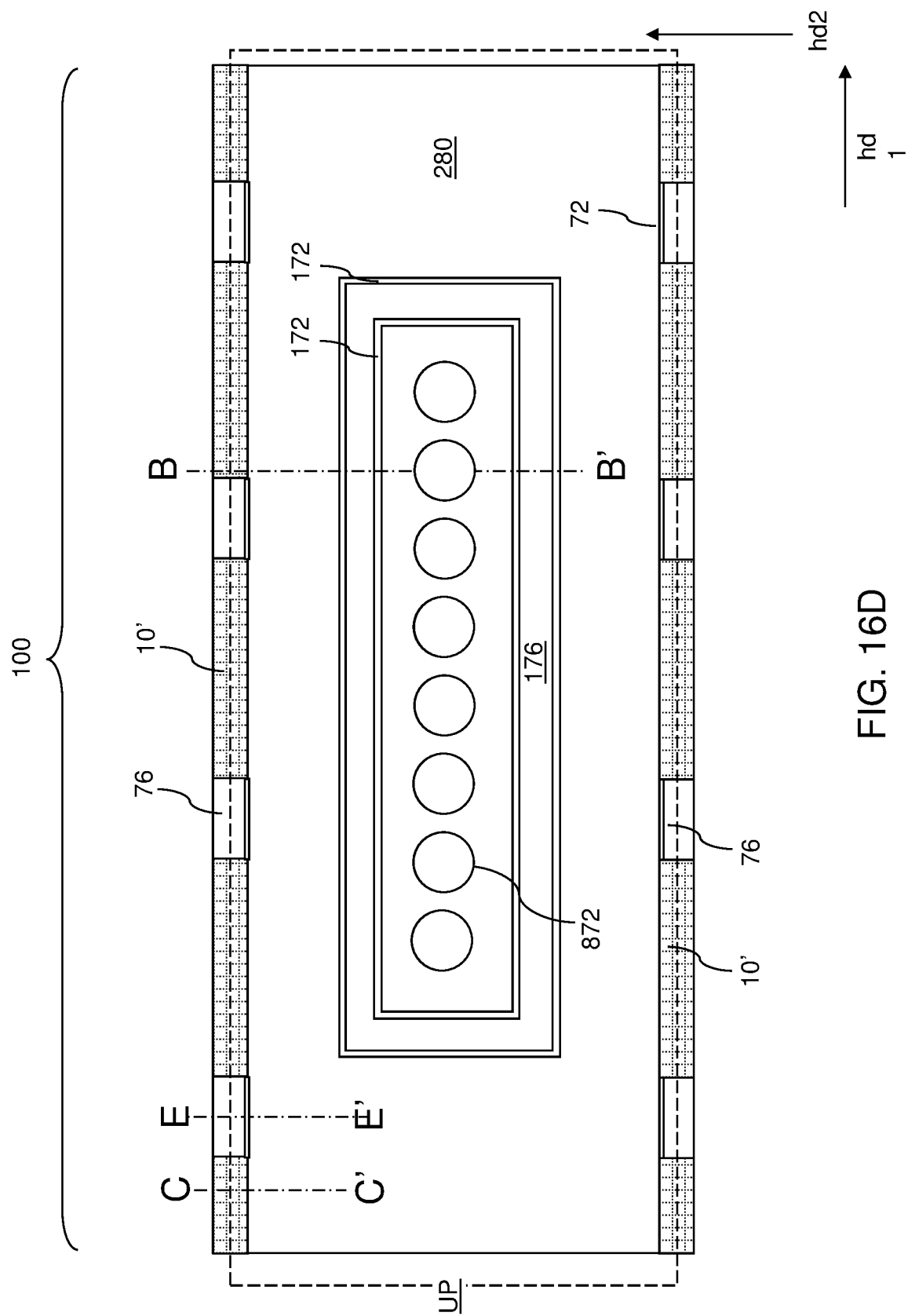
FIG. 16D is a horizontal cross-sectional view along the horizontal plane D-D' of FIG. 16B. The vertical cross-sectional plane B-B' is the plane of the vertical cross-section of FIG. 16B. The vertical cross-sectional plane C-C' is the plane of the vertical cross-section of FIG. 16C.
Figure 16E:
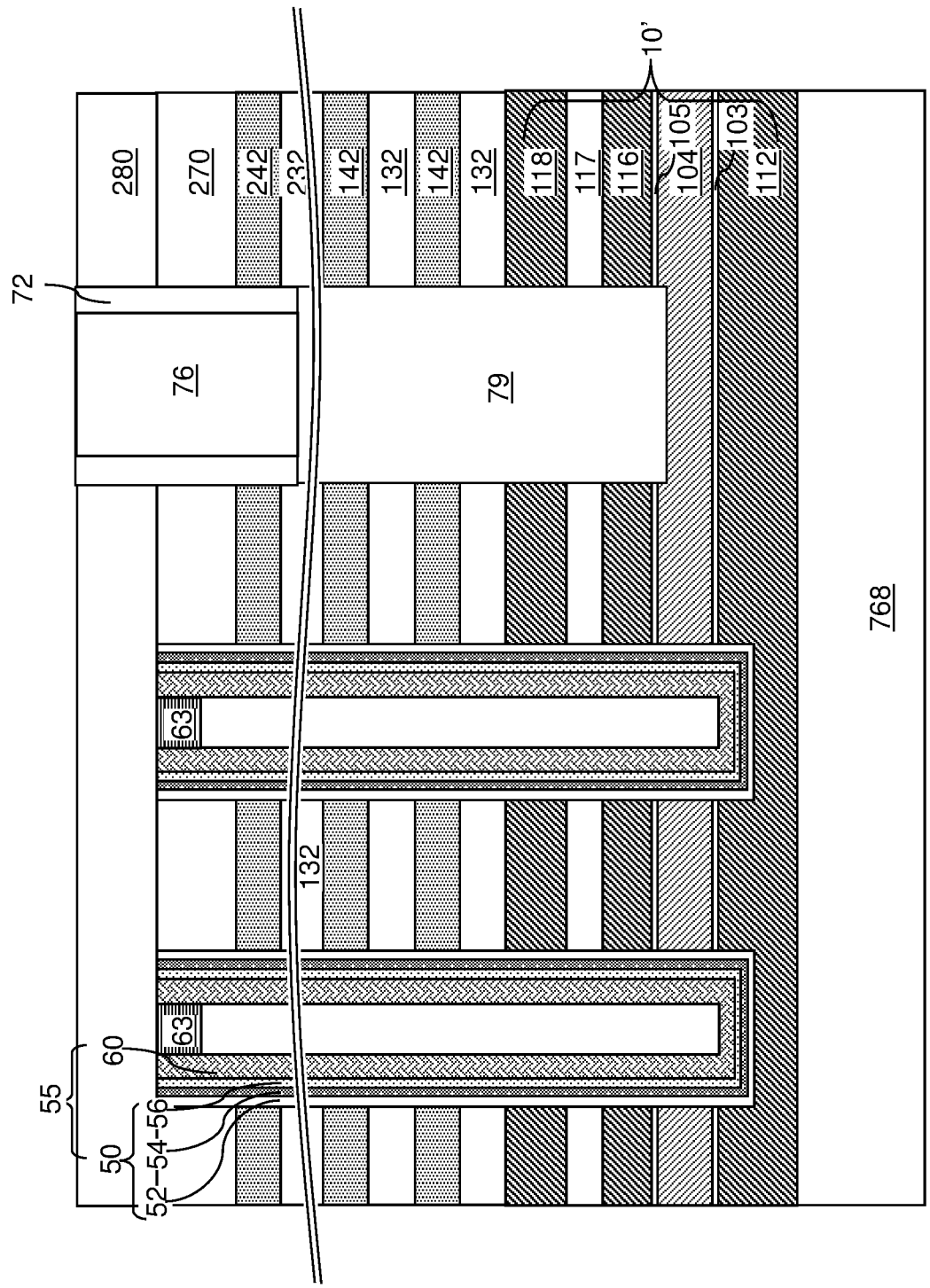
FIG. 16E is a vertical cross-sectional view of the exemplary structure along the vertical plane E-E' of FIG. 16D.

Referring to FIG. 10B, a fill material, which is also referred to as a trench fill material, can be deposited in each of the backside trenches 79, the isolation trenches 179, and the through-memory-level via cavities (879, 579) to form a fill material layer 174L. The fill material comprises a material that may be removed selective to the material of the dielectric trench liner layer 172L. For example, if the dielectric trench liner layer 172L includes silicon oxide, the fill material may include a material that can be anisotropically or isotropically removed selective to silicon oxide. Generally, the fill material may comprise a semiconductor material, an insulating material, or a conductive material. In one embodiment, the fill material can be a material that can be deposited conformally to fill the volumes within the backside trenches 79, the isolation trenches 179, and the through-memory-level via cavities (879, 579) without voids, or with small voids therein.

According to an aspect of the present disclosure, the fill material can include a material having a lower coefficient of thermal expansion (CTE) that a metallic material (such as tungsten) to be subsequently employed to replace the sacrificial material layers. In one embodiment, the fill material can include a semiconductor material such as amorphous silicon, polysilicon, a silicon-germanium alloy, or a compound semiconductor material such as a III-V compound semiconductor material. The thickness of the deposited fill material can be selected such that the backside trenches 79, the isolation trenches 179, and the through-memory-level via cavities (879, 579) can be filled without voids, or with small size voids that do not significantly affect the mechanical strength of the fill material. The fill material layer 174L may have a planar top surface.

Referring to FIGS. 11A-11E, a photoresist layer 67 can be applied over the horizontal top surface of the fill material layer 174L. According to an aspect of the present disclosure, the photoresist layer 67 can be lithographically patterned to form openings within areas that overlie the isolation trenches 179. In one embodiment, an opening in the photoresist layer 67 can be formed above each of the isolation trenches 179 such that the area of the opening is greater than the area of a respective underlying isolation trench 179. In case the isolation trenches 179 comprise moat trenches, the openings in the photoresist layer 67 that overlie the isolation trenches 179 may comprise moat-shaped openings having a greater lateral distance between an inner periphery and an outer periphery. In this case, an inner periphery of an isolation trench 179 can be located outside an inner periphery of a moat-shaped opening in the photoresist layer 67, and an outer periphery of the isolation trench 179 can be located inside an outer periphery of the moat-shaped opening in the photoresist layer 67 in a plan view (such as a see-through top-down view). A portion of a top surface of the fill material layer 174L can be physically exposed underneath each opening in the photoresist layer 67. In case the isolation trenches 179 are formed as pairs of line trenches that define a respective area including the first through-memory-level via cavities, each opening in the photoresist layer 67 that overlies a respective one of the line trenches may have a greater area than the respective one of the line trenches. The area of the opening in the photoresist layer 67 may include the entirety of the area of the underlying line trench that is employed as an isolation trench 179.

According to an aspect of the present disclosure, a row of discrete opening can be formed over each of the backside trenches 79. The row of discrete openings may include a set of rectangular openings that are arranged along the first horizontal direction (e.g., word line direction) hd1 and having a greater width along the second horizontal direction (e.g., bit line direction) hd2 than the width of a respective underlying backside trench 79. The discrete openings within each row of discrete openings can be laterally spaced apart along the first horizontal direction hd1 with an inter-opening spacing that is greater than the width of the backside trench 79 along the second horizontal direction hd2. A portion of a top surface of the fill material layer 174L can be physically exposed underneath each opening in the photoresist layer 67 that overlies the backside trenches 79.

Referring to FIGS. 12A-12E, an etch process can be performed to recess portions of the fill material layer 174L that are not masked by the photoresist layer 67. The etch process may comprise an anisotropic etch process such as a reactive ion etch process, or may comprise an isotropic etch process such as a wet etch process. Unmasked portions of the fill material layer 174L are removed by the etch process underneath the openings in the photoresist layer 67. In one embodiment, the fill material layer 174L comprises an undoped or doped semiconductor material such as polysilicon or amorphous silicon, and the etch process may comprise a wet etch process employing hot trimethyl-2 hydroxyethyl ammonium hydroxide ("hot TMY") or tetramethyl ammonium hydroxide (TMAH), or may comprise a reactive ion etch process employing an etch chemistry including $SF_6$, $C_4F_8$, $CF_4$, $CHF_3$, $C_4F$, and/or argon. In one embodiment, the duration of the etch process can be controlled such that the vertical distance between the horizontal plane including the top surface of the fill material layer 174L and recessed surfaces of the fill material layer 174L may be greater than the thickness of the horizontally-extending portion of the fill material layer 174L that overlies the contact-level dielectric layer 280. The photoresist layer 67 may be subsequently removed, for example, by ashing.

Referring to FIGS. 13A-13E, a recess etch process can be performed to recess the fill material layer 174L. The duration of the recess etch process can be selected such that the entirety of the horizontally-extending portion of the fill material layer 174L that overlies the horizontal plane including the topmost surface of the dielectric trench liner layer 172L can be removed. In one embodiment, the duration of the recess etch process may be selected such that remaining portions of the fill material layer 174L in the backside trenches 79 and the through-memory-level via cavities (879, 579) have top surfaces that are substantially coplanar with the top surface of the dielectric trench liner layer 172L. In one embodiment, the top surfaces of the remaining portions of the fill material layer 174L in the backside trenches 79 and the through-memory-level via cavities (879, 579) may have top surfaces located at, above, or about, the top surface of the contact-level dielectric layer 280.

The recess etch process may comprise an isotropic etch process such as a wet etch process, or an anisotropic etch process such as a reactive ion etch process. Any of the etch processes employed at the processing steps of FIGS. 12A-12E may be employed with a change in the duration of the etch process to provide the recess etch process at the processing steps of FIGS. 13A-13E.

The recessed surfaces of the fill material layer 174L as formed at the processing steps of FIGS. 12A-12E can be further recessed by the recess etch process such that each remaining portion of the fill material layer 174L located inside the isolation trenches 179 has a respective top surface located below the horizontal plane including the top surface of the contact-level dielectric layer 280. Each remaining portion of the fill material layer 174L that remains in the isolation trenches 179 constitute a trench fill material portion 175. In one embodiment, the vertical distance between the horizontal plane including the top surface of the contact-level dielectric layer 280 and the top surfaces of the trench fill material portions 175 can be in a range from 20 nm to 800 nm, such as from 60 nm to 400 nm, although lesser and greater vertical distances may also be employed.

Each remaining portion of the fill material layer 174L that remains in the backside trenches 79 constitutes a sacrificial backside trench fill structure 75. Each remaining portion of the fill material layer 174L that remains in a first through-memory-level via cavity 879 constitutes a first sacrificial via fill structure 875. Each remaining portion of the fill material layer 174L that remains in a second through-memory-level via cavity 579 constitutes a second sacrificial via fill structure 575.

According to an embodiment of the present disclosure, a recess cavity 171 can be present above each trench fill material portion 175 by removing a portion of the fill material from an upper portion of each isolation trench 179 without removing the fill material from inside the through-memory-level via cavities (879, 579). Each remaining portion of the fill material in lower portions of the isolation trenches 179 that underlie the recess cavities 171 comprises a trench fill material portion 175. According to an embodiment of the present disclosure shown in FIG. 13E, recess regions 71 can be formed in an upper portion of each sacrificial backside trench fill structure 75. In one embodiment, a row of discrete recess regions 71 can be formed in an upper portion of each sacrificial backside trench fill structure 75 by vertically recessing portions of the fill material that are deposited in the backside trenches 79. Each of the recess regions 71 comprises a bottom surface that is a recessed surface of a respective portion 75 of the fill material. The depth of the recess cavities 171 and the depth of the recess regions 71, as measured from a horizontal plane including a top surface of the contact-level dielectric layer 280 may be the same, and may be in a range from 20 nm to 800 nm, such as from 60 nm to 400 nm, although lesser and greater depths may also be employed.

Referring to FIGS. 14A-14E, a dielectric fill material can be deposited in the recess cavities 171 and the recess regions 71 and over the topmost surface of the dielectric trench liner layer 172L. The dielectric fill material comprises a dielectric material that is different from the material of the sacrificial material layers (142, 242). In one embodiment, the dielectric fill material may comprise undoped silicate glass or a doped silicate glass. The dielectric fill material may be deposited by a conformal deposition process such as a chemical vapor deposition process. The deposited dielectric fill material can form a dielectric fill material layer 176L comprising a horizontally-extending portion that overlies the contact-level dielectric layer 280 and the horizontally-extending portion of the dielectric trench liner layer 172L, and a plurality of downward protruding portions that fill a respective one of the recess cavities 171 and the recess regions 71. The horizontally-extending portion of the dielectric fill material layer 176L may comprise a planar top surface.

Referring to FIGS. 15A-15E, the dielectric fill material of the dielectric fill material layer 176L can be removed from outside the recess cavities 171 and the recess regions 71. For example, a recess etch process can be performed to remove the horizontally-extending portion of the dielectric fill material layer 176. In one embodiment, the horizontally-extending portion of the dielectric trench liner layer 172L that overlies the top surface of the contact-level dielectric layer 280 may be collaterally removed by the recess etch process. The recess etch process may comprise an isotropic etch process or an anisotropic etch process. In one embodiment, the dielectric fill material layer 176L may comprise undoped silicate glass or a doped silicate glass, and the recess etch process may comprise a wet etch process employing dilute hydrofluoric acid or a reactive ion etch process that etches the silicon oxide material of the dielectric fill material layer 176L. The duration of the recess etch process may be selected such that the horizontally-extending portion of the dielectric fill material layer 176L and the horizontally-extending portion of the dielectric trench liner layer 172L are removed.

Each remaining portion of the dielectric fill material filling a recess cavity 171 comprises a capping dielectric structure 176. In one embodiment, each capping dielectric structure 176 comprises a planar top surface located within a first horizontal plane located within the horizontal plane including the top surface of the contact-level dielectric layer 280 and overlying a topmost surface of the alternating stack {(132, 142), (232, 242)}, and a bottom surface located below a second horizontal plane including the topmost surface of the alternating stack {(132, 142), (232, 242)} and contacting a top surface of a trench fill material portion 175.

Each remaining portion of the dielectric fill material filling a recess region 71 comprises a dielectric bridge structure 76. Thus, the dielectric bridge structures 76 comprising a same material as the capping dielectric structures 176 is located in the recess regions 71. In one embodiment, each dielectric bridge structure 76 comprises a planar top surface located within a first horizontal plane located within the horizontal plane including the top surface of the contact-level dielectric layer 280 and overlying a topmost surface of the alternating stack {(132, 142), (232, 242)}, and a bottom surface located below a second horizontal plane including the topmost surface of the alternating stack {(132, 142), (232, 242)} and contacting a recessed surface of sacrificial backside trench fill structure 75.

Each remaining portion of the dielectric trench liner layer 172L that remains in an isolation trench 179 is herein referred to as a dielectric trench liner 172. Each remaining portion of the dielectric trench liner layer 172L that remains in an isolation trench 179 is herein referred to as a backside trench liner 72'. Each remaining portion of the dielectric trench liner layer 172L that remains in a first through-memory-level via cavity 879 is herein referred to as a first dielectric via liner 872. Each remaining portion of the dielectric trench liner layer 172L that remains in a second through-memory-level via cavity 579 is herein referred to as a second dielectric via liner 572.

The combination of all structures filling an isolation trench 179 constitutes an isolation trench fill structure (172, 175, 176). Each isolation trench fill structure (172, 175, 176) a trench fill material portion 175, a capping dielectric structure 176, and a dielectric trench liner 172 laterally surrounding the trench fill material portion 175 and the capping dielectric structure 176.

In one embodiment, each isolation trench fill structure (172, 175, 176) may comprise a first straight sidewall contacting the alternating stack of the insulating layers (132, 232) and the sacrificial material layers (142, 242) and a second straight sidewall contacting a vertically alternating sequence of insulating plates (132', 232') and dielectric material plates (142', 242'). Each of the first straight sidewall and the second straight sidewall vertically extends from a horizontal plane overlying a topmost surface of the alternating stack {(132, 142), (232, 242)} (such as a horizontal plane including the top surface of the contact-level dielectric layer 280) into an upper region of the in-process source-level material layers 10'. In one embodiment, the first straight sidewall and the second straight sidewall comprise surfaces of the dielectric trench liner 172. In this case, the in-process source-level material layers 10' are spaced from the trench fill material portion 175 by the dielectric trench liner 172.

In one embodiment, the isolation trench fill structure (172, 175, 176) has a tubular (i.e. moat-shaped) configuration, contacts an entirety of outer sidewalls of a vertically alternating sequence {(132', 142'), (232', 242')}, and contacts each layer within the alternating stack {(132, 142), (232, 242)}. Generally, a vertically alternating sequence of insulating plates (132', 232') and dielectric material plates (142', 242') can be laterally surrounded by the alternating stack {(132, 142), (232, 242)}. An isolation trench fill structure (172, 175, 176) can be interposed between the alternating stack {(132, 142), (232, 242)} and the vertically alternating sequence {(132', 142'), (232', 242')}. Alternatively, a pair of line shaped isolation trench fill structures (172, 175, 176) may define a region in which first through-memory-level via cavities 879 are provided.

According to an aspect of the present disclosure, a row of dielectric bridge structures 76 may be embedded within an upper portion of each backside trench 79. A top portion of each sacrificial backside trench fill structure 75 may be castellated (i.e., battlement-shaped), and can comprise protruding portions located between neighboring pairs of dielectric bridge structures 76 in a row of dielectric bridge structures 76, and recessed portions located below the respective dielectric bridge structures 76. In one embodiment, each dielectric bridge structure 76 within each row of dielectric bridge structures 76 comprise a bottom surface contacting a top horizontal surface of a sacrificial backside trench fill structure 75, and a pair of widthwise sidewalls that are perpendicular to a lengthwise direction of the backside trench 79 and contacting sidewalls of the sacrificial backside trench fill structure 75. Each dielectric bridge structure 76 within the row of dielectric bridge structures 76 comprises a pair of lengthwise sidewalls that contact a respective backside trench liner 72'.

Referring to FIGS. 16A-16E, the fill material of the sacrificial backside trench fill structures 75, the first sacrificial via fill structures 875, and the second sacrificial via fill structures 575 can be removed by performing a selective etch process that etches the fill material selective to the materials of the contact-level dielectric layer 280, the backside trench liners 72', the dielectric via liners (872, 572), and the capping dielectric structures 176. The capping dielectric structure 176 blocks the etchant of the selective etch process from accessing the trench fill material portions 175. Thus, the trench fill material portions 175 are not removed by the selective etch process.

The fill material can be removed from inside each of the backside trenches 79 and the through-memory-level via cavities (879, 579). The selective etch process may comprise an isotropic etch process. In an illustrative example, the fill material of the sacrificial backside trench fill structures 75, the first sacrificial via fill structures 875, and the second sacrificial via fill structures 575 may comprise a semiconductor material such as amorphous silicon, polysilicon, or a silicon-germanium alloy, the selective etch process may comprise a wet etch process employing hot trimethyl-2 hydroxyethyl ammonium hydroxide ("hot TMY") or tetramethyl ammonium hydroxide (TMAH). The portions of the fill material that are deposited in the backside trenches 79 (i.e., the sacrificial backside trench fill structures 75) can be removed without removing the dielectric bridge structures 76.

Optionally, an isotropic etch process may be subsequently performed to remove the dielectric via liners 572 and portions of the backside trench liners 72' that are not masked by the dielectric bridge structures 76. For example, if the dielectric via liners 572 and portions of the backside trench liners 72' comprise silicon oxide, a wet etch process employing dilute hydrofluoric acid may be performed to remove the dielectric via liners 572 and unmasked portions of the backside trench liners 72'. Each remaining portion of the backside trench liners 72' constitutes a dielectric bridge liner 72, which contacts a lengthwise sidewall of a respective one of the dielectric bridge structures 76. The dielectric via liners 872 located in the through-memory-level via cavities 879 may be retained by temporarily masking the through-memory-level via cavities 879 prior to etching of the dielectric via liners 572 and portions of the backside trench liners 72'.

In an alternative embodiment, an anisotropic etch process may be performed to remove bottom portions of the dielectric via liners (872, 572) and the backside trench liners 72'. A top surface of the source-level sacrificial layer 104 can be physically exposed after the processing steps of FIGS. 16A-16E.

Figure 17A:
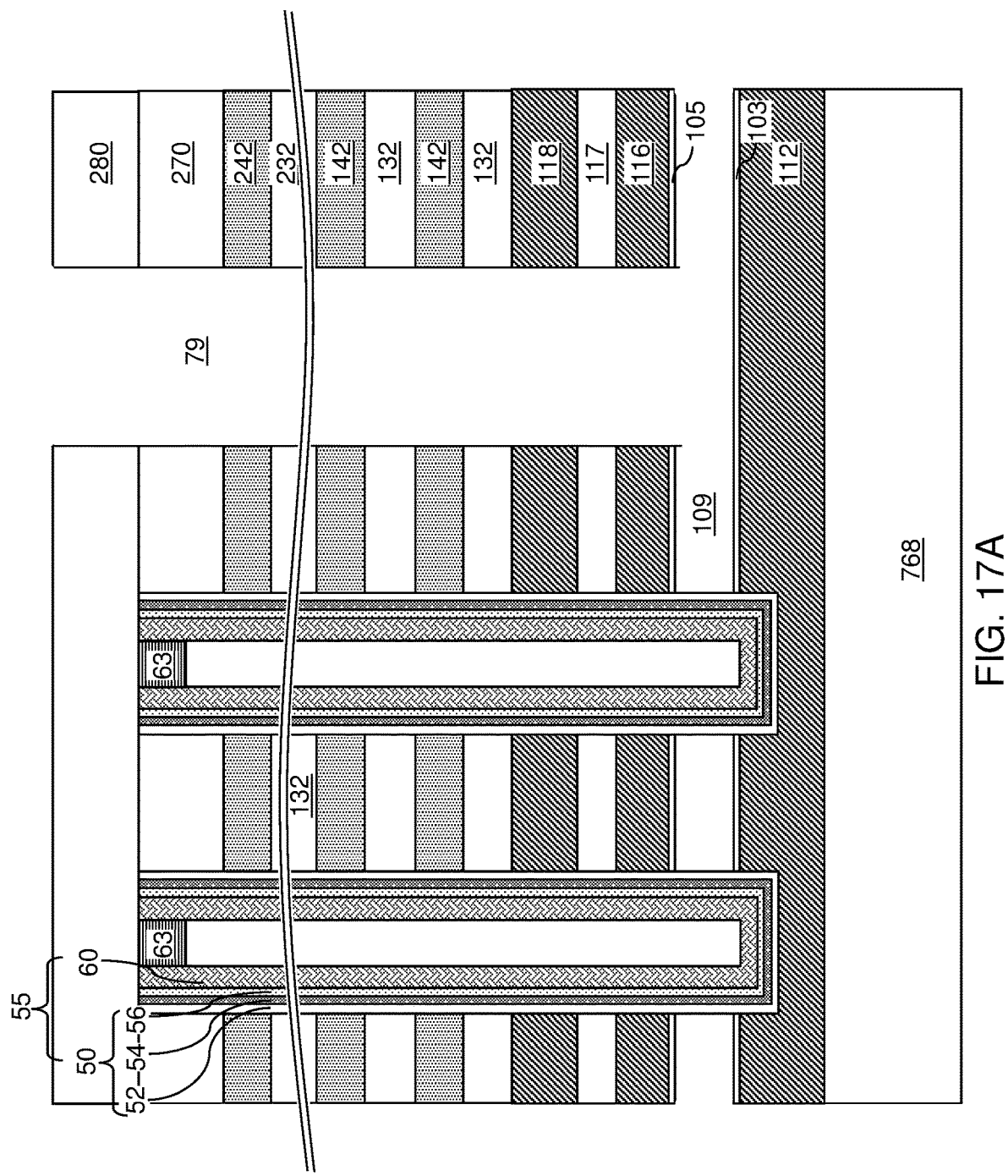
FIGS. 17A-17C illustrate sequential vertical cross-sectional views of memory opening fill structures and a backside trench during formation of source-level material layers according to an embodiment of the present disclosure.
Figure 17B:
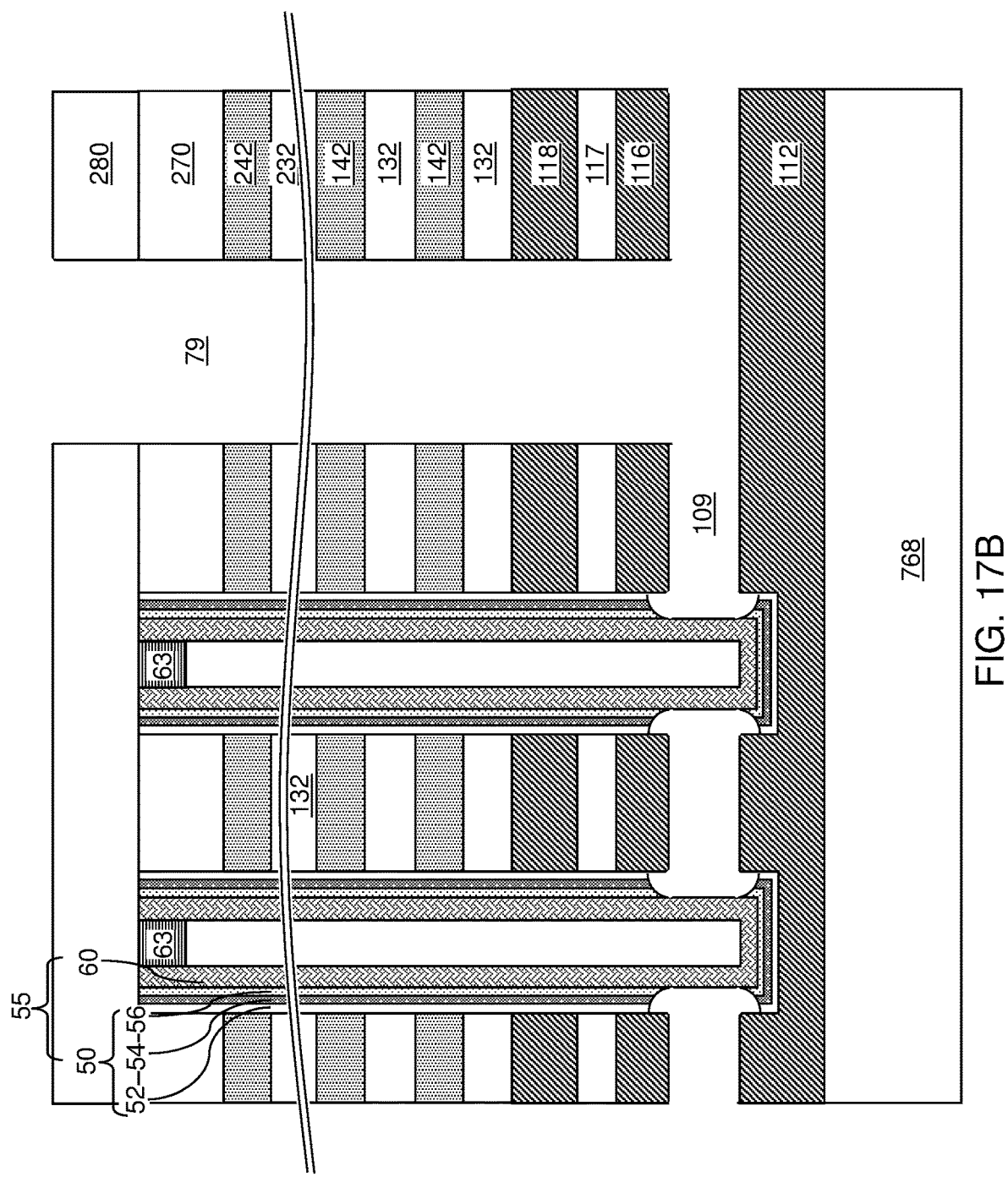
Figure 17C:
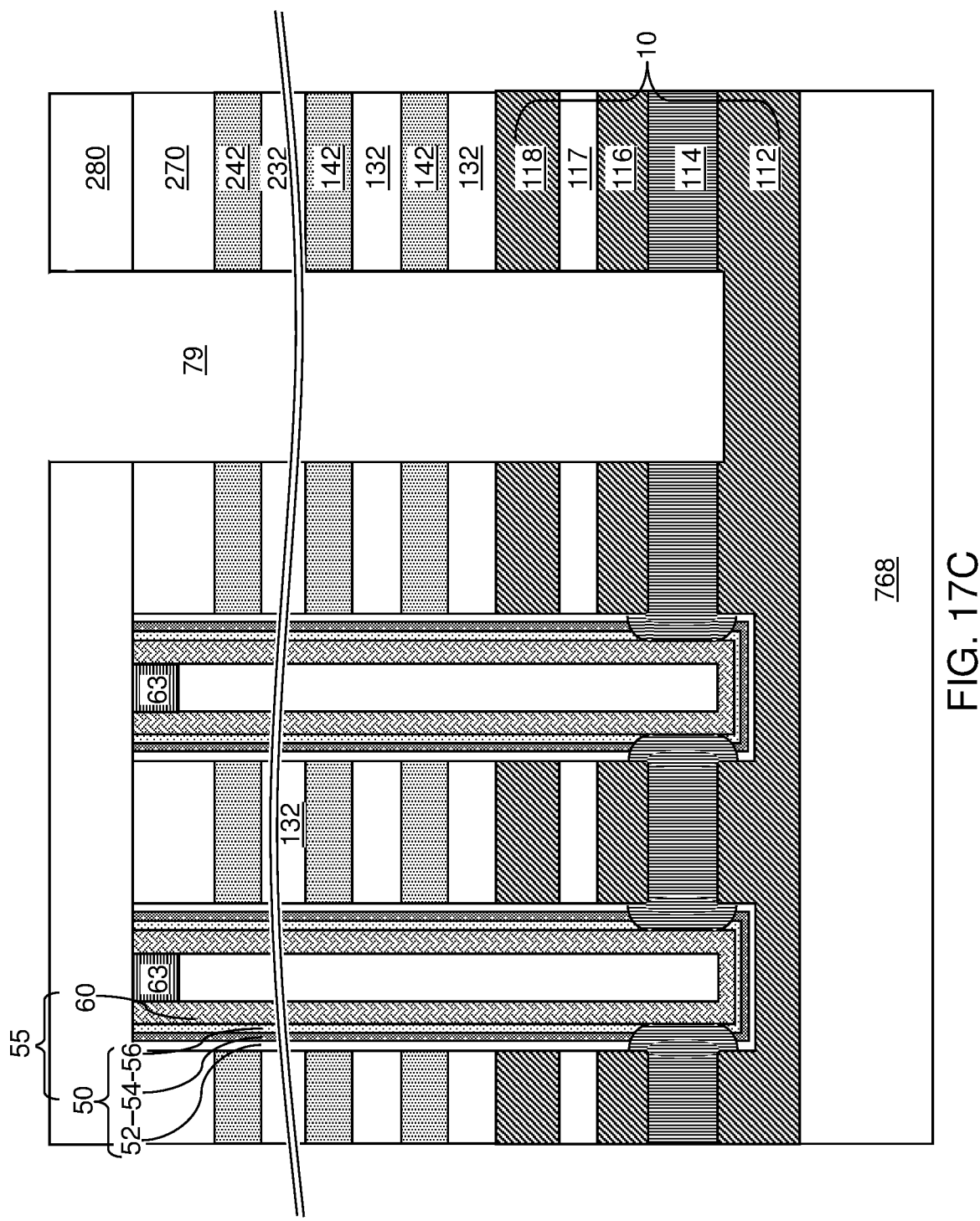
Figure 18A:
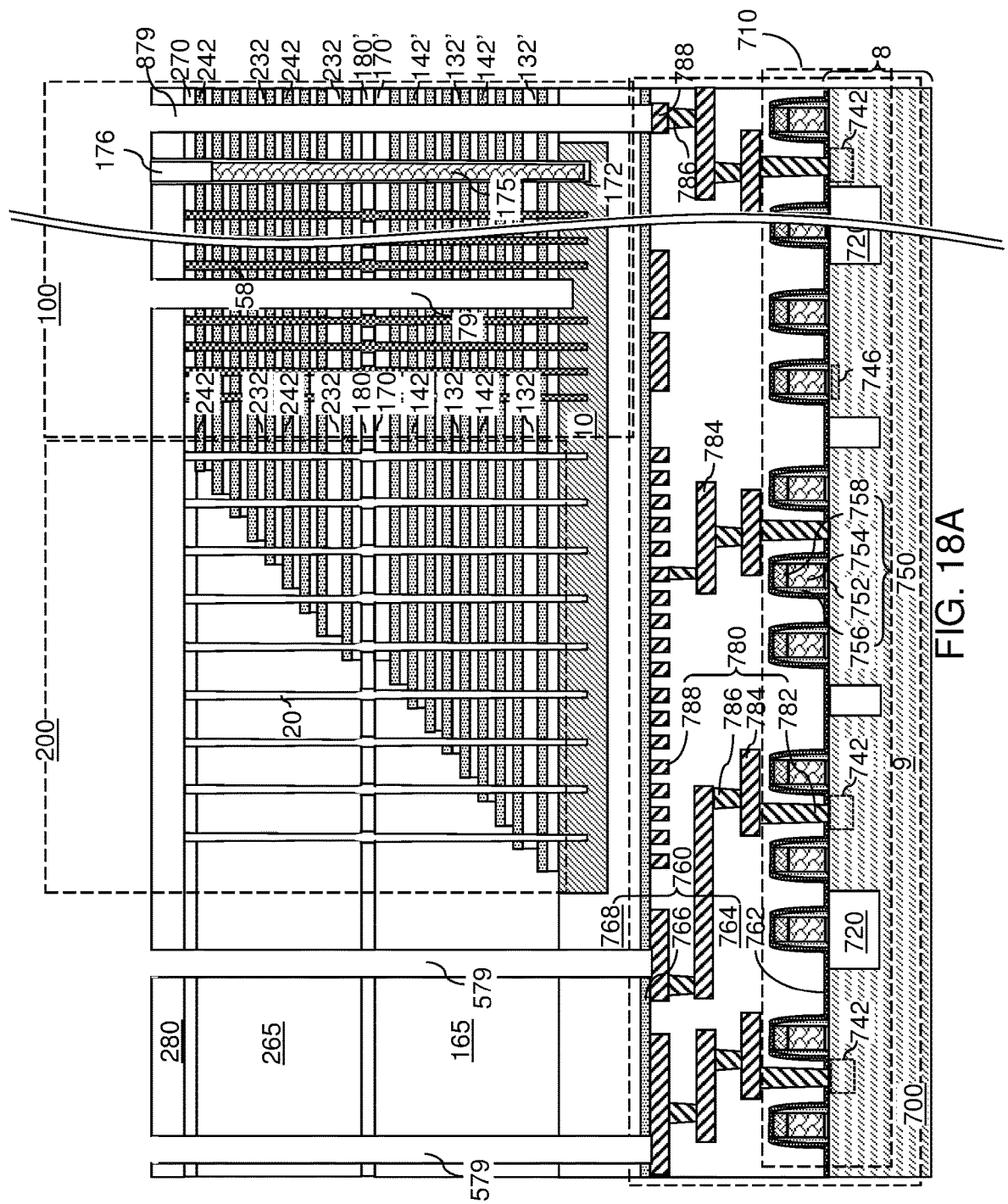
FIG. 18A is a vertical cross-sectional view of the exemplary structure after formation of dielectric semiconductor oxide portions according to an embodiment of the present disclosure.
Figure 18B:
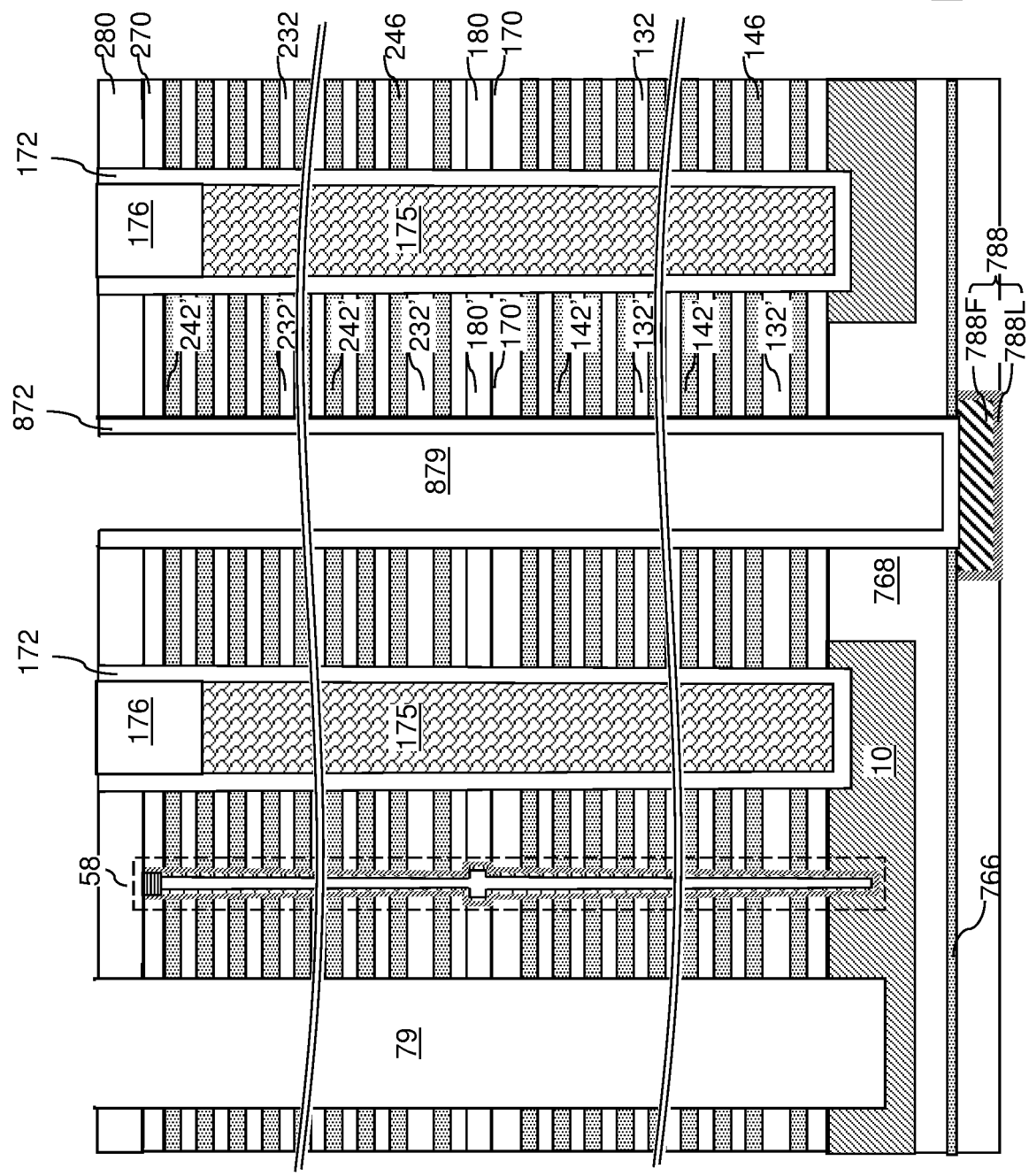
FIG. 18B is another vertical cross-sectional view of the exemplary structure of FIG. 18A.
Figure 18C:
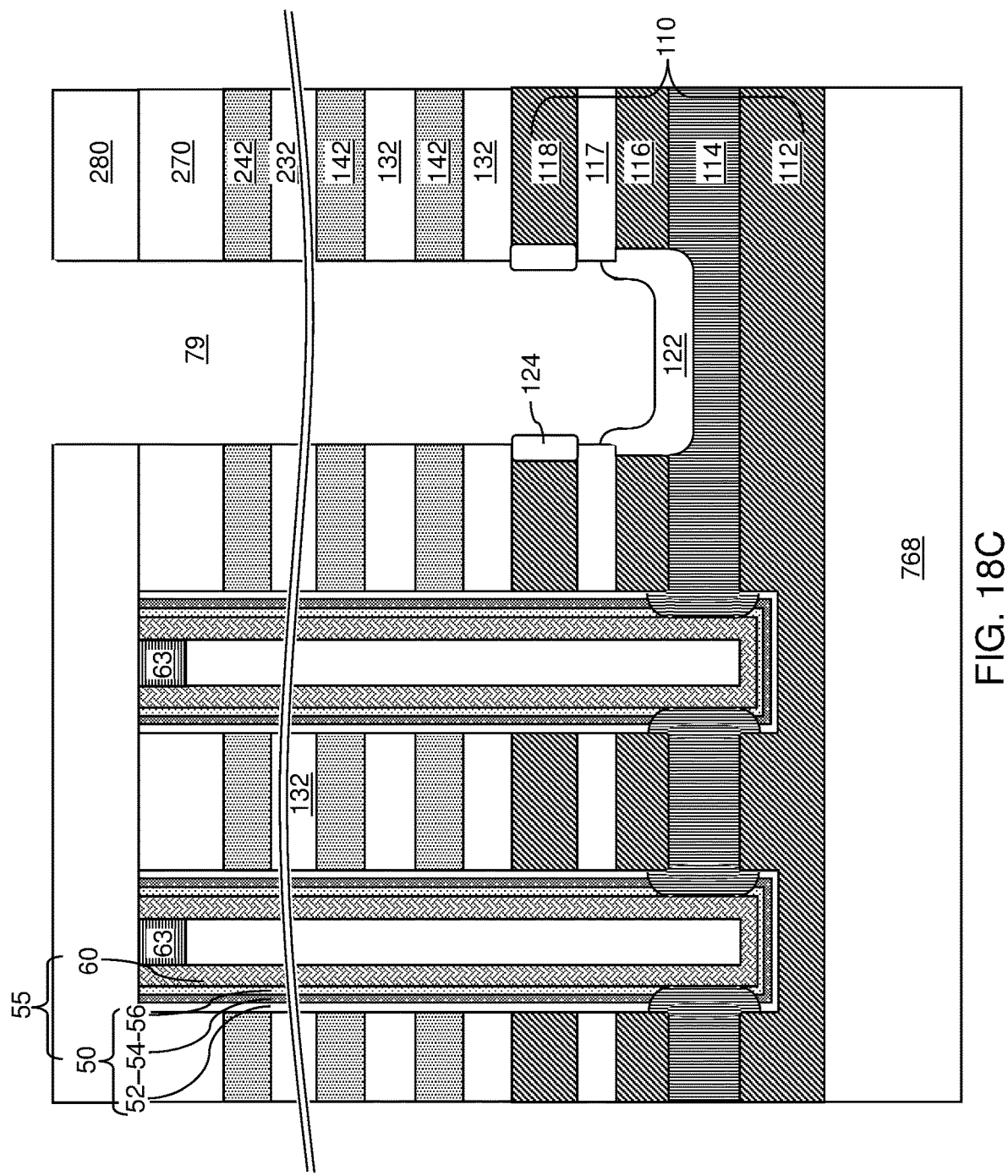
FIG. 18C is yet another vertical cross-sectional view of the exemplary structure of FIGS. 18A and 18B.
Figure 18D:
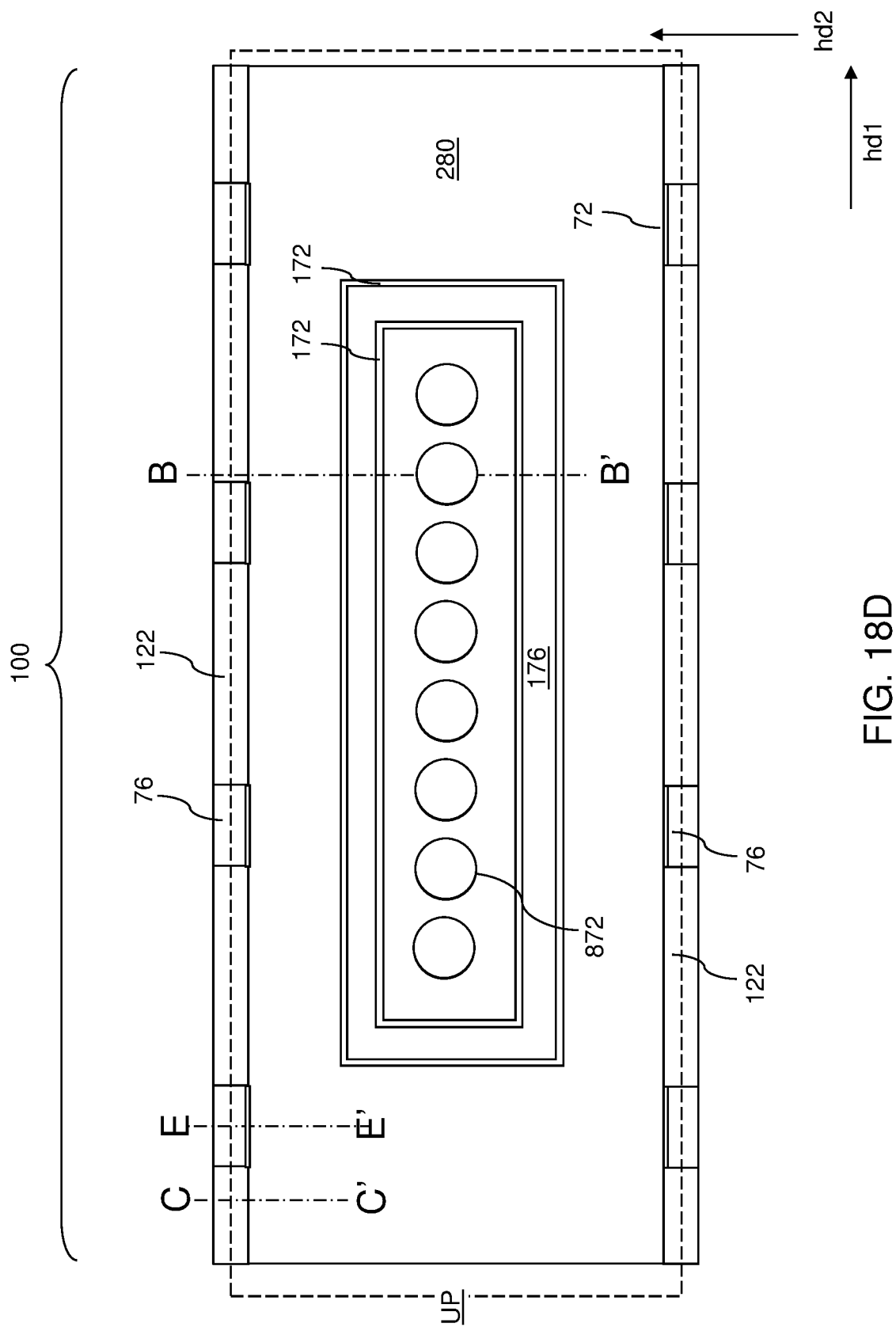
FIG. 18D is a horizontal cross-sectional view along the horizontal plane D-D' of FIG. 18B. The vertical cross-sectional plane B-B' is the plane of the vertical cross-section of FIG. 18B. The vertical cross-sectional plane C-C' is the plane of the vertical cross-section of FIG. 18C.
Figure 18E:
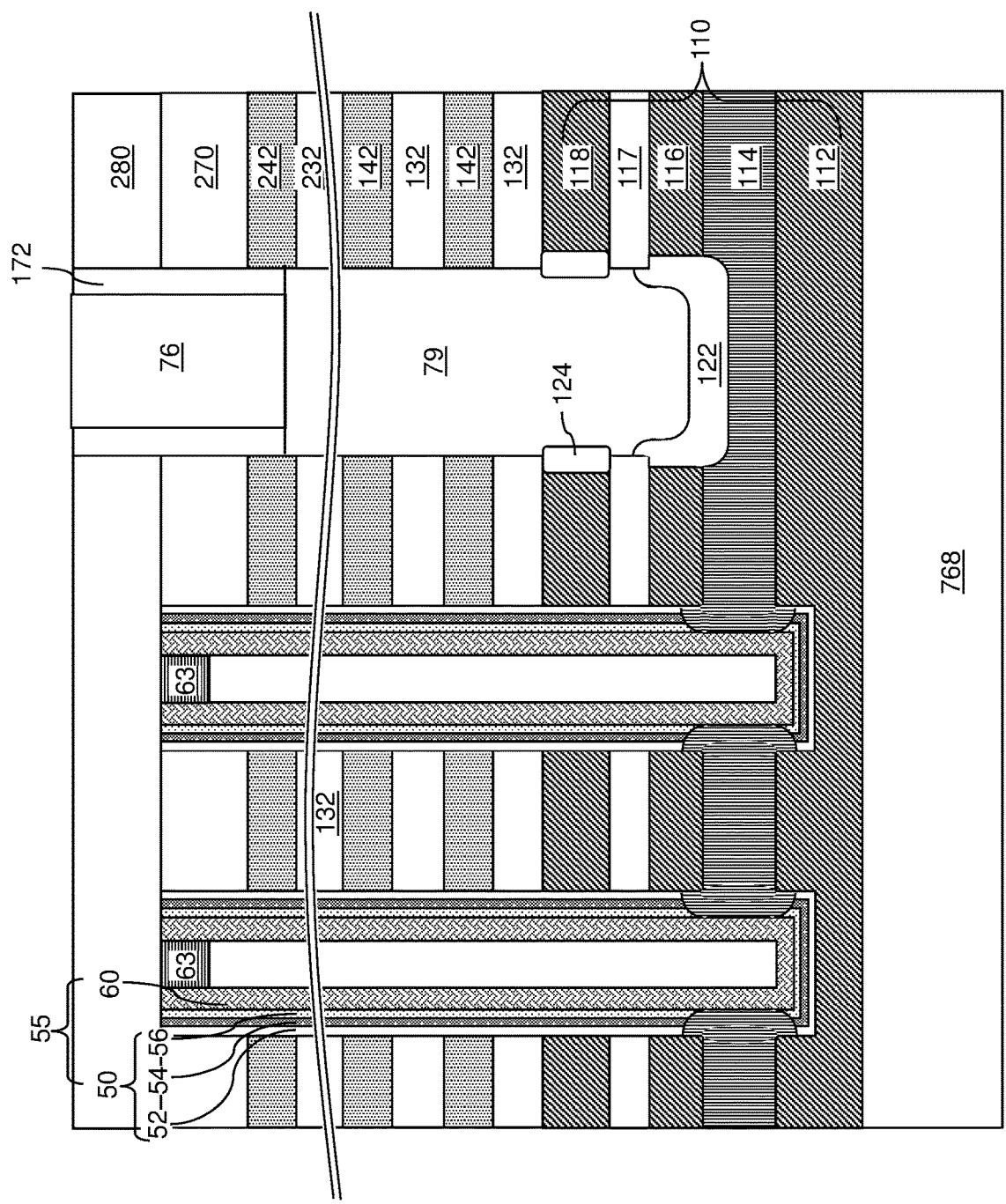
FIG. 18E is a vertical cross-sectional view of the exemplary structure along the vertical plane E-E' of FIG. 18D.

Subsequently, the in-process source-level material layers 10' can be replaced with source-level material layers 10. FIGS. 17A-17C illustrate sequential vertical cross-sectional views of memory opening fill structures 58 and a backside trench 79 during formation of source-level material layers 10 according to an embodiment of the present disclosure.

Referring to FIG. 17A, an etchant that etches the material of the source-level sacrificial layer 104 selective to the materials of the first-tier alternating stack (132, 142), the second-tier alternating stack (232, 242), the first and second insulating cap layers (170, 270), the contact-level dielectric layer 280, the upper sacrificial liner 105, and the lower sacrificial liner 103 may be introduced into the backside trenches 79 in an isotropic etch process. For example, if the source-level sacrificial layer 104 includes undoped amorphous silicon or an undoped amorphous silicon-germanium alloy and if the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the upper and lower sacrificial liners (105, 103). A source cavity 109 may be formed in the volume from which the source-level sacrificial layer 104 is removed.

Wet etch chemicals such as hot TMY and TMAH are selective to the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, in embodiments in which sidewalls of the upper source-level semiconductor layer 116 are physically exposed or in other embodiments in which a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 may be physically exposed to the source cavity 109. Specifically, each of the memory opening fill structures 58 may include a sidewall and a bottom surface that are physically exposed to the source cavity 109.

Referring to FIG. 17B, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 may be formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Referring to FIG. 17C, a doped semiconductor material having a doping of the second conductivity type may be deposited on the physically exposed semiconductor surfaces around the source cavity 109. The second conductivity type is the opposite of the first conductivity type, which is the conductivity type of the doping of the vertical semiconductor channels 60. The physically exposed semiconductor surfaces include bottom portions of outer sidewalls of the vertical semiconductor channels 60 and horizontal surfaces of the at least one source-level semiconductor layer (112, 116). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and an n-type dopant precursor gas may flow concurrently into a process chamber including the exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an in-situ doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and the dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a source layer (112, 114, 116). The source layer (112, 114, 116) is electrically connected to a first end (such as a bottom end) of each of the vertical semiconductor channels 60. The set of layers including the source layer (112, 114, 116), the source-level insulating layer 117, and the source-select-level conductive layer 118 constitutes source-level material layers 10, which replaces the in-process source-level material layers 10'. Generally, the source-level material layers 10 comprise a source contact layer 114 comprising a doped semiconductor material and contacting a sidewall of each of the vertical semiconductor channels 60. The source-level material layers 10 can be spaced from the trench fill material portion 175 of each isolation trench fill structure (172, 175, 176) by the dielectric trench liner 172 of the respective isolation trench fill structure (172, 175, 176).

Referring to FIGS. 18A-18E, an oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 19A:
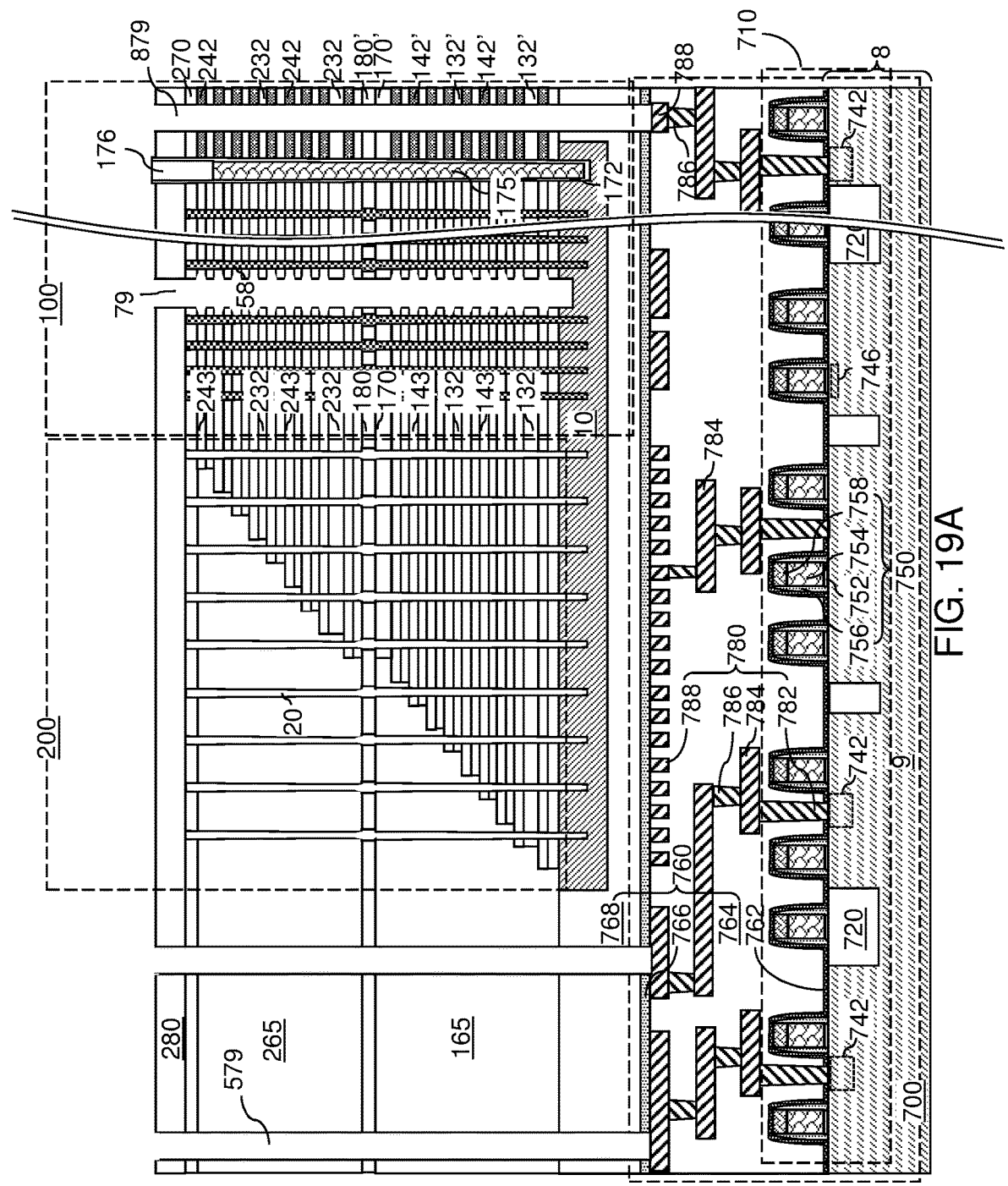
FIG. 19A is a vertical cross-sectional view of the exemplary structure after formation of backside recesses according to an embodiment of the present disclosure.
Figure 19B:
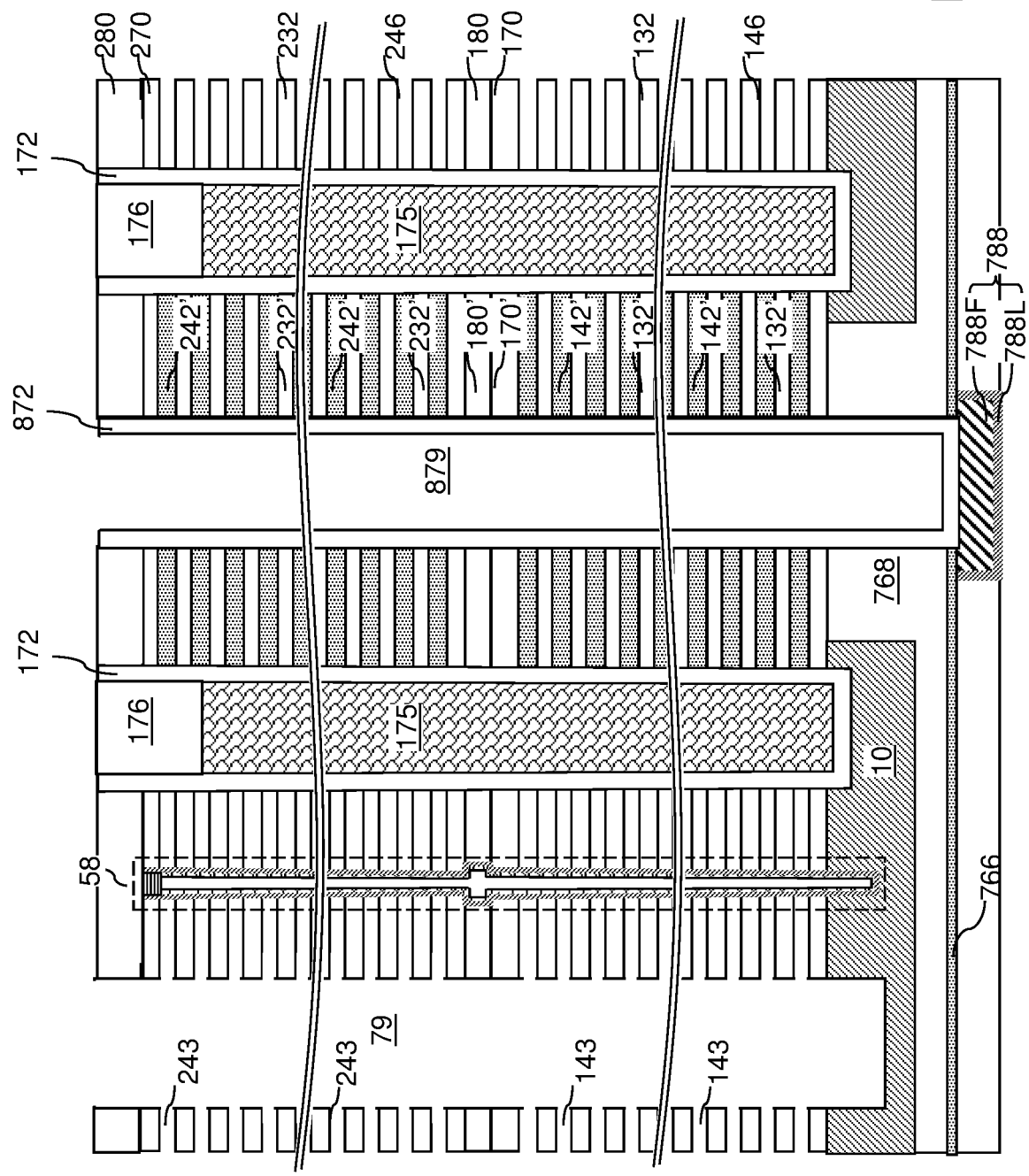
FIG. 19B is another vertical cross-sectional view of the exemplary structure of FIG. 19A.

Referring to FIGS. 19A and 19B, the sacrificial material layers (142, 242) can be removed selective to the insulating layers (132, 232), the first and second insulating cap layers (170, 270), the contact-level dielectric layer 280, the dielectric semiconductor oxide plates 122, and the annular dielectric semiconductor oxide spacers 124. An isotropic etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art. The duration of the isotropic etch process may be selected such that the entirety of the sacrificial material layers (142, 242) is removed by the isotropic etch process.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that may be formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

The first backside recesses 143 can be laterally bounded by the outer sidewalls of a respective dielectric moat structure 176. Thus, the outer sidewalls of the dielectric moat structures 176 are physically exposed to the first backside recesses 143. The second backside recesses 243 can be laterally bounded by the outer sidewalls of a respective dielectric moat structure 176. Thus, the outer sidewalls of the dielectric moat structures 176 are physically exposed to the second backside recesses 243.

In one embodiment, the isolation trench fill structures (172, 175, 176) may have a tubular configuration (i.e., may be moat-shaped), and may laterally enclose a respective vertically alternating sequence of first insulating plates 132', first dielectric material plates 142', second insulating plates 232', and second dielectric material plates 242'. In this case, the isolation trench fill structures (172, 175, 176) can block the etchant of the isotropic etch process so that the dielectric material plates (142', 242') are not etched by the etchant of the isotropic etch process. In an alternative configuration, the isolation trench fill structures (172, 175, 176) may be provided as pairs of line trench fill structures filling a respective pair of line trenches that are parallel to each other. In this case, the duration of the isotropic etch process can be selected such that the isotropic etch process does not etch a region of the alternating stack {(132, 142), (232, 242)} located between a center portion of the region located between each pair of line trench fill structures. Unetched portions of the sacrificial material layers (142, 242) constitute dielectric material plates (142', 242'). Portions of the insulating layers (132, 232) having an areal overlap with the dielectric material plates (142', 242') function as insulating plates (132', 232'). In this case, the insulating plates (132', 232') may be portions of the insulating layers (132, 232).

Figure 20A:
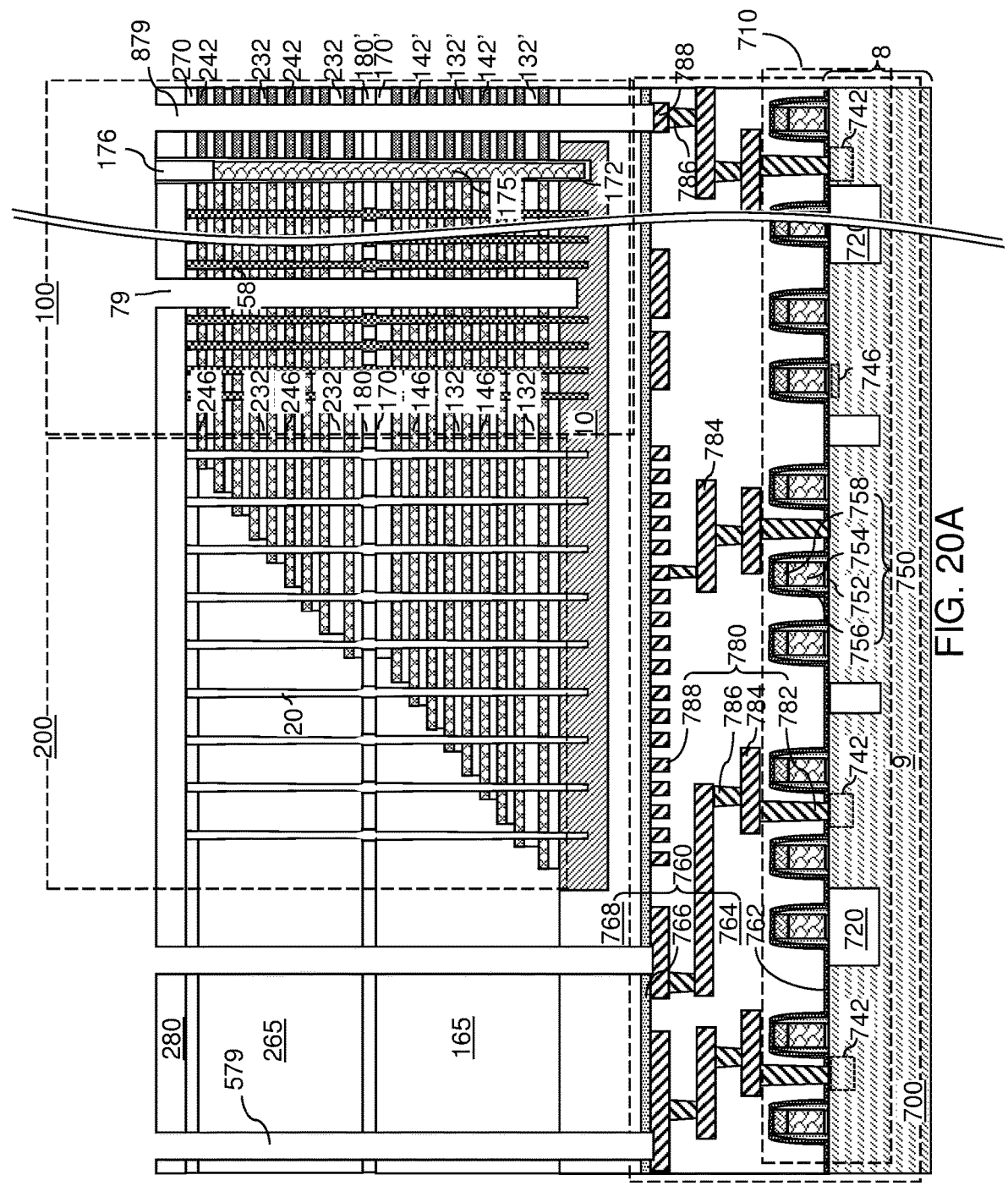
FIG. 20A is a vertical cross-sectional view of the exemplary structure after formation of electrically conductive layers according to an embodiment of the present disclosure.
Figure 20B:
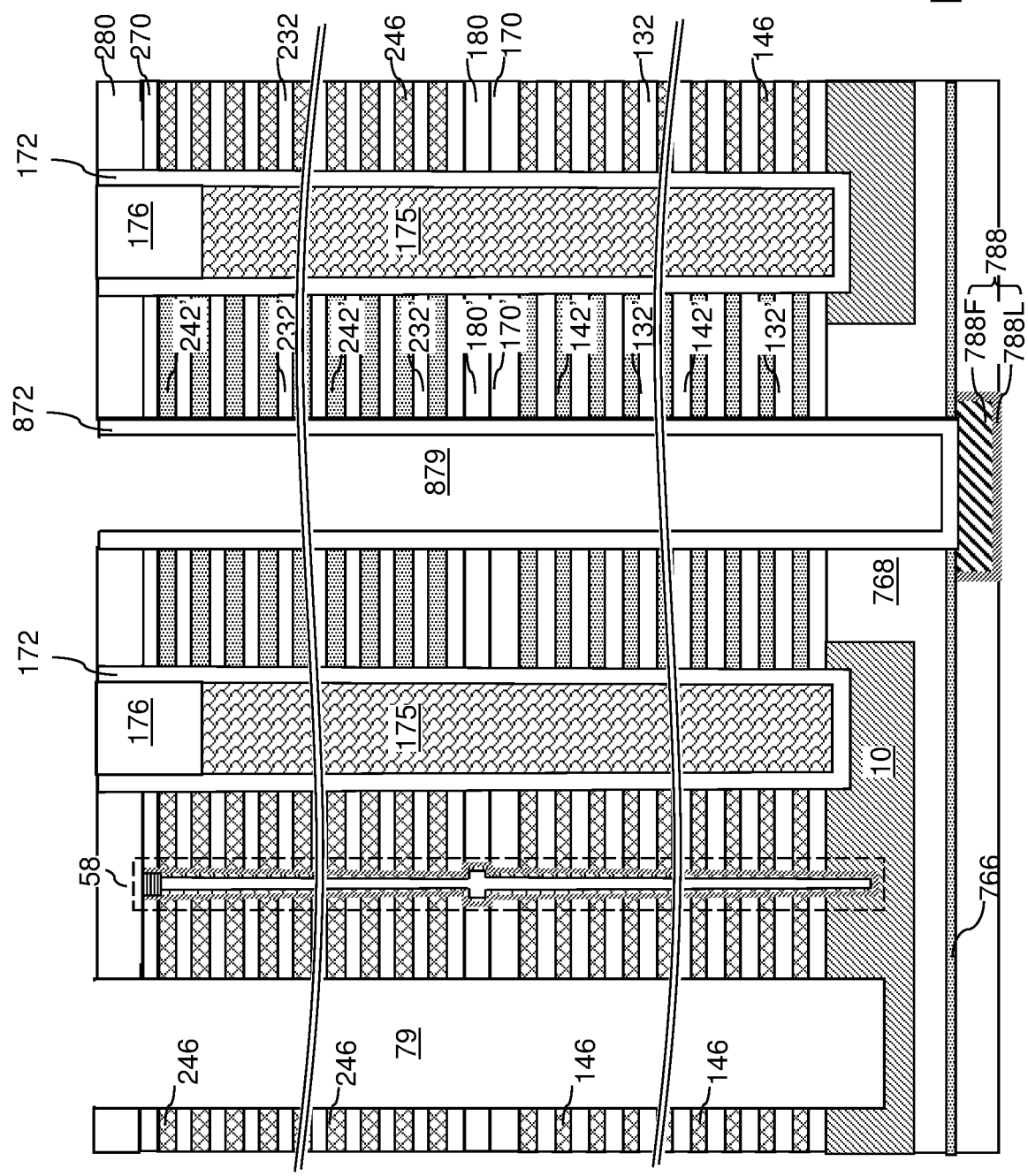
FIG. 20B is another vertical cross-sectional view of the exemplary structure of FIG. 20A.

Referring to FIGS. 20A and 20B, a backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, at peripheral regions of the through-memory-level via cavities (879, 579), and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79 and from inside the through-memory-level via cavities (879, 579). Specifically, the deposited metallic material of the continuous metallic material layer may be etched back from the sidewalls of each backside trench 79, from sidewalls of the through-memory-level via cavities (879, 579), and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers may be physically exposed to a respective backside trench 79.

Generally, remaining portions of the first sacrificial material layers 142 located outside the dielectric moat structures 176 are replaced with the first electrically conductive layers 146, and remaining portions of the second sacrificial material layers 242 outside the dielectric moat structures 176 are replaced with the second electrically conductive layers 246. Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes alternating stack {(132, 146), (232, 246)} and memory stack structures 55 vertically extending through the alternating stack (132, 146, 232, 246).

A three-dimensional array of memory elements can be formed over the lower-level dielectric material layers 760. The three-dimensional array of memory elements comprises an alternating stack of insulating layers (132, 232) and electrically conductive layers (146, 246) overlying a semiconductor material layer within the source-level material layers 10, memory stack structures 55 vertically extending through the alternating stack and comprising a respective vertical semiconductor channel 60 and a respective memory film 50, and a vertically alternating sequence of insulating plates (132', 232') and dielectric material plates (142', 242') laterally surrounded by the alternating stack {(132, 146), (232, 246)}.

Generally, portions of the sacrificial material layers (142, 242) can be replaced with the electrically conductive layers (146, 246). Each region of the exemplary structure that includes the electrically conductive layers (146, 246) comprises an alternating stack of the insulating layers (132, 232) and the electrically conductive layers (146, 246), and each region of the exemplary structure that includes remaining portions of the sacrificial material layers (142, 242) comprises a vertically alternating sequence of insulating plates (132', 232') and dielectric material plates (142', 242').

Figure 21A:
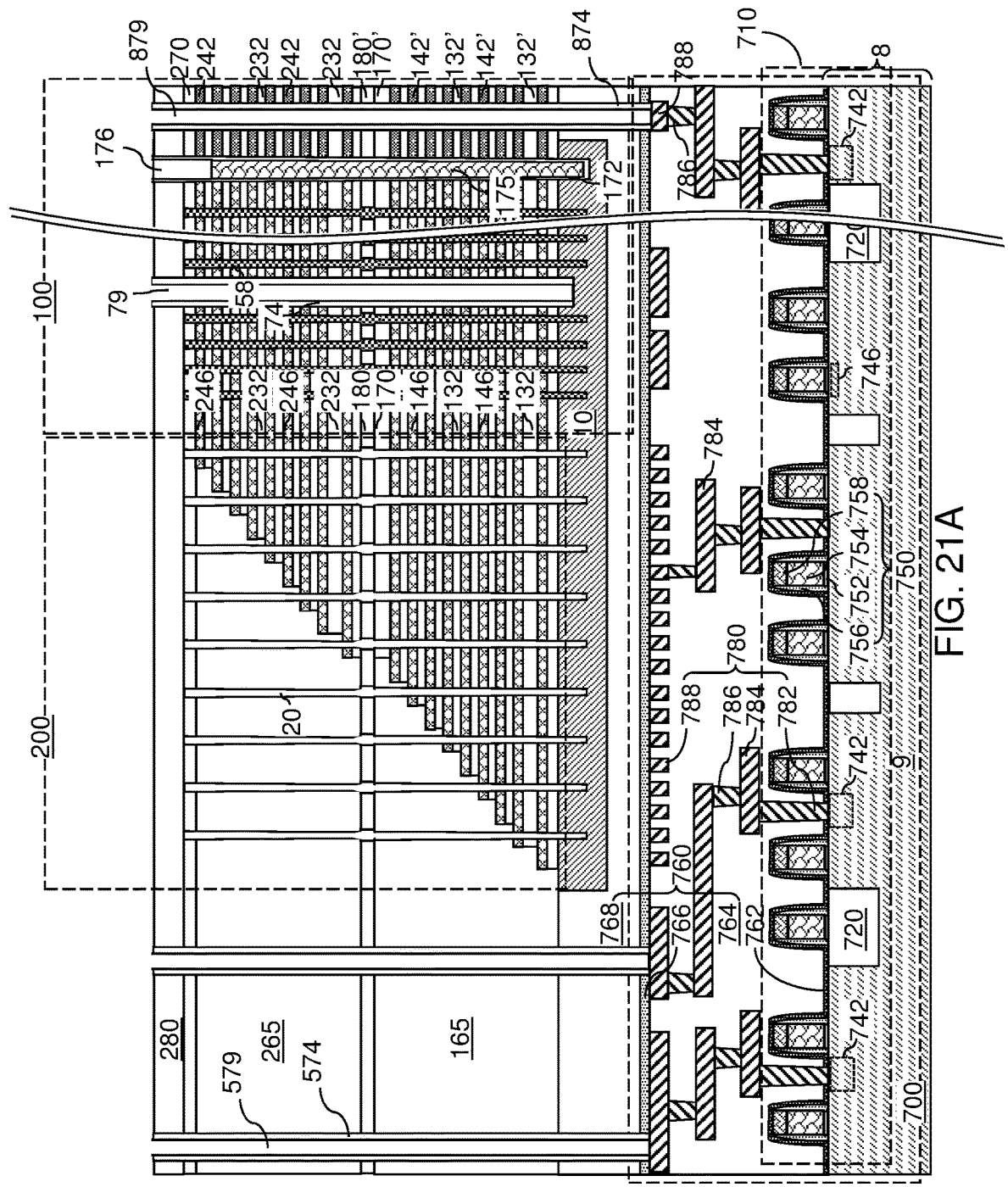
FIG. 21A is a vertical cross-sectional view of the exemplary structure after formation of insulating spacers according to an embodiment of the present disclosure.
Figure 21B:
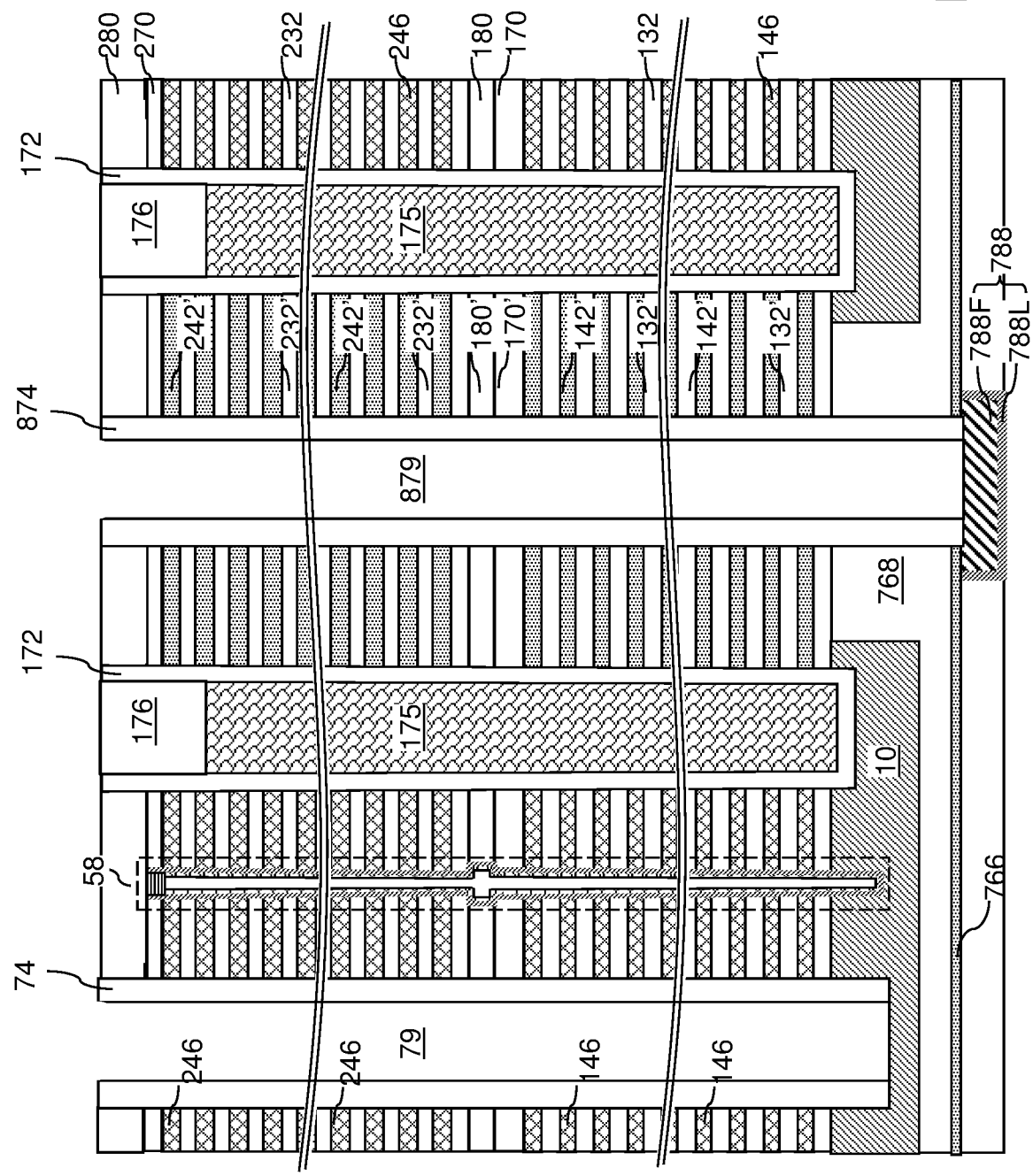
FIG. 21B is another vertical cross-sectional view of the exemplary structure of FIG. 21A.

Referring to FIGS. 21A and 21B, a dielectric material such as silicon oxide can be conformally deposited in the backside trenches 79 and the through-memory-level via cavities (879, 579), and can be anisotropically etched. Remaining patterned vertically-extending portions of the dielectric material in the backside trenches 79 comprise backside insulating spacers 74. Remaining patterned vertically-extending portions of the dielectric material in the first through-memory-level via cavities 879 comprise first insulating spacers 774. Remaining patterned vertically-extending portions of the dielectric material in the second through-memory-level via cavities 579 comprise second insulating spacers 574. The lateral thickness of the backside insulating spacers 74, the first insulating spacers 774, the second insulating spacers 574 may have a thickness in a range from 6 nm to 100 nm, such as from 12 nm to 50 nm, although lesser and greater thicknesses may also be employed. A backside insulating spacer 74 can be formed at peripheral portions of each backside trenches 79, a first insulating spacer 874 can be formed at a peripheral portion of each first through-memory-level via cavity 879, and a second insulating spacer 574 can be formed at a peripheral portion of each second through-memory-level via cavity 579.

Figure 22:
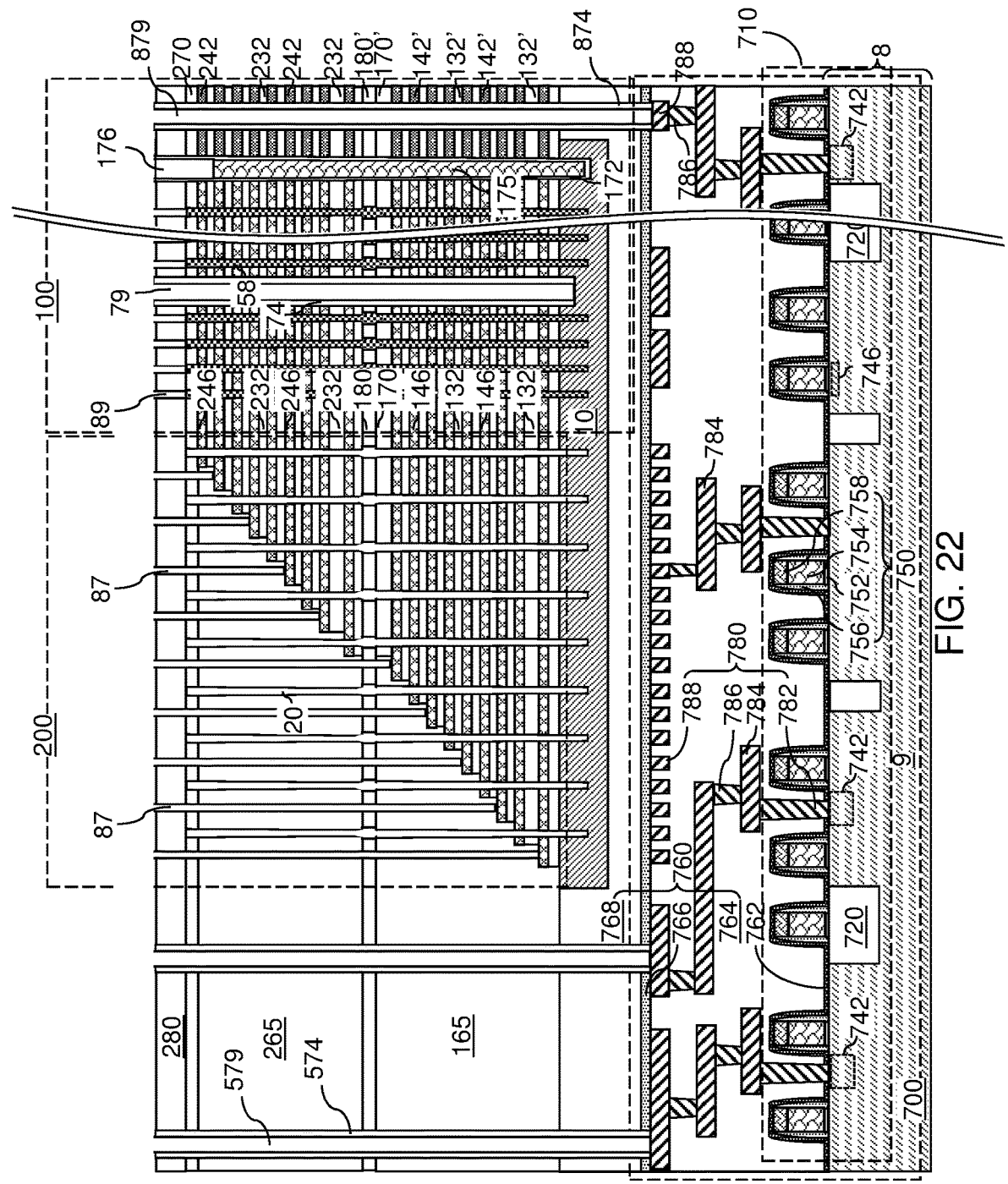
FIG. 22 is a vertical cross-sectional view of the exemplary structure after formation of layer contact via cavities and drain contact via cavities according to an embodiment of the present disclosure.
Figure 23A:
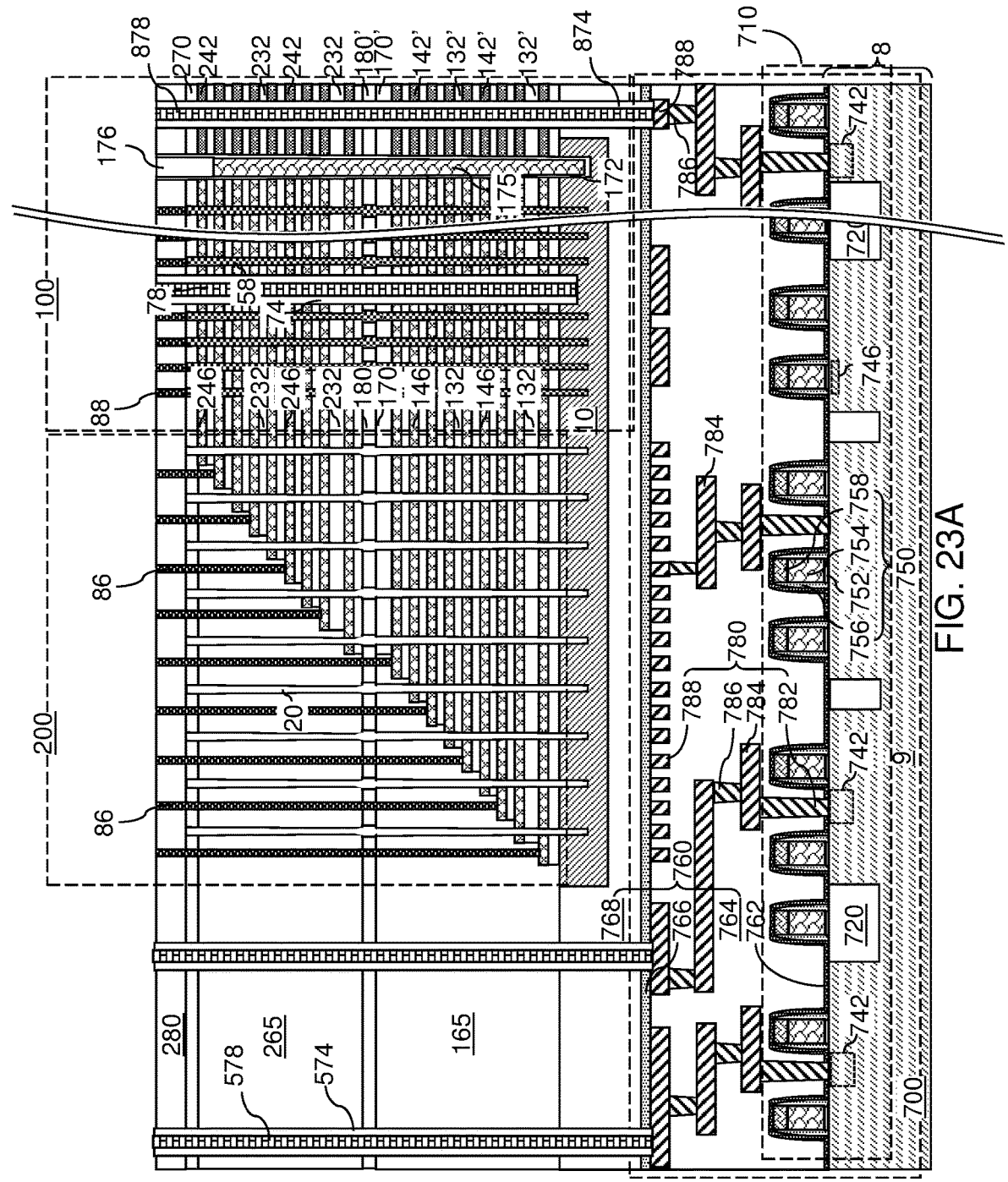
FIG. 23A is a vertical cross-sectional view of the exemplary structure after formation of various contact via structures according to an embodiment of the present disclosure.
Figure 23B:
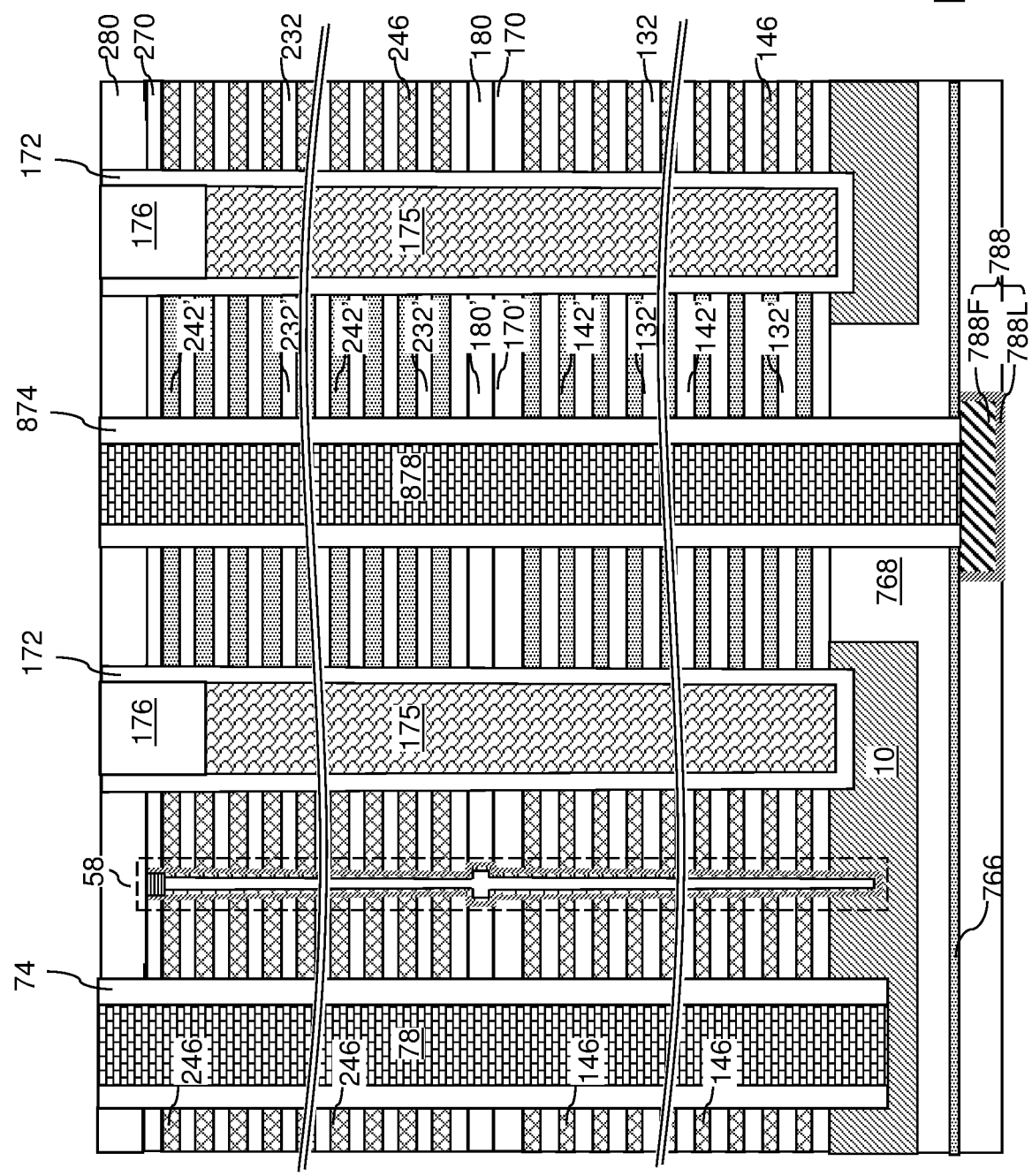
FIG. 23B is another vertical cross-sectional view of the exemplary structure of FIG. 23A.
Figure 23C:
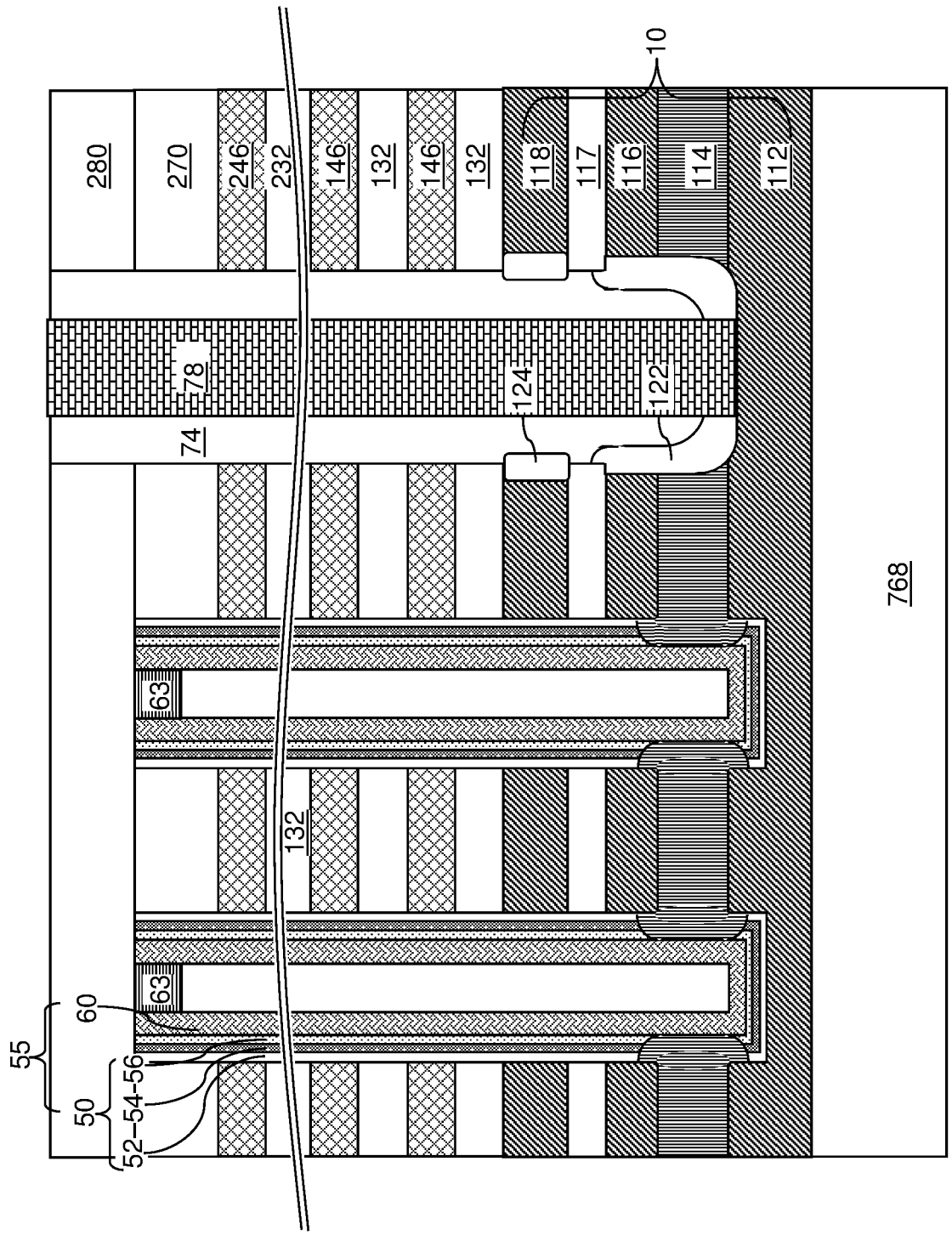
FIG. 23C is yet another vertical cross-sectional view of the exemplary structure of FIGS. 23A and 23B.
Figure 23D:
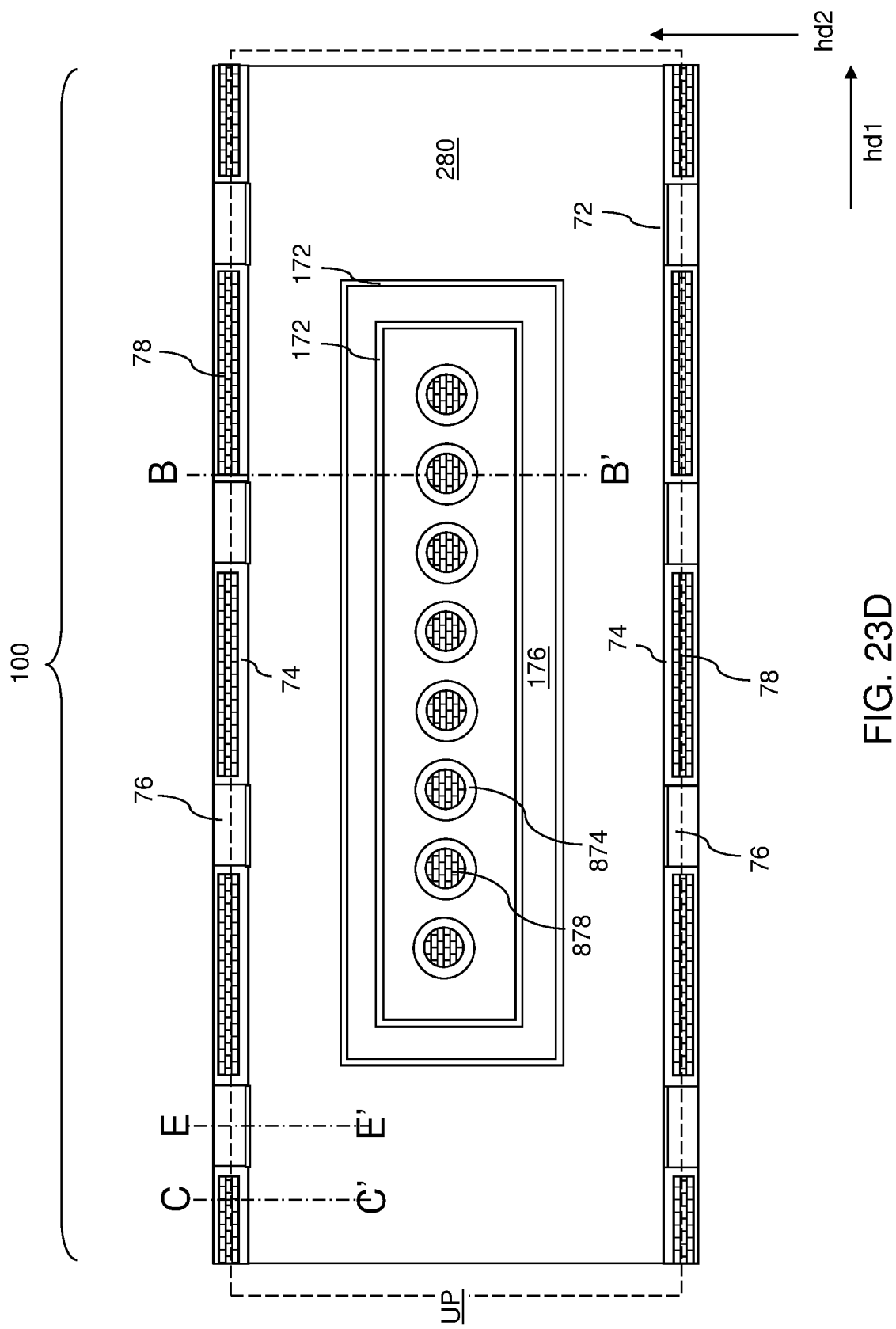
FIG. 23D is a horizontal cross-sectional view along the horizontal plane D-D' of FIG. 23B. The vertical cross-sectional plane B-B' is the plane of the vertical cross-section of FIG. 23B. The vertical cross-sectional plane C-C' is the plane of the vertical cross-section of FIG. 23C.
Figure 23E:
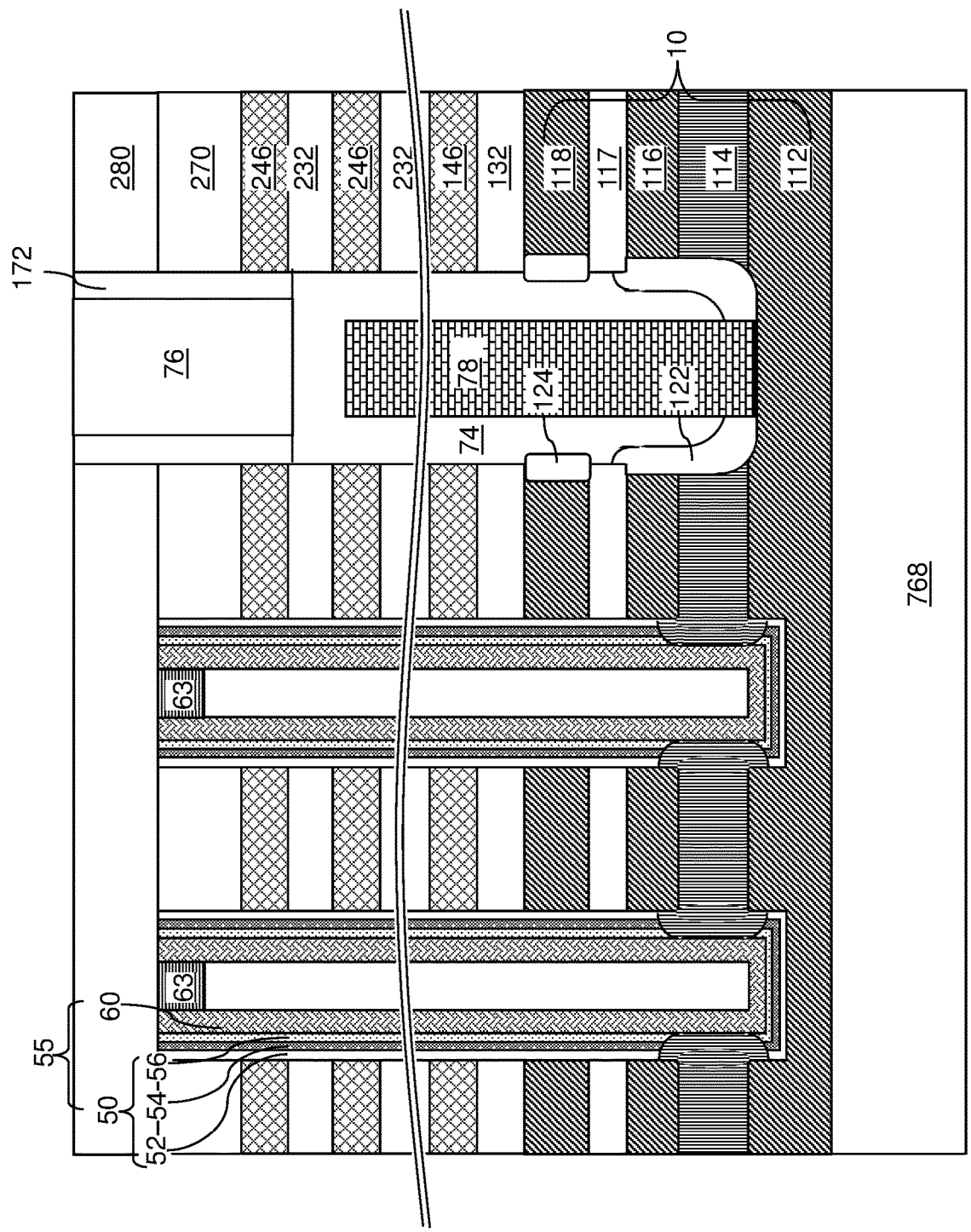
FIG. 23E is a vertical cross-sectional view of the exemplary structure along the vertical plane E-E' of FIG. 23D.

Referring to FIG. 22, a photoresist layer (not shown) can be applied over the contact-level dielectric layer 280, and can be lithographically patterned to form openings in areas in which additional contact via cavities are to be subsequently formed. For example, the openings in the photoresist layer can be formed over horizontal surfaces of the stepped surfaces of the retro-stepped dielectric material portions (165, 265). An anisotropic etch process can be performed to transfer the pattern of the openings in the photoresist layer through the contact-level dielectric layer 280 and through the retro-stepped dielectric material portions (165, 265). Layer contact via cavities 87 are formed over the stepped surfaces of the alternating stack {(132, 146), (232, 246)}. Drain contact via cavities 89 are formed over the drain regions 63 of the memory opening fill structures 58.

Referring to FIGS. 23A-23E, at least one metallic material (such as a combination of a metallic nitride liner (e.g., TiN, TaN, or WN) and a metallic fill material (e.g., W, Cu, Mo, Ru, Co, etc.)) may be deposited in unfilled volumes of the backside trenches 79, the through-memory-level via cavities (879, 579), the drain contact via cavities 89, and the layer contact via cavities 87. Excess portions of the at least one metallic material can be removed from above the horizontal plane including the contact-level dielectric layer 280 by a planarization process.

A backside contact via structure 78 can be formed within each backside trench 79. A first through-memory-level interconnection via structure 878 can be formed in each first through-memory-level via cavity 879. A second through-memory-level interconnection via structure 578 can be formed in each second through-memory-level via cavity 579. A drain contact via structure 88 can be formed in each of the drain contact via cavities 89 on a top surface of a respective one of the drain regions 63. Layer contact via structures 86 can be formed in the layer contact via cavities 87 on a top surface of a respective one of the electrically conductive layers (146, 246).

In one embodiment, each first through-memory-level interconnection via structure 878 contacts a center portion of a top surface of a respective one of the lower-level metal interconnect structures 780, such as a metal pad structure 788. Each first through-memory-level interconnection via structure 878 vertically extends through each plate within a respective vertically alternating sequence of insulating plates (132', 232') and dielectric material plates (142', 242') and contacts a center portion of a top surface of a respective one of the lower-level metal interconnect structures 780.

In one embodiment, each second through-memory-level interconnection via structure 578 contacts a center portion of a top surface of a respective one of the lower-level metal interconnect structures 780, such as a metal pad structure 788. Each second through-memory-level interconnection via structure 578 vertically extends through the second retro-stepped dielectric material portion 265 and the first retro-stepped dielectric material portion 165, and contacts a center portion of a top surface of a respective one of the lower-level metal interconnect structures 780.

In one embodiment, each backside contact via structure 78 vertically extends through the alternating stack of insulating layers {(132, 146), (232, 246)}, contacts one of the source-level material layers 10, and comprising a same material as the through-memory-level interconnection via structures (878, 578). A backside insulating spacer 74 laterally surrounds each backside contact via structure 78 and contacts each layer within an alternating stack {(132, 146), (232, 246)}.

In one embodiment, a backside contact via structure 78 can be formed within each backside trench 79, can contact one of the source-level material layers 10, and can comprise a same material as the first through-memory-level interconnection via structures 878 and the second through-memory-level interconnection via structures 578. Each backside insulating spacer 74 laterally surrounds a respective backside contact via structure 78, and contacts each layer within a respective alternating stack {(132, 146), (232, 246)}.

Each first insulating spacer 874 contacts and laterally surrounds a respective first through-memory-level interconnection via structure 878, and is laterally surrounded by, and is contacted by, a vertically alternating sequence of insulating plates (132', 232') and dielectric material plates (142', 242'). Each second insulating spacer 574 contacts and laterally surrounds a respective second through-memory-level interconnection via structure 578, and is laterally surrounded by, and is contacted by, the retro-stepped dielectric material portions (165, 265). The backside insulating spacers 74, the first insulating spacers 874, and the second insulating spacers 574 can have a same lateral width and a same dielectric material composition.

In one embodiment, top surfaces of the backside insulating spacers 74, the first insulating spacers 874, the second insulating spacers 574, the backside contact via structures 78, the first through-memory-level interconnection via structures 878, the second through-memory-level interconnection via structures 578, and the capping dielectric structures 176 are located within a same horizontal plane that is located above a topmost surface of the alternating stacks {(132, 146), (232, 246)}, such as the horizontal plane including the top surface of the contact-level dielectric layer 280.

The backside contact via structures 78 are formed within voids formed by removal of the portions of the fill material that are deposited in the backside trenches 79, i.e., by removal of the sacrificial backside trench fill structures 75. In one embodiment, the exemplary structure may comprise dielectric bridge structures 76 embedded within the backside trenches 79. In one embodiment, each of the backside trenches 79 may comprise a respective row of dielectric bridge structures 76 that is a respective subset of the dielectric bridge structures 76. In case a row of dielectric bridge structures 76 is embedded within an upper portion of a backside trench 79, wherein a top portion of a backside contact via structure 78 located within the backside trench 79 can be castellated, and can comprise protruding portions located between neighboring pairs of dielectric bridge structures 76 among the row of dielectric bridge structures 76. In one embodiment, each dielectric bridge structure 76 within the row of dielectric bridge structures 76 may comprise a bottom surface contacting a horizontally-extending portion of a backside insulating spacer 74, and a pair of widthwise sidewalls that are perpendicular to a lengthwise direction of the backside trench 79 and contacting vertically-extending portions of the backside insulating spacer 74. Thus, the dielectric bridge structures 76 can reduce or prevent the collapse or tilting of the alternating stacks into the backside trenches 79 by keeping the alternating stacks spaced apart from each other.

Figure 24:
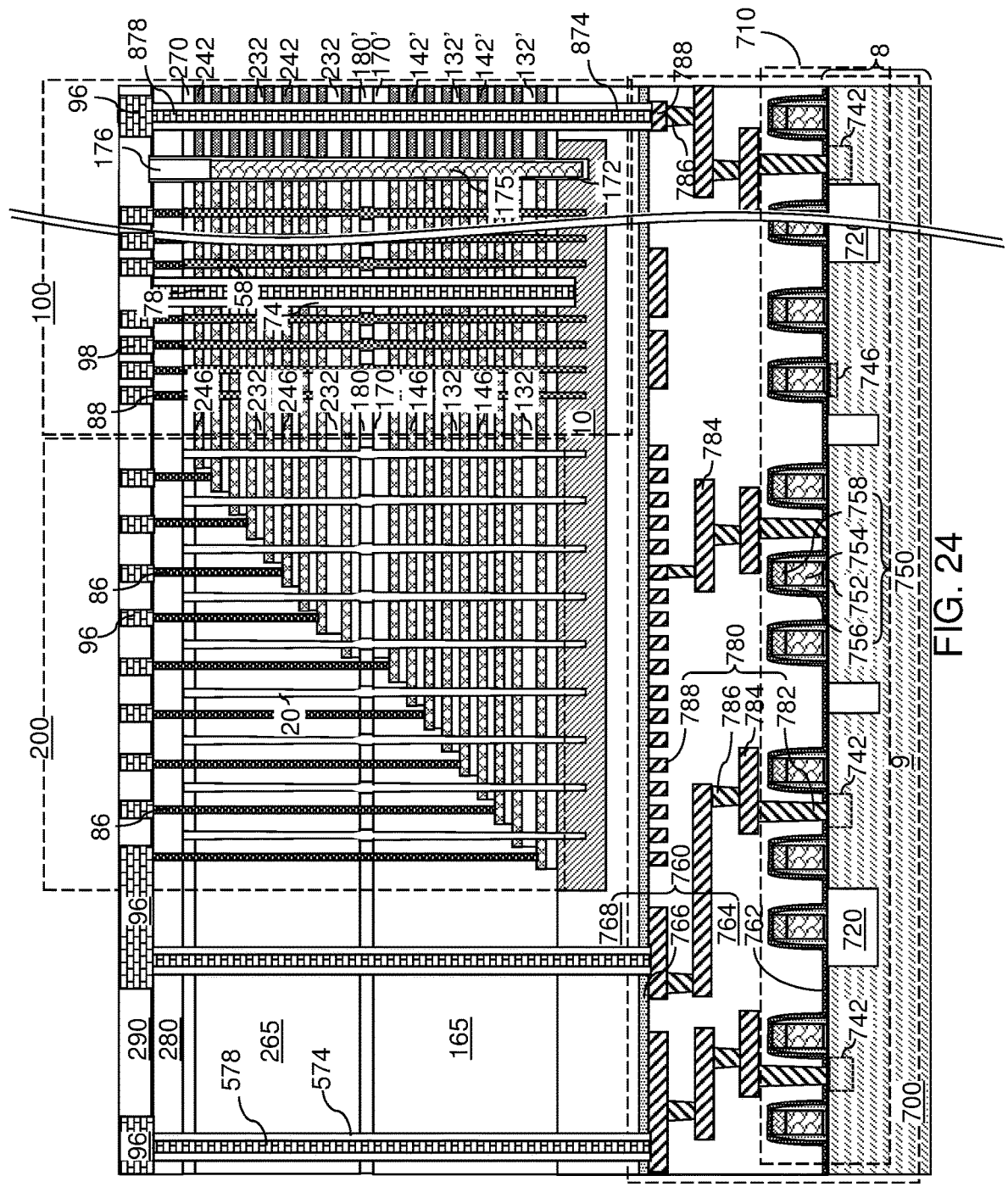
FIG. 24 is a vertical cross-sectional view of the exemplary structure after formation of upper-level metal interconnect structures according to an embodiment of the present disclosure.

Referring to FIG. 24, a line-level dielectric material layers 290 and upper-level metal interconnect structures (98, 96) can be formed. The upper-level metal interconnect structures (98, 96) can include bit lines 98 and connection metal lines (e.g., word line interconnects) 96. Additional upper-level dielectric material layers (not shown) and additional upper-level metal interconnect structures (not shown) may be formed as needed.

Figure 25A:
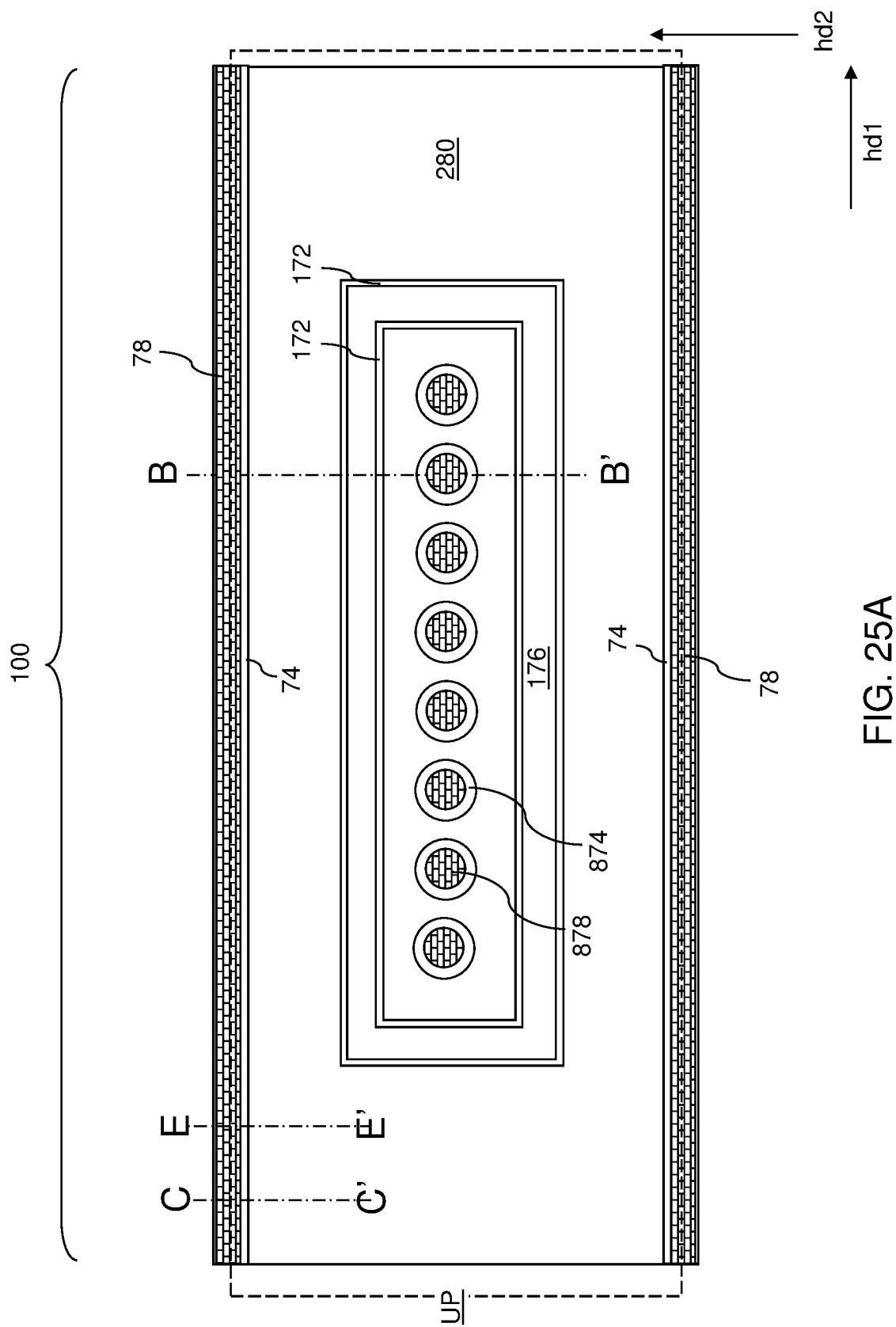
FIGS. 25A and 25B are top-down views of alternative configurations of the exemplary structure after formation of various contact via structures.
Figure 25B:
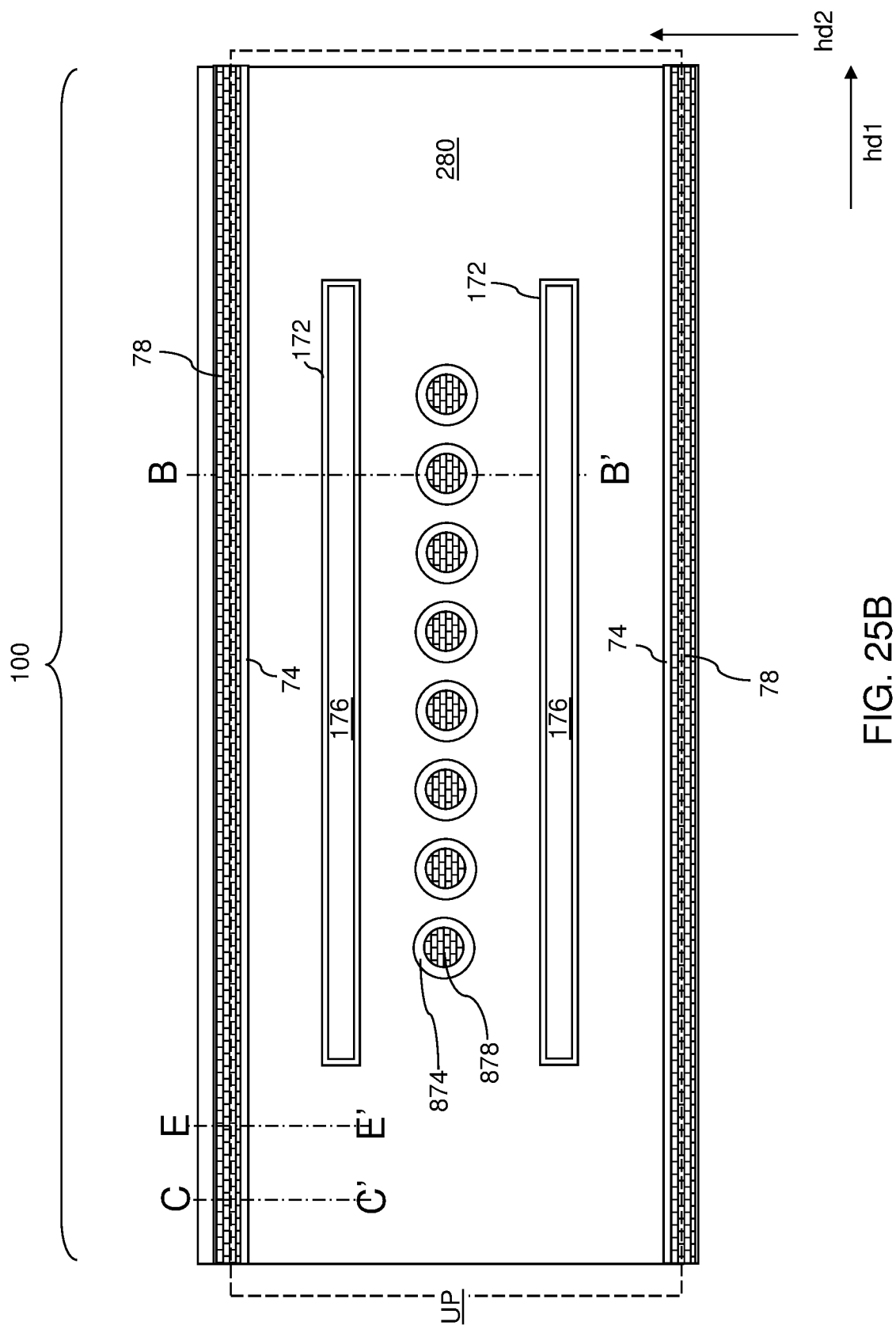

Referring to FIGS. 25A and 25B, top-down views of alternative configurations of the exemplary structure is illustrated after formation of various contact via structures (78, 878, 578). In the alternative configuration of the exemplary structure, formation of the dielectric bridge structures 76 is omitted, for example, by omitting formation of openings in the photoresist layer over the backside trenches 79 at the processing steps of FIGS. 12A-12E. In this case, each backside contact via structure 78 is not castellated, and the entirety of the top surface of each backside contact via structure 78 may be located within a same horizontal plane as the top surface of the contact-level dielectric layer 280.

Referring to all drawings and according to various embodiments of the present disclosure, a semiconductor structure is provided, which comprises: semiconductor devices 710 located on a top surface of a substrate semiconductor layer 9; lower-level metal interconnect structures 780 embedded in lower-level dielectric material layers 760 and electrically connected to the semiconductor devices 710 and overlying the substrate semiconductor layer 9; source-level material layers 10 overlying the lower-level dielectric material layers 760 and comprising an opening therethrough; an alternating stack of insulating layers (132, 232) and electrically conductive layers (146, 246) overlying the source-level material layers 10; memory stack structures 55 vertically extending through the alternating stack {(132, 146), (232, 246)} and comprising a respective vertical semiconductor channel 60 and a respective memory film 50; a vertically alternating sequence of insulating plates (132', 232') and dielectric material plates (142', 242') laterally surrounded by the alternating stack {(132, 146), (232, 246)}; an isolation trench fill structure (172, 175, 176) interposed between the alternating stack {(132, 146), (232, 246)} and the vertically alternating sequence {(132', 232'), (142', 242')} and comprising a trench fill material portion 175 and a capping dielectric structure 176 overlying the trench fill material portion 175; and a first through-memory-level interconnection via structure 878 vertically extending through each plate within the vertically alternating sequence {(132', 232'), (142', 242')} and contacting a top surface of one of the lower-level metal interconnect structures 780.

In one embodiment, the isolation trench fill structure (172, 175, 176) comprises a first straight sidewall contacting the alternating stack {(132, 146), (232, 246)} and a second straight sidewall contacting the vertically alternating sequence {(132', 232'), (142', 242')}, wherein each of the first straight sidewall and the second straight sidewall vertically extends from a horizontal plane overlying a topmost surface of the alternating stack {(132, 146), (232, 246)} into an upper region of the source-level material layers 10.

In one embodiment, the isolation trench fill structure (172, 175, 176) comprises a dielectric trench liner 172 laterally surrounding the trench fill material portion 175 and the capping dielectric structure 176; and the first straight sidewall and the second straight sidewall comprise surfaces of the dielectric trench liner 172. In one embodiment, the source-level material layers 10 are spaced from the trench fill material portion 175 by the dielectric trench liner 172. In one embodiment, the trench fill material portion 175 comprises a semiconductor material.

In one embodiment, the semiconductor structure comprises: a backside trench 79 vertically extending through the alternating stack {(132, 146), (232, 246)}; a backside contact via structure 78 located within the backside trench 79, contacting one of the source-level material layers 10, and comprising a same material as the first through-memory-level interconnection via structure 878; and a backside insulating spacer 74 laterally surrounding the backside contact via structure 78 and contacting each layer within the alternating stack {(132, 146), (232, 246)}.

In one embodiment, the semiconductor structure comprises a first insulating spacer 874 that contacts and laterally surrounds the first through-memory-level interconnection via structure 878 and laterally surrounded by the vertically alternating sequence {(132', 232'), (142', 242')}. In one embodiment, top surfaces of the first insulating spacer 874, the first through-memory-level interconnection via structure 878, and the capping dielectric structure 176 are located within a same horizontal plane that is located above a topmost surface of the alternating stack {(132, 146), (232, 246)}. In one embodiment, the backside insulating spacer 74 and the first insulating spacer 874 have a same lateral width and a same dielectric material composition.

In one embodiment, the semiconductor structure comprises a row of dielectric bridge structures 76 that are embedded within an upper portion of the backside trench 79, wherein a top portion of the backside contact via structure 78 is castellated and comprises protruding portions located between neighboring pairs of dielectric bridge structures 76 in the row of dielectric bridge structures 76. In one embodiment, each dielectric bridge structure in the row of dielectric bridge structures 76 comprise: a bottom surface contacting a horizontally-extending portion of the backside insulating spacer 74; and a pair of widthwise sidewalls that are perpendicular to a lengthwise direction of the backside trench 79 and contacting vertically-extending portions of the backside insulating spacer 74. In one embodiment, the isolation trench fill structure (172, 175, 176) comprises a dielectric trench liner 172 laterally surrounding the trench fill material portion 175 and the capping dielectric structure 176; and each dielectric bridge structure within the row of dielectric bridge structures 76 comprises a pair of lengthwise sidewalls that contact a respective dielectric bridge liner having a same lateral thickness and a same material composition as the dielectric trench liner 172.

In one embodiment, the source-level material layers 10 comprise a source contact layer 114 comprising a doped semiconductor material that contacts a sidewall of each of the vertical semiconductor channels 60.

In one embodiment shown in FIG. 25A, the isolation trench fill structure (172, 175, 176) has a tubular configuration, contacts an entirety of outer sidewalls of the vertically alternating sequence {(132', 232'), (142', 242')}, and contacts each layer within the alternating stack {(132, 146), (232, 246)}. Alternatively, the isolation trench fill structure (172, 175, 176) comprises a pair of line trench fill structures, as shown in FIG. 25B.

In one embodiment, the capping dielectric structure 176 comprises: a planar top surface within a first horizontal plane overlying a topmost surface of the alternating stack {(132, 146), (232, 246)}; and a bottom surface located below a second horizontal plane including the topmost surface of the alternating stack {(132, 146), (232, 246)} and contacting a top surface of the trench fill material portion 175.

The various embodiments of the present disclosure can be employed to provide structurally stable isolation trench fill structures (172, 175, 176) that reduces deformation of the insulating layers 132 during replacement of the sacrificial material layers (142, 242) with electrically conductive layers (146, 246). In case a semiconductor material is employed as the fill material of the trench fill material portions 175, the low coefficient of thermal expansion of the fill material can reduce deformation of the insulating layers (132, 232) during deposition of the electrically conductive layers (146, 246). The capping dielectric structures 176 prevent removal of the trench fill material portions 175 during various processing steps such as the processing steps employed to remove the fill material from the backside trenches 79 and from the through-memory-level via cavities (879, 579).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A semiconductor structure, comprising:
semiconductor devices located on a top surface of a substrate semiconductor layer;
lower-level metal interconnect structures embedded in lower-level dielectric material layers and electrically connected to the semiconductor devices and overlying the substrate semiconductor layer;
source-level material layers overlying the lower-level dielectric material layers and comprising an opening therethrough;
an alternating stack of insulating layers and electrically conductive layers overlying the source-level material layers;
memory stack structures vertically extending through the alternating stack and comprising a respective vertical semiconductor channel and a respective memory film;
a vertically alternating sequence of insulating plates and dielectric material plates laterally surrounded by the alternating stack;
an isolation trench fill structure interposed between the alternating stack and the vertically alternating sequence and comprising a trench fill material portion and a capping dielectric structure overlying the trench fill material portion; and
a first through-memory-level interconnection via structure vertically extending through each plate within the vertically alternating sequence and contacting a top surface of one of the lower-level metal interconnect structures;
wherein the isolation trench fill structure comprises a first straight sidewall contacting the alternating stack and a second straight sidewall contacting the vertically alternating sequence, wherein each of the first straight sidewall and the second straight sidewall vertically extends from a horizontal plane overlying a topmost surface of the alternating stack into an upper region of the source-level material layers.
2. The semiconductor structure of claim 1, wherein:
the isolation trench fill structure comprises a dielectric trench liner laterally surrounding the trench fill material portion and the capping dielectric structure;
the first straight sidewall and the second straight sidewall comprise surfaces of the dielectric trench liner;
the source-level material layers are spaced from the trench fill material portion by the dielectric trench liner; and
the source-level material layers comprise a source contact layer comprising a doped semiconductor material that contacts a sidewall of each of the vertical semiconductor channels.
3. A semiconductor structure, comprising:
semiconductor devices located on a top surface of a substrate semiconductor layer;
lower-level metal interconnect structures embedded in lower-level dielectric material layers and electrically connected to the semiconductor devices and overlying the substrate semiconductor layer;
source-level material layers overlying the lower-level dielectric material layers and comprising an opening therethrough;
an alternating stack of insulating layers and electrically conductive layers overlying the source-level material layers;
memory stack structures vertically extending through the alternating stack and comprising a respective vertical semiconductor channel and a respective memory film;

a vertically alternating sequence of insulating plates and
dielectric material plates laterally surrounded by the
alternating stack;
an isolation trench fill structure interposed between the
alternating stack and the vertically alternating sequence
and comprising a trench fill material portion and a
capping dielectric structure overlying the trench fill
material portion; and
a first through-memory-level interconnection via structure
vertically extending through each plate within the vertically alternating sequence and contacting a top surface of one of the lower-level metal interconnect structures;
wherein the trench fill material portion comprises a semiconductor material.

4. The semiconductor structure of claim 3, wherein the semiconductor material comprises amorphous silicon.

5. A semiconductor structure, comprising:
semiconductor devices located on a top surface of a substrate semiconductor layer;
lower-level metal interconnect structures embedded in lower-level dielectric material layers and electrically connected to the semiconductor devices and overlying the substrate semiconductor layer;
source-level material layers overlying the lower-level dielectric material layers and comprising an opening therethrough;
an alternating stack of insulating layers and electrically conductive layers overlying the source-level material layers;
memory stack structures vertically extending through the alternating stack and comprising a respective vertical semiconductor channel and a respective memory film;
a vertically alternating sequence of insulating plates and dielectric material plates laterally surrounded by the alternating stack;
an isolation trench fill structure interposed between the alternating stack and the vertically alternating sequence and comprising a trench fill material portion and a capping dielectric structure overlying the trench fill material portion; and
a first through-memory-level interconnection via structure vertically extending through each plate within the vertically alternating sequence and contacting a top surface of one of the lower-level metal interconnect structures;
a backside trench vertically extending through the alternating stack;
a backside contact via structure located within the backside trench, contacting one of the source-level material layers, and comprising a same material as the first through-memory-level interconnection via structure; and
a backside insulating spacer laterally surrounding the backside contact via structure and contacting each layer within the alternating stack.

6. The semiconductor structure of claim 5, further comprising a first insulating spacer that contacts and laterally surrounds the first through-memory-level interconnection via structure and laterally surrounded by the vertically alternating sequence.

7. The semiconductor structure of claim 6, wherein top surfaces of the first insulating spacer, the first through-memory-level interconnection via structure, and the capping dielectric structure are located within a same horizontal plane that is located above a topmost surface of the alternating stack.

8. The semiconductor structure of claim 6, wherein the backside insulating spacer and the first insulating spacer have a same lateral width and a same dielectric material composition.

9. The semiconductor structure of claim 5, further comprising a row of dielectric bridge structures that are embedded within an upper portion of the backside trench, wherein a top portion of the backside contact via structure is castellated and comprises protruding portions located between neighboring pairs of dielectric bridge structures in the row of dielectric bridge structures.

10. The semiconductor structure of claim 9, wherein each dielectric bridge structure in the row of dielectric bridge structures comprises:
a bottom surface contacting a horizontally-extending portion of the backside insulating spacer; and
a pair of widthwise sidewalls that are perpendicular to a lengthwise direction of the backside trench and contacting vertically-extending portions of the backside insulating spacer.

11. The semiconductor structure of claim 9, wherein:
the isolation trench fill structure comprises a dielectric trench liner laterally surrounding the trench fill material portion and the capping dielectric structure; and
each dielectric bridge structure within the row of dielectric bridge structures comprises a pair of lengthwise sidewalls that contact a respective dielectric bridge liner having a same lateral thickness and a same material composition as the dielectric trench liner.

12. A semiconductor structure, comprising:
semiconductor devices located on a top surface of a substrate semiconductor layer;
lower-level metal interconnect structures embedded in lower-level dielectric material layers and electrically connected to the semiconductor devices and overlying the substrate semiconductor layer;
source-level material layers overlying the lower-level dielectric material layers and comprising an opening therethrough;
an alternating stack of insulating layers and electrically conductive layers overlying the source-level material layers;
memory stack structures vertically extending through the alternating stack and comprising a respective vertical semiconductor channel and a respective memory film;
a vertically alternating sequence of insulating plates and dielectric material plates laterally surrounded by the alternating stack;
an isolation trench fill structure interposed between the alternating stack and the vertically alternating sequence and comprising a trench fill material portion and a capping dielectric structure overlying the trench fill material portion; and
a first through-memory-level interconnection via structure vertically extending through each plate within the vertically alternating sequence and contacting a top surface of one of the lower-level metal interconnect structures;
wherein the capping dielectric structure comprises:
a planar top surface within a first horizontal plane overlying a topmost surface of the alternating stack; and
a bottom surface located below a second horizontal plane including the topmost surface of the alternating stack and contacting a top surface of the trench fill material portion.

* * * * *